US012279388B2

(12) United States Patent
Kim et al.

(10) Patent No.: US 12,279,388 B2
(45) Date of Patent: Apr. 15, 2025

(54) ELECTRONIC DEVICE INCLUDING FLEXIBLE DISPLAY

(71) Applicant: SAMSUNG ELECTRONICS CO., LTD., Suwon-si (KR)

(72) Inventors: Jiho Kim, Suwon-si (KR); Kyihyun Jang, Suwon-si (KR); Seongyong An, Suwon-si (KR); Sehyun Park, Suwon-si (KR); Kyungmoon Seol, Suwon-si (KR); Jaebong Chun, Suwon-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 292 days.

(21) Appl. No.: 17/568,862

(22) Filed: Jan. 5, 2022

(65) Prior Publication Data

US 2022/0183173 A1 Jun. 9, 2022

Related U.S. Application Data

(63) Continuation of application No. PCT/KR2021/018264, filed on Dec. 3, 2021.

(30) Foreign Application Priority Data

Dec. 4, 2020 (KR) .................. 10-2020-0168850
Feb. 18, 2021 (KR) .................. 10-2021-0021629

(51) Int. Cl.
*H05K 5/02* (2006.01)
*H05K 5/00* (2006.01)
*H05K 9/00* (2006.01)

(52) U.S. Cl.
CPC ......... *H05K 5/0247* (2013.01); *H05K 5/0017* (2013.01); *H05K 5/0217* (2013.01); *H05K 9/0084* (2013.01)

(58) Field of Classification Search
CPC ........ G06F 1/1652; G06F 1/1624; G06F 1/16; H05K 5/0247; H05K 5/0217; H01Q 9/42
See application file for complete search history.

(56) References Cited

U.S. PATENT DOCUMENTS

| 6,411,353 | B1 | 6/2002 | Yarita et al. |
| 10,312,571 | B2 * | 6/2019 | Edwards ................ H01Q 1/521 |

(Continued)

FOREIGN PATENT DOCUMENTS

| EP | 3258675 A1 | 12/2017 |
| EP | 3813343 A1 | 4/2021 |

(Continued)

OTHER PUBLICATIONS

Search Report and Written Opinion issued Mar. 22, 2022 in counterpart International Patent Application No. PCT/KR2021/018264.

(Continued)

*Primary Examiner* — James Wu
*Assistant Examiner* — Dakota M Talbert
(74) *Attorney, Agent, or Firm* — Nixon & Vanderhye, P.C.

(57) ABSTRACT

According to an embodiment of the disclosure, an electronic device may include: a housing including a first housing and a second housing configured to be slidable with respect to the first housing, and a flexible display including a first area visible to the outside of the electronic device and a second area configured to extend from the first area such that, based on sliding of the second housing, the second area is moved out of the housing or is moved into an inner space of the housing, wherein the housing comprises a conductive part facing a front surface of the flexible display, and the conductive part is electrically connected to a conductive layer forming a rear surface of the flexible display or is positioned on the rear surface.

18 Claims, 46 Drawing Sheets

(56) References Cited

U.S. PATENT DOCUMENTS

| | | | |
|---|---|---|---|
| 10,362,689 | B2 | 7/2019 | Cho et al. |
| 10,887,438 | B2 * | 1/2021 | Baek et al. |
| 10,955,876 | B1 * | 3/2021 | Song .................... G06F 1/1652 |
| 10,972,592 | B2 * | 4/2021 | Song .................... H04M 1/0237 |
| 10,990,208 | B2 | 4/2021 | Jung et al. |
| 11,184,980 | B2 | 11/2021 | An et al. |
| 11,470,729 | B2 | 10/2022 | Kim et al. |
| 2005/0219123 | A1 * | 10/2005 | Hansen ................. H01Q 13/08 |
| | | | 343/700 MS |
| 2017/0364119 | A1 * | 12/2017 | Lee ....................... G06F 1/1652 |
| 2019/0081386 | A1 | 3/2019 | Edwards |
| 2020/0136243 | A1 | 4/2020 | Shin |
| 2020/0264660 | A1 | 8/2020 | Song |
| 2020/0266524 | A1 | 8/2020 | Yoon |
| 2021/0135492 | A1 | 5/2021 | Kim et al. |
| 2021/0219437 | A1 | 7/2021 | Kim |

FOREIGN PATENT DOCUMENTS

| | | |
|---|---|---|
| KR | 10-0304745 | 10/2001 |
| KR | 10-2019-0115888 | 6/2019 |
| KR | 10-2019-0101605 | 9/2019 |
| KR | 10-2019-0128843 | 11/2019 |
| KR | 10-2019-0143029 | 12/2019 |
| KR | 10-2122705 | 6/2020 |
| KR | 10-2020-0101116 | 8/2020 |
| WO | 2019245165 A1 | 12/2019 |

OTHER PUBLICATIONS

Extended Search Report dated Mar. 12, 2024 in EP Application No. 21901083.2.

* cited by examiner

ELECTRONIC DEVICE INCLUDING FLEXIBLE DISPLAY

CROSS-REFERENCE TO RELATED APPLICATIONS

This application is a continuation of International Application No. PCT/KR2021/018264 designating the United States, filed on Dec. 3, 2021, in the Korean Intellectual Property Receiving Office and claiming priority to Korean Patent Application No. 10-2020-0168850, filed on Dec. 4, 2020, in the Korean Intellectual Property Office and Korean Patent Application No. 10-2021-0021629, filed on Feb. 18, 2021, in the Korean Intellectual Property Office, the disclosures of all of which are incorporated by reference herein in their entireties.

BACKGROUND

Field

The disclosure relates to an electronic device including a flexible display.

Description of Related Art

In line with development of digital technologies, electronic devices have been provided in various types, such as a smart phone, a tablet personal computer, or a personal digital assistant (PDA). Electronic devices tend to be designed to provide larger screens while having portable sizes that do not inconvenience users' hands. In addition, the number of antennas included in electronic devices are continuously increasing in line with diversification of available applications.

An electronic device may be implemented to have a screen that can be expanded in a sliding type, for example. An electronic device may include a flexible display, and a part of the flexible display may be drawn out of the inner space of the electronic device, thereby expanding the screen. However, the structure for sliding operations may degrade antenna radiation performance.

SUMMARY

Embodiments of the disclosure may provide an electronic device including a flexible display capable of securing antenna radiation performance.

According to an example embodiment of the disclosure, an electronic device may include: a housing including a first housing and a second housing configured to be slidable with respect to the first housing, and a flexible display including a first area visible to the outside of the electronic device and a second area configured to extend from the first area such that, based on sliding of the second housing, the second area is moved out of the housing or is moved into an inner space of the housing, wherein the housing includes a conductive part facing a front surface of the flexible display, and the conductive part is electrically connected to a conductive layer forming a rear surface of the flexible display or positioned on the rear surface.

According to various example embodiments of the disclosure, an electronic device including a flexible display may reduce antenna radiation performance degradation, thereby improving reliability of an electronic device having an expandable screen.

Other advantageous effects obtainable or predictable from various example embodiments of the disclosure may be disclosed explicitly or implicitly in the detailed description.

BRIEF DESCRIPTION OF THE DRAWINGS

The above and other aspects, features and advantages of certain embodiments of the present disclosure will be more apparent from the following detailed description, taken in conjunction with the accompanying drawings, in which.

DETAILED DESCRIPTION

Hereinafter, various example embodiments of the disclosure will be described in greater detail with reference to the accompanying drawings.

Figure 1:
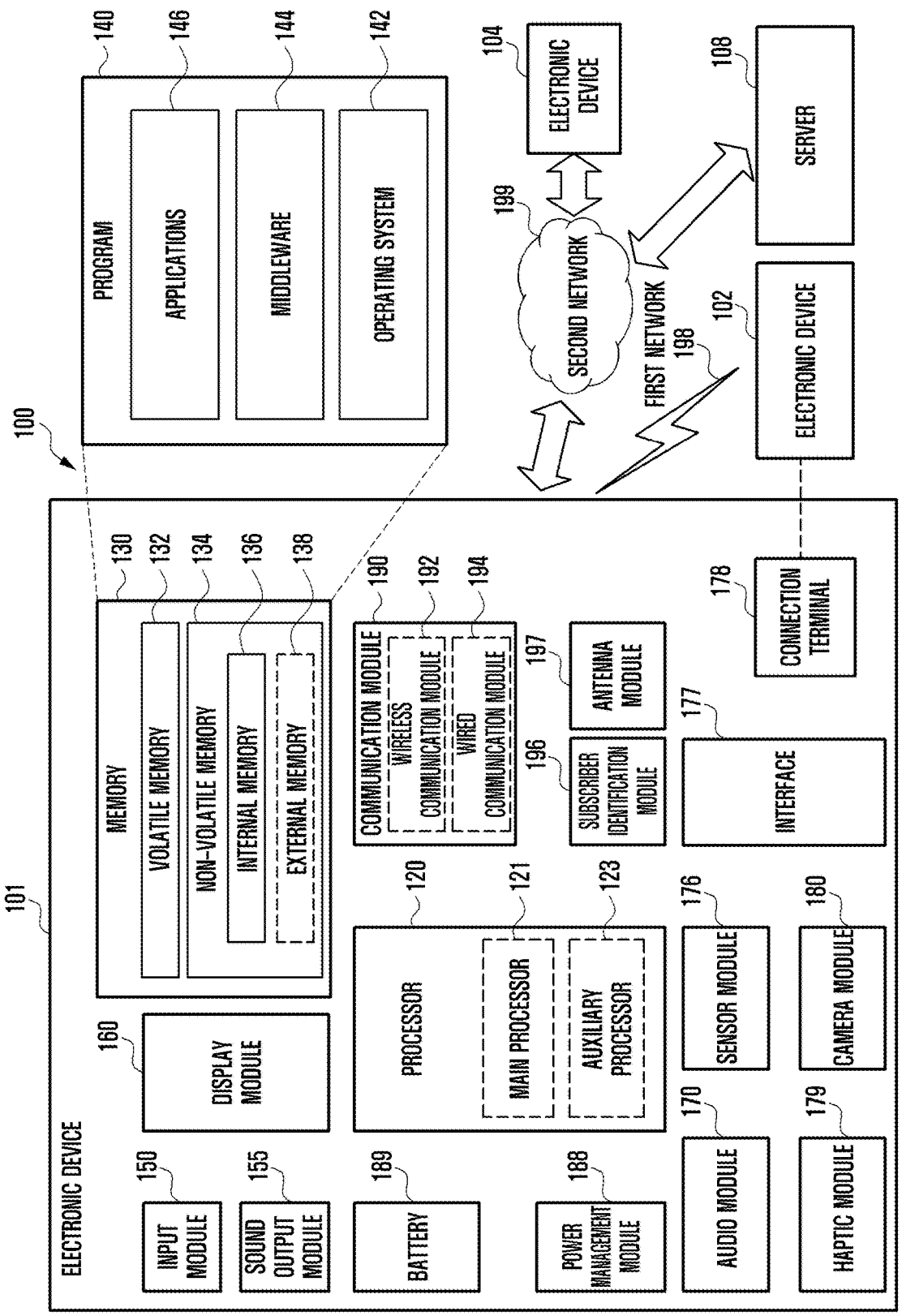
FIG. 1 is a block diagram illustrating an electronic device in a network environment according to an embodiment.

FIG. 1 is a block diagram of an electronic device 101 in a network environment 100 according to an embodiment of the disclosure.

Referring to FIG. 1, an electronic device 101 in a network environment 100 may communicate with an electronic device 102 via a first network 198 (e.g., a short-range wireless communication network), or at least one of an electronic device 104 or a server 108 via a second network 199 (e.g., a long-range wireless communication network). The electronic device 101 may communicate with the electronic device 104 via the server 108. The electronic device 101 includes a processor 120, memory 130, an input module 150, a sound output module 155, a display module 160, an audio module 170, a sensor module 176, an interface 177, a connection terminal 178, a haptic module 179, a camera module 180, a power management module 188, a battery 189, a communication module 190, a subscriber identity module (SIM) 196, and/or an antenna module 197. In various embodiments of the disclosure, at least one (e.g., the connection terminal 178) of the components may be omitted from the electronic device 101, or one or more other components may be added in the electronic device 101. In various embodiments of the disclosure, some of the components may be implemented as single integrated circuitry. For example, the sensor module 176 (e.g., the sensor module 176, the camera module 180, or the antenna module 197) may be implemented as embedded in single component (e.g., the display module 160).

The processor 120 may execute, for example, software (e.g., a program 140) to control at least one other component (e.g., a hardware or software component) of the electronic device 101 coupled with the processor 120, and may perform various data processing or computation. As at least part of the data processing or computation, the processor 120 may load a command or data received from another component (e.g., the sensor module 176 or the communication module 190) in volatile memory 132, process the command or the data stored in the volatile memory 132, and store resulting data in non-volatile memory 134. The processor 120 may include a main processor 121 (e.g., a central processing unit (CPU) or an application processor (AP)), and an auxiliary processor 123 (e.g., a graphics processing unit (GPU), a neural processing unit (NPU), an image signal processor (ISP), a sensor hub processor, or a communication processor (CP)) that is operable independently from, or in conjunction with, the main processor 121. Additionally or alternatively, the auxiliary processor 123 may be adapted to consume less power than the main processor 121, or to be specific to a specified function. The auxiliary processor 123 may be implemented as separate from, or as part of the main processor 121.

The auxiliary processor 123 may control at least some of functions or states related to at least one component (e.g., the display module 160, the sensor module 176, or the communication module 190) among the components of the electronic device 101, instead of the main processor 121 while the main processor 121 is in an inactive (e.g., sleep) state, or together with the main processor 121 while the main processor 121 is in an active state (e.g., executing an application). The auxiliary processor 123 (e.g., an ISP or a CP) may be implemented as part of another component (e.g., the camera module 180 or the communication module 190) functionally related to the auxiliary processor 123. According to an embodiment of the disclosure, an auxiliary processor 123 (e.g., a neural network processing device) may include a hardware structure specialized for processing an artificial intelligence model. The artificial intelligence model may be created through machine learning. Such learning may be performed, for example, in the electronic device 101 itself on which artificial intelligence model is executed, or may be performed through a separate server (e.g., the server 108). The learning algorithm may include, for example, supervised learning, unsupervised learning, semi-supervised learning, or reinforcement learning, but is not limited thereto. The artificial intelligence model may include a plurality of artificial neural network layers. An artificial neural network may be any of a deep neural network (DNN), a convolutional neural network (CNN), a recurrent neural network (RNN), a restricted Boltzmann machine (RBM), a deep belief network (DBN), a bidirectional recurrent DNN (BRDNN), a deep Q-networks, or a combination of two or more of the above-mentioned networks, but is not limited to the above-mentioned examples. In addition to the hardware structure, the artificial intelligence model may additionally or alternatively include a software structure.

The memory 130 may store various data used by at least one component (e.g., the processor 120 or the sensor module 176) of the electronic device 101. The various data may include, for example, software (e.g., the program 140) and input data or output data for a command related thereto. The memory 130 may include the volatile memory 132 and/or the non-volatile memory 134.

The program 140 may be stored in the memory 130 as software, and may include, for example, an operating system (OS) 142, middleware 144, and/or an application 146.

The input module 150 may receive a command or data to be used by another component (e.g., the processor 120) of the electronic device 101, from the outside (e.g., a user) of the electronic device 101. The input module 150 may include, for example, a microphone, a mouse, a keyboard, a key (e.g., a button), or a digital pen (e.g., a stylus pen).

The sound output module 155 may output sound signals to the outside of the electronic device 101. The sound output module 155 may include, for example, a speaker or a receiver. The speaker may be used for general purposes, such as playing multimedia or playing record, and the receiver may be used for incoming calls. The receiver may be implemented as separate from, or as part of the speaker.

The display module 160 may visually provide information to the outside (e.g., a user) of the electronic device 101. The display module 160 may include, for example, a display, a hologram device, or a projector and control circuitry to control a corresponding one of the display, hologram device, and projector. The display module 160 may include touch circuitry (e.g., a touch sensor) adapted to detect a touch, or sensor circuitry (e.g., a pressure sensor) adapted to measure the intensity of force incurred by the touch.

The audio module 170 may convert a sound into an electrical signal and vice versa. The audio module 170 may obtain the sound via the input module 150, or output the sound via the sound output module 155 or a headphone of an external electronic device (e.g., an electronic device 102) directly (e.g., wiredly) or wirelessly coupled with the electronic device 101.

The sensor module 176 may detect an operational state (e.g., power or temperature) of the electronic device 101 or an environmental state (e.g., a state of a user) external to the electronic device 101, and then generate an electrical signal or data value corresponding to the detected state. The sensor module 176 may include, for example, a gesture sensor, a gyro sensor, an atmospheric pressure sensor, a magnetic sensor, an acceleration sensor, a grip sensor, a proximity sensor, a color sensor, an infrared (IR) sensor, a biometric sensor, a temperature sensor, a humidity sensor, or an illuminance sensor.

The interface 177 may support one or more specified protocols to be used for the electronic device 101 to be coupled with the external electronic device (e.g., the electronic device 102) directly (e.g., wiredly) or wirelessly. The interface 177 may include, for example, a high-definition multimedia interface (HDMI), a universal serial bus (USB) interface, a secure digital (SD) card interface, and/or an audio interface.

The connection terminal 178 may include a connector via which the electronic device 101 may be physically connected with the external electronic device (e.g., the electronic device 102). The connection terminal 178 may include, for example, an HDMI connector, a USB connector, an SD card connector, and/or an audio connector (e.g., a headphone connector).

The haptic module 179 may convert an electrical signal into a mechanical stimulus (e.g., a vibration or a movement) or electrical stimulus which may be recognized by a user via his tactile sensation or kinesthetic sensation. The haptic module 179 may include, for example, a motor, a piezoelectric element, or an electric stimulator.

The camera module 180 may capture an image or moving images. The camera module 180 may include one or more lenses, image sensors, ISPs, or flashes.

The power management module 188 may manage power supplied to or consumed by the electronic device 101. The power management module 188 may be implemented as at least part of, for example, a power management integrated circuit (PMIC).

The battery 189 may supply power to at least one component of the electronic device 101. The battery 189 may include, for example, a primary cell which is not rechargeable, a secondary cell which is rechargeable, and/or a fuel cell.

The communication module 190 may support establishing a direct (e.g., wired) communication channel or a wireless communication channel between the electronic device 101 and the external electronic device (e.g., the electronic device 102, the electronic device 104, or the server 108) and performing communication via the established communication channel. The communication module 190 may include one or more CPs that are operable independently from the processor 120 (e.g., the AP) and supports a direct (e.g., wired) communication or a wireless communication. The communication module 190 may include a wireless communication module 192 (e.g., a cellular communication module, a short-range wireless communication module, or a global navigation satellite system (GNSS) communication module) or a wired communication module 194 (e.g., a local area network (LAN) communication module or a power line communication (PLC) module). A corresponding one of these communication modules may communicate with the external electronic device via the first network 198 (e.g., a short-range communication network, such as BLUETOOTH, wireless-fidelity (Wi-Fi) direct, or a standard of the IR Data Association (IrDA)) or the second network 199 (e.g., a long-range communication network, such as a legacy cellular network, 5 G ($5^{th}$ generation) network, a next generation network, the Internet, or a computer network (e.g., LAN or wide area network (WAN)). These various types of communication modules may be implemented as a single component (e.g., a single chip), or may be implemented as multi components (e.g., multi chips) separate from each other. The wireless communication module 192 may identify and authenticate the electronic device 101 in a communication network, such as the first network 198 or the second network 199, using subscriber information (e.g., international mobile subscriber identity (IMSI)) stored in the SIM 196.

The wireless communication module 192 may support a 5G network after a 4G ($4^{th}$ generation) network and a next-generation communication technology, such as a new radio access technology. An NR access technology may support high-speed transmission of high-capacity data (i.e., an enhanced mobile broadband (eMBB)), minimization of terminal power and connection of multiple terminals (massive machine type communications (mMTC)), or high reliability and low latency (ultra-reliable and low-latency communications (URLLC)). The wireless communication module 192 may support a high-frequency band (e.g., a mmWave band) in order to achieve, for example, a high data transmission rate. The wireless communication module 192 may support various technologies for securing performance in a high-frequency band, such as beamforming, massive multiple-input and multiple-output (MIMO), and full-dimensional multiple-input and multiple-output (FD-MIMO), an array antenna, analog beam-forming, or a large-scale antenna. The wireless communication module 192 may support various requirements specified in the electronic device 101, an external electronic device (e.g., the electronic device 104), or a network system (e.g., the second network 199). According to an embodiment of the disclosure, the wireless communication module 192 may support a peak data rate for realizing eMBB (e.g., 20 Gbps or more), loss coverage for realizing mMTC (e.g., 164 dB or less), or U-plane latency for realizing URLLC (e.g., 0.5 ms or less for each of downlink (DL) and uplink (UL) or 1 ms or less for round trip).

The antenna module 197 may transmit or receive a signal or power to or from the outside (e.g., the external electronic device) of the electronic device 101. The antenna module 197 may include an antenna including a radiating element including a conductive material or a conductive pattern formed in or on a substrate (e.g., a printed circuit board (PCB)). The antenna module 197 may include a plurality of antennas (e.g., an antenna array). In such a case, at least one antenna appropriate for a communication scheme used in the communication network, such as the first network 198 or the second network 199, may be selected, for example, by the communication module 190 (e.g., the wireless communication module 192) from the plurality of antennas. The signal or the power may then be transmitted or received between the communication module 190 and the external electronic device via the selected at least one antenna. Another component (e.g., a radio frequency integrated circuit (RFIC)) other than the radiating element may be additionally formed as part of the antenna module 197.

According to various embodiments of the disclosure, the antenna module 197 may form a mmWave antenna module. According to an embodiment of the disclosure, the mmWave antenna module may include a PCB, an RFIC that is disposed on or adjacent to a first surface (e.g., the bottom surface) of the PCB and is capable of supporting a predetermined high-frequency band (e.g., a mmWave band), and a plurality of antennas (e.g., array antennas) that is disposed on or adjacent to a second surface (e.g., the top surface or the side surface) of the PCB and is capable of transmitting or receiving a signal of the predetermined high-frequency band.

At least some of the above-described components may be coupled mutually and communicate signals (e.g., commands or data) therebetween via an inter-peripheral communication scheme (e.g., a bus, general purpose input and output (GPIO), serial peripheral interface (SPI), or mobile industry processor interface (MIPI)).

Commands or data may be transmitted or received between the electronic device 101 and the external electronic device 104 via the server 108 coupled with the second network 199. Each of the electronic devices 102 and 104 may be a device of a same type as, or a different type, from the electronic device 101. All or some of operations to be executed at the electronic device 101 may be executed at one or more of the external electronic devices 102, 104, or 108. For example, if the electronic device 101 should perform a function or a service automatically, or in response to a request from a user or another device, the electronic device 101, instead of, or in addition to, executing the function or the service, may request the one or more external electronic devices to perform at least part of the function or the service. The one or more external electronic devices receiving the request may perform the at least part of the function or the service requested, or an additional function or an additional service related to the request, and transfer an outcome of the performing to the electronic device 101. The electronic device 101 may provide the outcome, with or without further processing of the outcome, as at least part of a reply to the request. To that end, a cloud computing, distributed computing, a mobile edge computing (MEC), or client-server computing technology may be used, for example. The electronic device 101 may provide an ultra-low delay service using, for example, distributed computing or MEC. In an embodiment of the disclosure, the external electronic device 104 may include an Internet of things (IoT) device. The server 108 may be an intelligent server using machine learning and/or neural networks. According to an embodiment of the disclosure, the external electronic device 104 or the server 108 may be included in the second network 199. The electronic device 101 may be applied to an intelligent service (e.g., smart home, smart city, smart car, or healthcare) based on a 5G communication technology and an IoT-related technology.

An electronic device according to an embodiment of the disclosure may be one of various types of electronic devices. The electronic device may include a portable communication device (e.g., a smart phone), a computer device, a portable multimedia device, a portable medical device, a camera, a wearable device, a home appliance, or the like. However, the electronic device is not limited to any of those described above.

Various embodiments of the disclosure and the terms used herein are not intended to limit the technological features set forth herein to particular embodiments and include various changes, equivalents, or replacements for a corresponding embodiment. With regard to the description of the drawings, similar reference numerals may be used to refer to similar or related elements. As used herein, each of such phrases as "A or B," "at least one of A and B," "at least one of A or B," "A, B, or C," "at least one of A, B, and C," and "at least one of A, B, or C" may include any one of, or all possible combinations of the items enumerated together in a corresponding one of the phrases. As used herein, such terms as "1st" and "2nd," or "first" and "second" may be used to simply distinguish a corresponding component from another, and does not limit the components in other aspect (e.g., importance or order). If an element (e.g., a first element) is referred to, with or without the term "operatively" or "communicatively," as "coupled with," "coupled to," "connected with," or "connected to" another element (e.g., a second element), the element may be coupled with the other element directly (e.g., wiredly), wirelessly, or via a third element.

The term "module" may include a unit implemented in hardware, software, or firmware, or any combination thereof, and may interchangeably be used with other terms, for example, "logic," "logic block," "part," or "circuitry." A module may be a single integral component, or a minimum unit or part thereof, adapted to perform one or more functions. For example, according to an embodiment of the disclosure, the module may be implemented in a form of an application-specific integrated circuit (ASIC).

Various embodiments as set forth herein may be implemented as software (e.g., the program 140) including one or more instructions that are stored in a storage medium (e.g., an internal memory 136 or external memory 138) that is readable by a machine (e.g., the electronic device 101). For example, a processor (e.g., the processor 120) of the machine (e.g., the electronic device 101) may invoke at least one of the one or more instructions stored in the storage medium, and execute it, with or without using one or more other components under the control of the processor. This allows the machine to be operated to perform at least one function according to the at least one instruction invoked. The one or more instructions may include a code generated by a complier or a code executable by an interpreter. The machine-readable storage medium may be provided in the form of a non-transitory storage medium. Wherein, the "non-transitory" storage medium is a tangible device, and may not include a signal (e.g., an electromagnetic wave), but this term does not differentiate between where data is semi-permanently stored in the storage medium and where the data is temporarily stored in the storage medium.

A method according to an embodiment of the disclosure may be included and provided in a computer program product. The computer program product may be traded as a product between a seller and a buyer. The computer program product may be distributed in the form of a machine-readable storage medium (e.g., compact disc read only memory (CD-ROM)), or be distributed (e.g., downloaded or uploaded) online via an application store (e.g., PLAYSTORE™), or between two user devices (e.g., smart phones) directly. If distributed online, at least part of the computer program product may be temporarily generated or at least temporarily stored in the machine-readable storage medium, such as memory of the manufacturer's server, a server of the application store, or a relay server.

Each component (e.g., a module or a program) of the above-described components may include a single entity or multiple entities. One or more of the above-described components may be omitted, or one or more other components may be added. Alternatively or additionally, a plurality of components (e.g., modules or programs) may be integrated into a single component. In such a case, the integrated component may perform one or more functions of each of the plurality of components in the same or similar manner as they are performed by a corresponding one of the plurality of components before the integration. Operations performed by the module, the program, or another component may be carried out sequentially, in parallel, repeatedly, or heuristically, or one or more of the operations may be executed in a different order or omitted, or one or more other operations may be added.

Figure 2A:
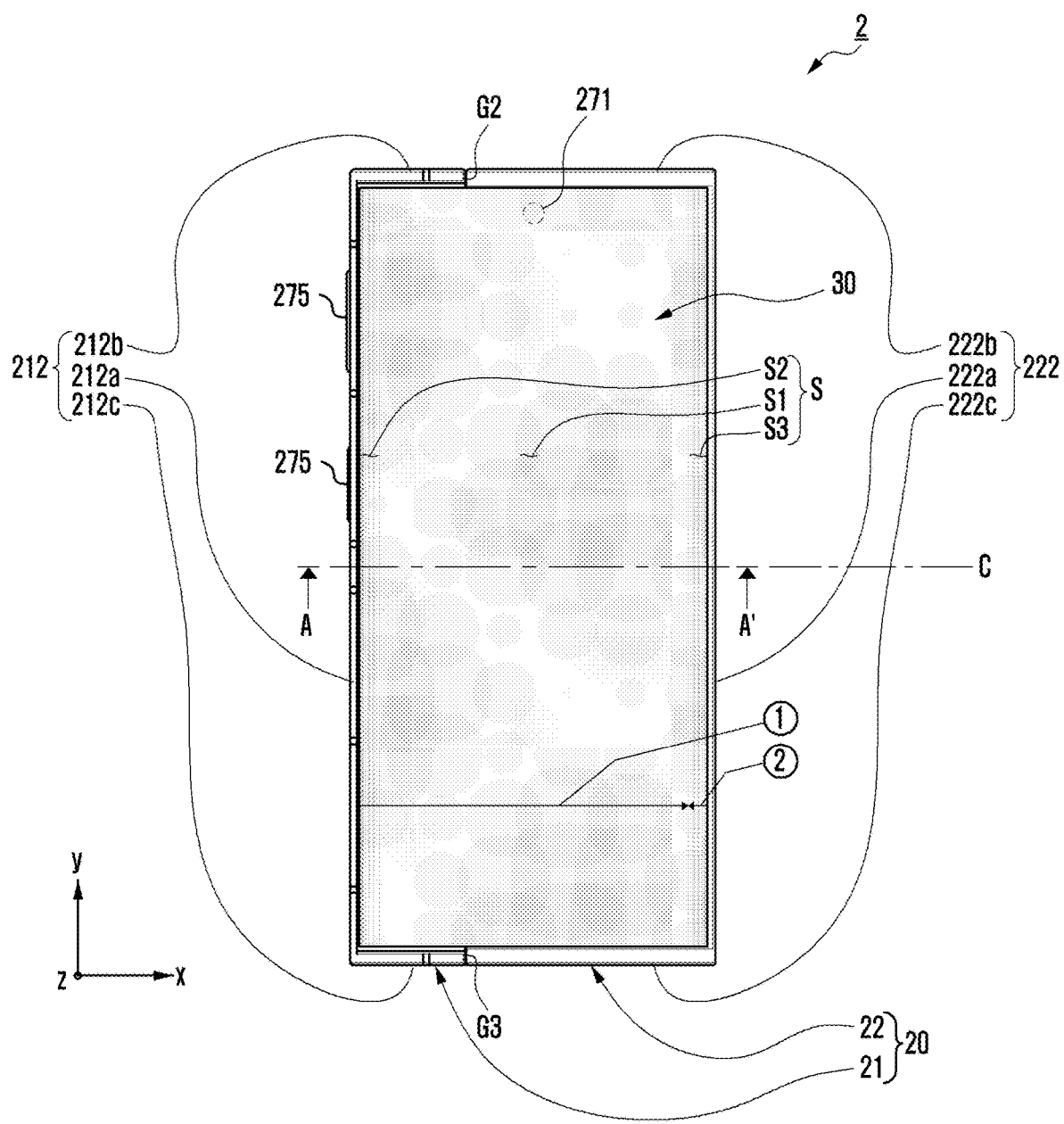
FIG. 2A is a front view of an electronic device in a closed state according to various embodiments.
Figure 2B:
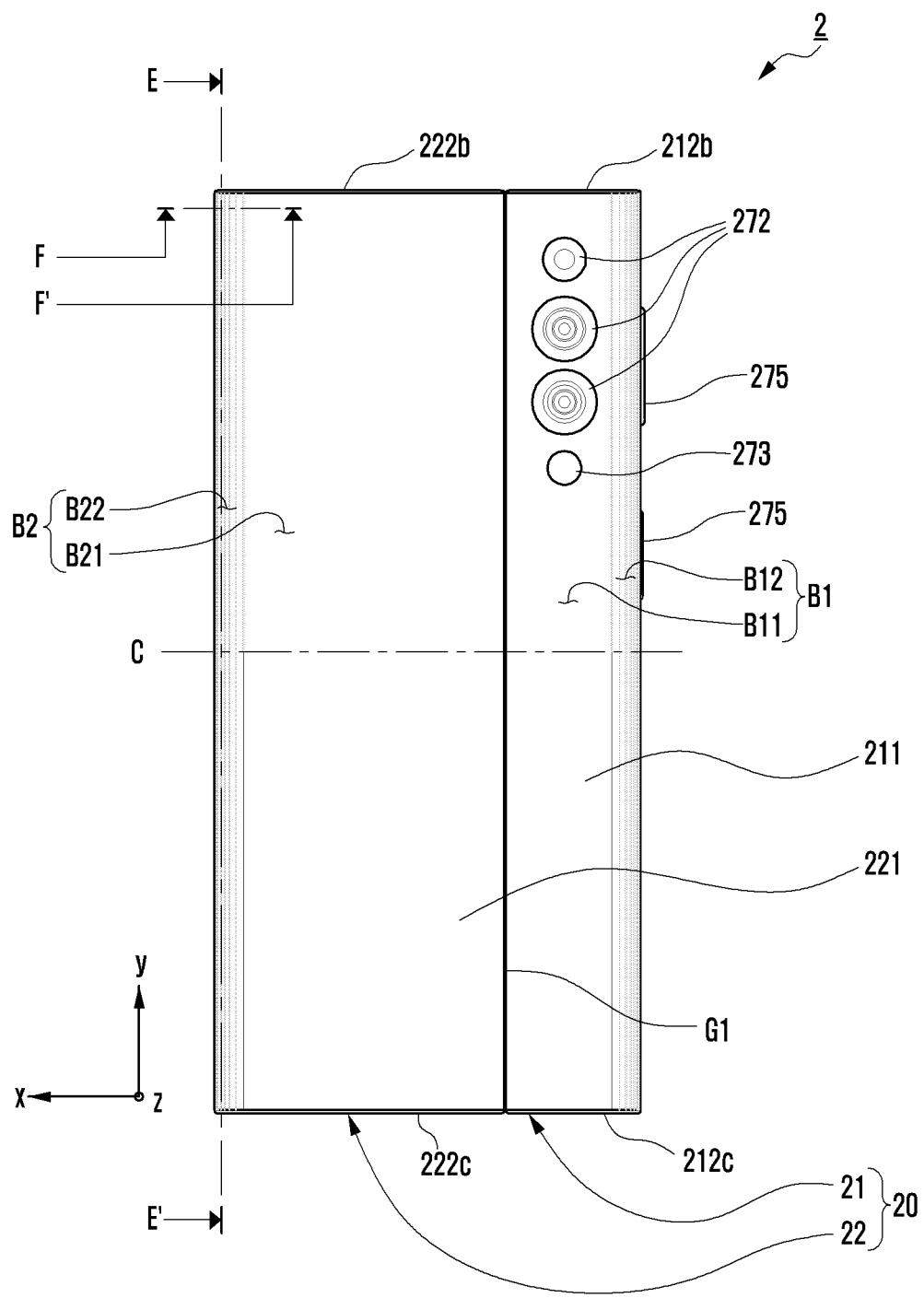
FIG. 2B is a rear view of an electronic device in a closed state according to various embodiments.
Figure 3A:
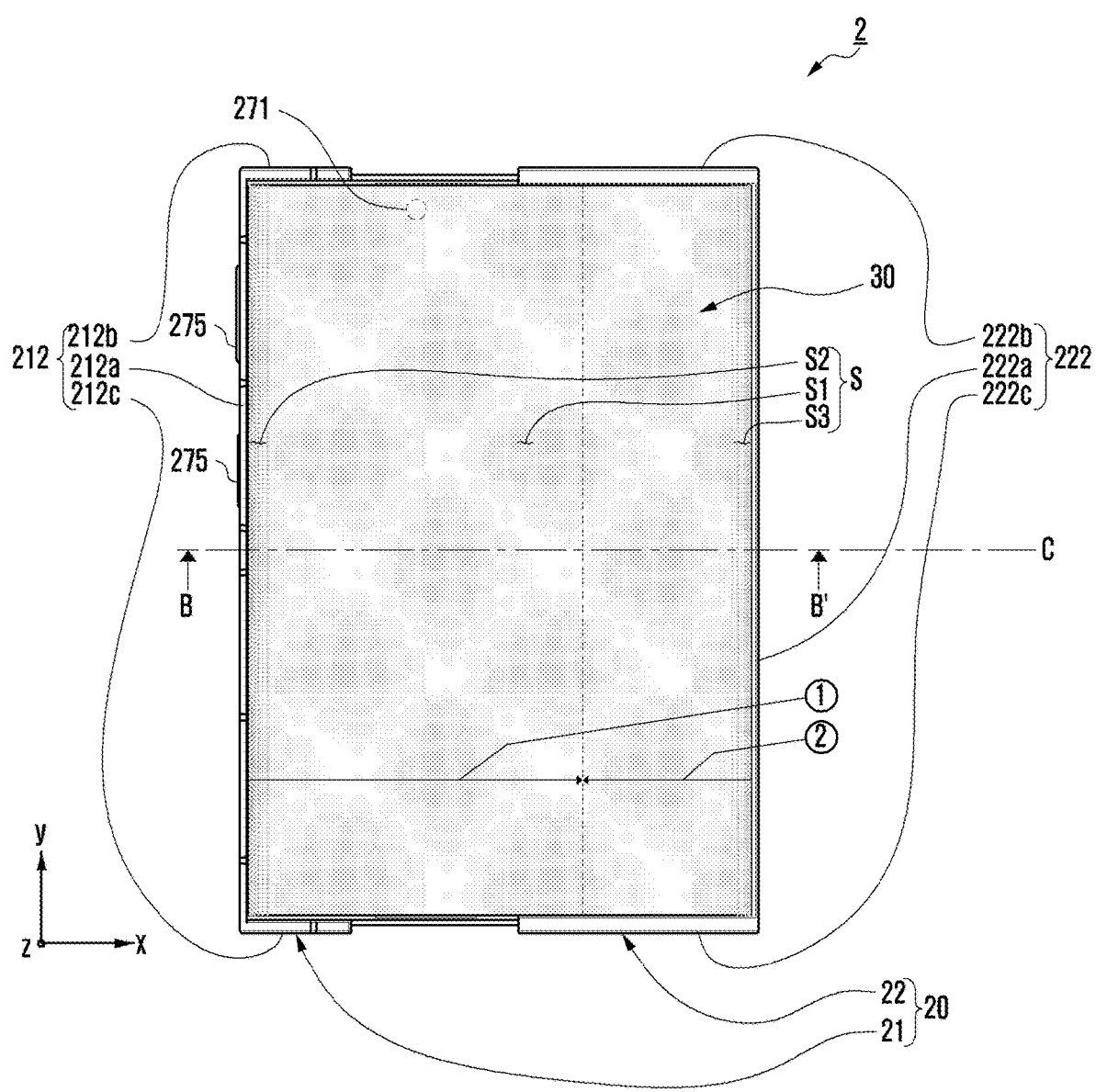
FIG. 3A is a front view of an electronic device in an open state according to various embodiments.
Figure 3B:
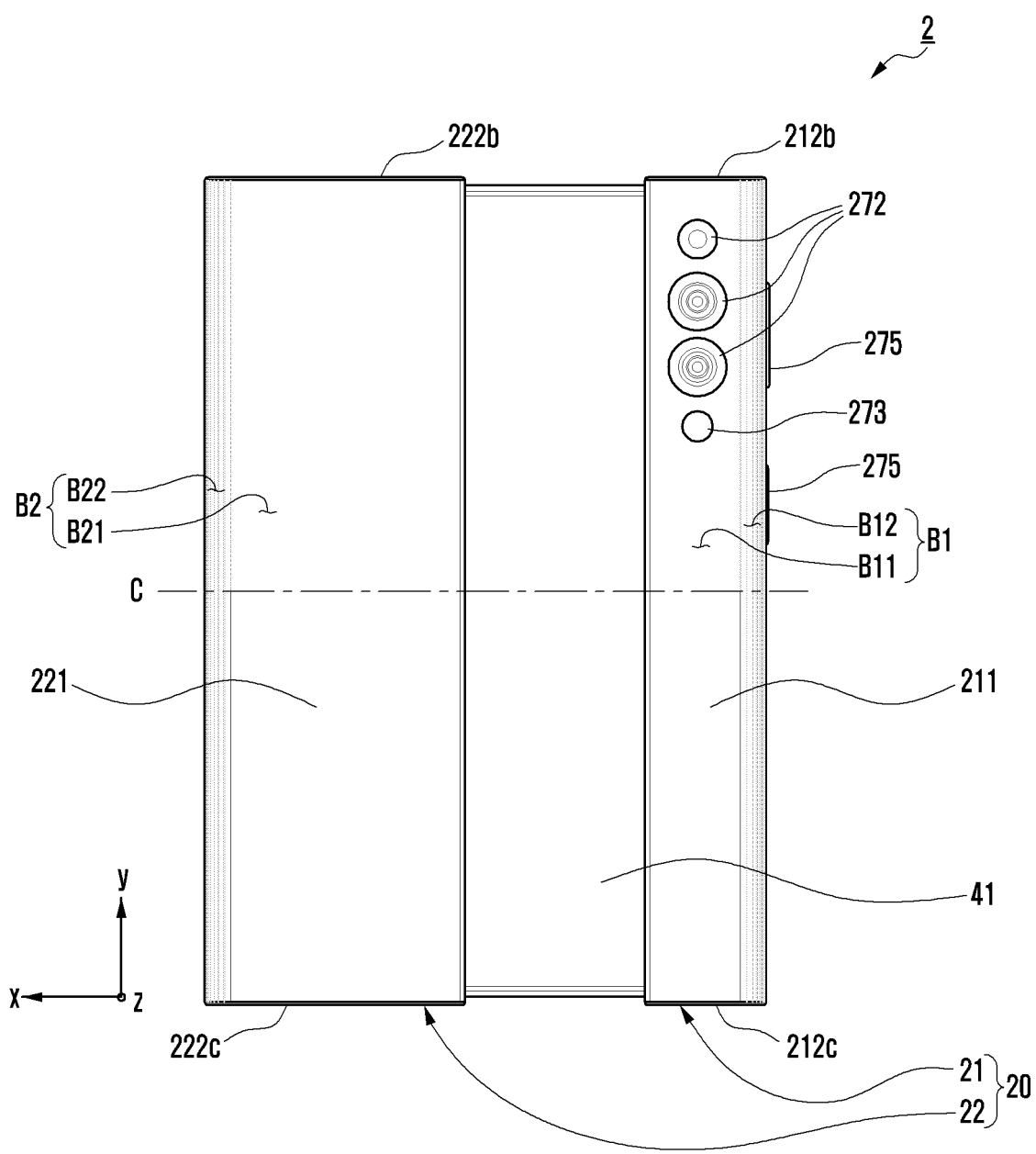
FIG. 3B is a rear view of an electronic device in an open state according to various embodiments.

FIG. 2A is a front view of an electronic device 2 in a closed state according to various embodiments. FIG. 2B is a rear view of an electronic device 2 in a closed state according to various embodiments. FIG. 3A is a front view of an electronic device 2 in an open state according to various embodiments. FIG. 3B is a rear view of an electronic device 2 in an open state according to various embodiments. For convenience of the description, a direction (e.g., the +z axis direction) in which a screen S is visually exposed is interpreted and used to refer to as a front surface of an electronic device 2, and the opposite direction (e.g., the −z axis direction) thereof is interpreted and used to refer to a rear surface of an electronic device 2.

Referring to FIGS. 2A, 2B, 3A, and 3B, the electronic device 2 (e.g., the electronic device 101 of FIG. 1) may include a housing 20 (or, a housing structure) and a flexible display 30. For example, the housing 20 may include a first housing part 21 (or, a first housing structure, first housing, or the like) and a second housing part 22 (or, a second housing structure, second housing, or the like). In an embodiment, the second housing part 22 may be configured to be slidable in a designated direction (e.g., the +x axis direction) with respect to the first housing part 21. A sliding structure for sliding of the second housing part 22 may be included between the first housing part 21 and the second housing part 22. For example, the sliding structure may include a guide rail, and a slide or a roller which is guided by the guide rail and moves. The sliding structure may be implemented in various other ways. The flexible display 30 may be configured to form the screen S (or a display area) which is seen from the outside of the electronic device 2. The flexible display 30 may include a first area ① exposed to the outside of the electronic device 2 and a second area ② configured to extend from the first area ① such that, according to sliding of the second housing part 22, the second area ② is withdrawn out of the housing 20 or is introduced into the inner side of the housing 20. For example, at least a portion of the second area ① may be configured to be withdrawn out of the electronic device 2 or be introduced into the inner side of the electronic 2 according to sliding of the second housing part 22, and thus the size of the screen S can be changed. The second area ② may be a bendable of the flexible display 30 in a state change (e.g., a change between a closed state and an open state) of the electronic device 2, and for example, may be referred to as other terms such as a bendable area or a bendable section. FIG. 2A illustrates the electronic device 2 in a state where the screen S is not expanded, and FIG. 3A illustrates the electronic device 2 in a state where the screen S is expanded. The state where the screen S is not expanded is a state where the second housing part 22 does not move in a first direction (e.g., the +x axis direction) with respect to the first housing part 21, and may be referred to as a closed state of the electronic device 2. The state where the screen S is expanded is a state where the second housing part 22 has moved maximally and thus does not move any more in a first direction, and may be referred to as an open state of the electronic device 2. In some embodiments, the open state may include a completely open state (refer to FIG. 3A) or an intermediated state. The intermediated state may refer, for example, to a state between a closed state (refer to FIG. 2A) and the completely open state. In some embodiments, the state where the second housing part 22 at least partially moves in the first direction with respect to the first housing part 21 may be referred to as a 'slide-out of the second housing part 22. In some embodiments, the state where the second housing part 22 at least partially moves in a second direction (e.g., the −x axis direction) opposite to the first direction with respect to the first housing part 21 may be referred to as a 'slide-in' of the second housing part 22. Hereinafter, the first direction may be referred to as a 'slide-out direction', and the second direction may be referred to as a 'slide-in direction'. In the electronic device 2 having the expandable screen S corresponding to a slide-out of the second housing part 22, the flexible display 30 may be referred to as other terms such as an 'expandable display' or a 'slide-out display'.

According to an embodiment, the screen S may include a first flat surface part S1, a first curved-surface part S2, and/or a second curved-surface part S3. The first flat surface part S1 may be positioned between the first curved-surface part S2 and the second curved-surface part S3. For example, the first curved-surface part S2 and the second curved-surface part S3 may be a shape bent from the first flat surface part S1 toward the rear surface (e.g., a surface positioned at a side opposite to the screen S) of the electronic 2. For example, the first curved-surface part S2 and the second curved-surface part S3 may be substantially symmetrical with reference to the first flat surface part S1 interposed therebetween. The first flat surface part S1 may be expanded or reduced according to a state change (e.g., a change between a closed state and an open state) of the electronic device 2. The second curved-surface part S3 may be provided in a substantially identical shape even in a state change of the electronic device 2. A portion forming the second curved-surface part S3 of the second area ② of the flexible display 30 may be changed according to a state change of the electronic device 2. The first curved-surface part S2 may be positioned at a side opposite to the second curved-surface part S3 in a state of a closed state or an open state of the electronic device 2 to enhance aesthetics of the screen S. According to some embodiments, the electronic device may be implemented in a form in which the first flat surface part S1 is expanded without the first curved-surface part S2 and/or the second curved-surface part S3.

According to an embodiment, the first housing part 21 may include a first back cover 211 and a first side cover 212. The first back cover 211 may be positioned at a side opposite to the screen S. The first back cover 211 may be configured to overlap a partial area of the screen S when seen from above the screen S (e.g., when seen from the −z axis direction). The first side cover 212 may be configured to surround a portion of a space between the first back cover 211 and the screen S and to form at least a portion of a side part of the electronic device 2. For example, the first side cover 212 may include a first cover part 212a, a second cover part 212b, and/or a third cover part 212c. The first cover part 212a may be positioned adjacent to the first curved-surface part S2 of the screen S. The second cover part 212b may be configured to extend in the slide-out direction (e.g., the +x axis direction) from one end of the first cover part 212a. The third cover part 212c may be configured to extend in the slide-out direction from the other one end of the first cover part 212a. According to an embodiment, a first cover part 212a, a second cover part 212b, and a third cover part 212c may be integrally formed with each other, and may include the same or similar material (e.g., a metal (e.g., aluminum, stainless steel (STS), or magnesium), or polymer).

According to an embodiment, the second housing part 22 may include a second back cover 221 and a second side cover 222. The second back cover 221 may be positioned at a side opposite to the screen S. The second back cover 221 may be configured to overlap a partial area of the screen S when seen from above the screen S. The second side cover 222 may be configured to surround a portion of a space between the second back cover 221 and the screen S and to form at least a portion of a side part of the electronic device 2. For example, the second side cover 222 may include a first cover part 222a positioned on a side of the second curved-surface part S3 of the screen S, a second cover part 222b configured to extend in the slide-in direction (e.g., the −x axis direction) from an end of the first cover part 222a, and/or a third cover part 222c configured to extend in the slide-in direction from the other one end of the first cover part 222a. According to an embodiment, the first cover part 222a, the second cover part 222b, and the third cover part 222c of the second side cover 222 may be integrally formed with each other, and may include the same or similar material (e.g., a metal (e.g., aluminum, stainless steel (STS), or magnesium), or polymer). The first cover part 212a of the first side cover 212 and the first cover part 222a of the second side cover 222 may be configured to extend substantially parallel to each other in a third direction (e.g., the y axis direction) which is substantially orthogonal to the slide-out direction (or the slide-in direction). The second cover part 212b of the first side cover 212 and the second cover part 222b of the second side cover 222 may be positioned adjacent to one side edge of the screen S. The third part 212c of the first side cover 212 and the third cover part 222c of the second side cover 222 may be positioned adjacent to the other side edge of the screen S. In an embodiment, the housing 20 may include a first boundary part G1 in which the first back cover 211 and the second back cover 221 face to each other. The housing 20 may include a second boundary part G2 in which the second cover part 212b of the first side cover 212 and the second cover part 222b of the second side cover 222 face to each other. The housing 20 may include a third boundary part G3 in which the third cover part 212c of the first side cover 212 and the third cover part 222c of the second side cover 222 face to each other. The first boundary part G1 may be configured to extend from the second boundary part G2 to the third boundary part G3. When seen from above the screen S (e.g., when seen from the −z axis direction), the second boundary part G2 and the third boundary part G3 may be aligned in the third direction (e.g., the y axis direction). The first boundary part G1, the second boundary part G2, and the third boundary part G3 may correspond to a portion, at which the first housing part 21 and the second housing part 22 of the exterior of the electronic device 2 are substantially in contact with each other when the electronic device 2 is changed from a closed state to an open state. In an embodiment, an insulation member may be disposed in each of the first boundary part G1, the second boundary part G2, and the third boundary part G3. For example, an insulation member may be disposed in at least a portion between the first housing part 21 and the second housing part 22 to electrically separate therebetween.

According to an embodiment, the electronic device 2 may include a first support structure 41 (refer to FIG. 3B) coupled to the first housing part 21 or integrally formed with the first housing part 21 at least partially. For example, at least a portion of the first area ① included in the flexible display 30 may be disposed in the first support structure 41. The electronic device 2 may include a second support structure (not shown) positioned in the second housing part 22 to correspond to at least a portion of the second area ② included in the flexible display 30. In an embodiment, in a slide-out, due to a spatial position relation between the first support structure 41 coupled to the first area ① and the second support structure corresponding to at least a portion of the second area ①, at least a portion of the second area ② may be withdrawn out through between the first cover part 222a and the second support structure. In a slide-in of the second housing part 22, due to a spatial position relation between the first support structure 41 coupled to the first area ① and the second support structure corresponding to at least a portion of the second area ②, at least a portion of the second area ② may be introduced into the inside of the housing 20 through between the first cover part 222a and the second support structure. In some embodiments, in a slide-out, at least a portion of the flexible display 30 may be withdrawn out through between the first cover part 212a and the first support structure 41. In a slide-in, at least a portion of the flexible display 30 may be introduced into the inside of the housing 20 through between the first cover part 212a and the first support structure 41. In the first support structure 41, a portion coupled to the first area ① of the flexible display 30, for example, may include a flat surface area and/or a curved-surface area. For example, the flat surface area of the first support structure 41 may contribute to the formation of the first flat surface part S1 of the screen S. For example, the curved-surface area of the first support structure 41 may contribute to the formation of the first curved-surface part S2 of the screen S. The second curved-surface part S3 of the screen S may be formed to correspond to the curved-surface part of the second support structure.

According to an embodiment, the first back cover 211 may form a first rear surface B1 of the electronic device 2, and the second back cover 221 may be configured to form a second rear surface B2 of the electronic device 2. For example, the first rear surface B1 may include a second flat surface part B11 substantially parallel to the first flat surface part S1, and/or a third curved-surface part B12 which is bent from the second flat surface part B11 toward the first curved-surface part S2 to correspond to the first curved-surface part S2 of the screen S. For example, the second rear surface B2 may include a third flat surface part B21 substantially parallel to the first flat surface part S1 of the screen S, and/or a fourth curved-surface part B22 which is bent from the third flat surface part B21 toward the second curved-surface part S3 to correspond to the second curved-surface part S3 of the screen S. In an embodiment, in a closed state of the electronic device 2, the second flat surface part B11 and the third flat surface part B21 may be formed without a substantial difference in height. In some embodiments, the electronic device may be implemented in a form in which the third flat surface part B21 is expanded without the third curved-surface part B12 or the fourth curved-surface part B22. In some embodiments, the first back cover 211 or the second back cover 221 may be omitted.

According to an embodiment, the first back cover 211 and/or the second back cover 221 may be opaque. For example, the first back cover 211 and/or the second back cover 221 may be formed of coated or colored glass, ceramic, polymer, metal (e.g., aluminum, stainless steel (STS), or magnesium), or a combination of at least two of the above materials.

According to some embodiments, in a state (e.g., a closed state of the electronic 2) where the second area ② of the flexible display 30 is at least partially inserted in the inner space of the housing 20, at least a portion of the second area ② may be configured to be seen from the outside through the second rear surface B2. In the case, at least a partial area of the second back cover 221 may be implemented transparently or translucently. In some embodiments, when there are a member positioned in at least a portion between the second back cover 221 and the second area ② in a closed state of the electronic device 2, at least a partial area of the member may include an opening or may be formed transparently or translucently.

According to an embodiment, a sliding structure related to the second housing part 22 may include an elastic structure. For example, when the second housing part 22 moves by a predetermined distance by external force, by the elastic structure included in the sliding structure, the electronic device may be changed from a closed state to an open state or from an open state to a closed state (e.g., a semi-automatic slide operation) even without external force. In some embodiments, when a signal is generated through an input device included in the electronic device 2, the electronic device 2 may be changed from a closed state to an open state or from an open state to a closed state by a driving device, such as a motor, connected to the second housing part 22. For example, when a signal is generated through a software button provided through a hardware button or the screen S, the electronic device 2 may be changed from a closed state to an open state or from an open state to a closed state. In some embodiments, when a signal is generated from various sensors such as a pressure sensor, the electronic device 2 may be changed from a closed state to an open state or from an open state to a closed state.

According to an embodiment, the electronic device 2 may include a first camera module 271, multiple second camera modules 272, and/or a flash 273. The first camera module 271 and each of the multiple second camera modules 272 may include one lens or multiple lenses, an image sensor, and/or an image signal processor. For example, the flash 273 may include a light-emitting diode or a xenon lamp.

For example, the first camera module 271 (e.g., the camera module 180 of FIG. 1) may be aligned with an opening (e.g., a through-hole or a notch) formed through the screen S, and may be positioned inside the electronic device 2. External light may be introduced into the first camera module 271 after having been transmitted through the opening and a partial area of a transparent cover overlapping the opening. The transparent cover may function to protect the flexible display 30 from the outside, and for example, may be implemented in a flexible member such as plastic film (e.g., a polyimide film) or ultra-thin glass (UTG).

According to some embodiments, the first camera module 271 may be disposed on at least a portion of the lower end of the screen S, and may perform a related function (e.g., image photographing) in a state where the position of the first camera module 271 is not visually distinguished (exposed). For example, the first camera module 271 may be positioned on the rear surface of the screen S, or below or beneath the screen S, and may include a hidden display rear camera (e.g., an under display camera). For example, the first camera module 271 may be aligned with and positioned in a recess formed on the rear surface of the flexible display 30. When seen from above the screen S (e.g., when seen from the −z axis direction), the first camera module 271 may be disposed to overlap at least a portion of the screen S, and may acquire an image of an external subject while not being exposed to the outside. In the case, a partial area, which at least partially overlaps the first camera module 271, of the flexible display 30 may include a different pixel structure and/or wiring structure in comparison to another area. For example, a partial area, which at least partially overlaps the first camera module 271, of the flexible display 30 may have a different pixel density in comparison to another area. A pixel structure and/or wiring structure formed in a partial area, which at least partially overlaps the first camera module 271, of the flexible display 30 may reduce a light loss, between the outside and the first camera module. According to some embodiments, a pixel may not be disposed in a partial area, which at least partially overlaps the first camera module 271, of the flexible display 30.

According to various embodiments, the multiple second camera modules 272 (e.g., the camera module 180 of FIG. 1) and/or the flash 273, for example, may be positioned in the first housing part 21 to correspond to the first rear surface B1 of the electronic device 2. In an embodiment, the multiple second camera modules 272 may have attributes (e.g., view angles) or functions different from each other, and for example, may include a dual camera or a triple camera. In some embodiments, the multiple second camera modules 272 may include lenses having view angles different from each other, and the electronic device 2, on the basis of a user selection, may be configured to control the change of camera modules performed in the electronic device 2. As another example, the multiple second camera modules 272 may include at least one of a wide-angle camera, a telephoto camera, a color camera, a monochrome camera, or an infrared (IR) camera (e.g., a time of flight (TOF) camera or a structured light camera). For example, the IR camera may operate as at least a portion of a sensor module (not shown) (e.g., the sensor module 176 of FIG. 1). In some embodiments, one camera module may replace the multiple second camera modules 272.

According to various embodiments (not shown), the electronic device 2 may include various sensor modules (e.g., the sensor module 176 of FIG. 1). The sensor modules may generate electric signals or data values corresponding to an operation state inside the electronic device 2 or an environment state of the outside. For example, the sensor module may include at least one of a proximity sensor, a gesture sensor, a gyro sensor, a barometric pressure sensor, a magnetic sensor, an acceleration sensor, a grip sensor, a color sensor, an infrared (IR) sensor, a biometric sensor (e.g., a fingerprint sensor or an HRM sensor), a temperature sensor, a humidity sensor, or an illuminance sensor. According to an embodiment, the sensor module may include an optical sensor, and may be aligned with an opening (e.g., through-hole or a notch) formed through the flexible display 30 and be positioned in the electronic device 2. In the case, external light may be introduced into the optical sensor after having been transmitted through the opening and a partial area of a transparent cover overlapping the opening.

According to various embodiments, the sensor module may be disposed on at least a portion of the lower end of the screen S, and may perform a related function in a state where the position of the sensor module is not visually distinguished (exposed). For example, the sensor module may be positioned on the rear surface of the screen S of the flexible display 30, and below or beneath the screen S of the flexible display 30. The sensor module may be aligned with and positioned in a recess formed on the rear surface of the flexible display 30. When seen from above the screen S (e.g., when seen from the −z axis direction), the sensor module may be disposed to overlap at least a portion of the screen S, and may perform a corresponding function while not being exposed to the outside. In the case, a partial area, which at least partially overlaps the sensor module, of the flexible display 30 may include a different pixel structure and/or wiring structure in comparison to another area. For example, a partial area, which at least partially overlaps the sensor module, of the flexible display 30 may have a different pixel density in comparison to another area. A pixel structure and/or wiring structure formed in a partial area, which at least partially overlaps the sensor module, of the flexible display 30 may reduce the loss generated when various-type signals (e.g., light or ultrasonic waves) related to the sensor module pass therethrough, between the outside and the sensor module. According to various embodiments, multiple pixels may not be disposed in a partial area, which at least partially overlaps the sensor module, of the flexible display 30.

According to an embodiment, the electronic device 2 may include one or more key input devices 275 (e.g., the input module 150 of FIG. 1). In various embodiments (not shown), the key input devices each may include at least one sensor module.

According to various embodiments, the electronic device 2 may omit at least one of elements or may additionally include another element. For example, the electronic device 2 may include a microphone positioned inside the housing 20 and a microphone hole formed through the housing 20 to correspond thereto. According to various embodiments, the electronic device 2 may include multiple microphones capable of detecting the direction of sound. For example, the electronic device 2 may include a speaker positioned inside the housing 20 and a speaker hole formed through the housing 20 to correspond thereto. For example, the electronic device 2 may include a receiver for a call positioned inside the housing 20 and a receiver hole formed through the housing 20 to correspond thereto. In various embodiments, a microphone hole and a speaker hole may be implemented in one hole, or a speaker hole may be omitted as a piezo speaker. For example, the electronic device 2 may include a connector (e.g., a USB connector) (e.g., the connection terminal 178 of FIG. 1) positioned inside the housing 20 and a connector hole formed through the housing 20 to correspond thereto. The electronic device 2 may transmit/receive power and/or data to/from an external electronic device electrically connected to a connector through a connector hole. According to various embodiments, the electronic device 2 may include the electronic device 101 of FIG. 1, or may include at least one of elements of the electronic device 101 of FIG. 1.

Figure 4:
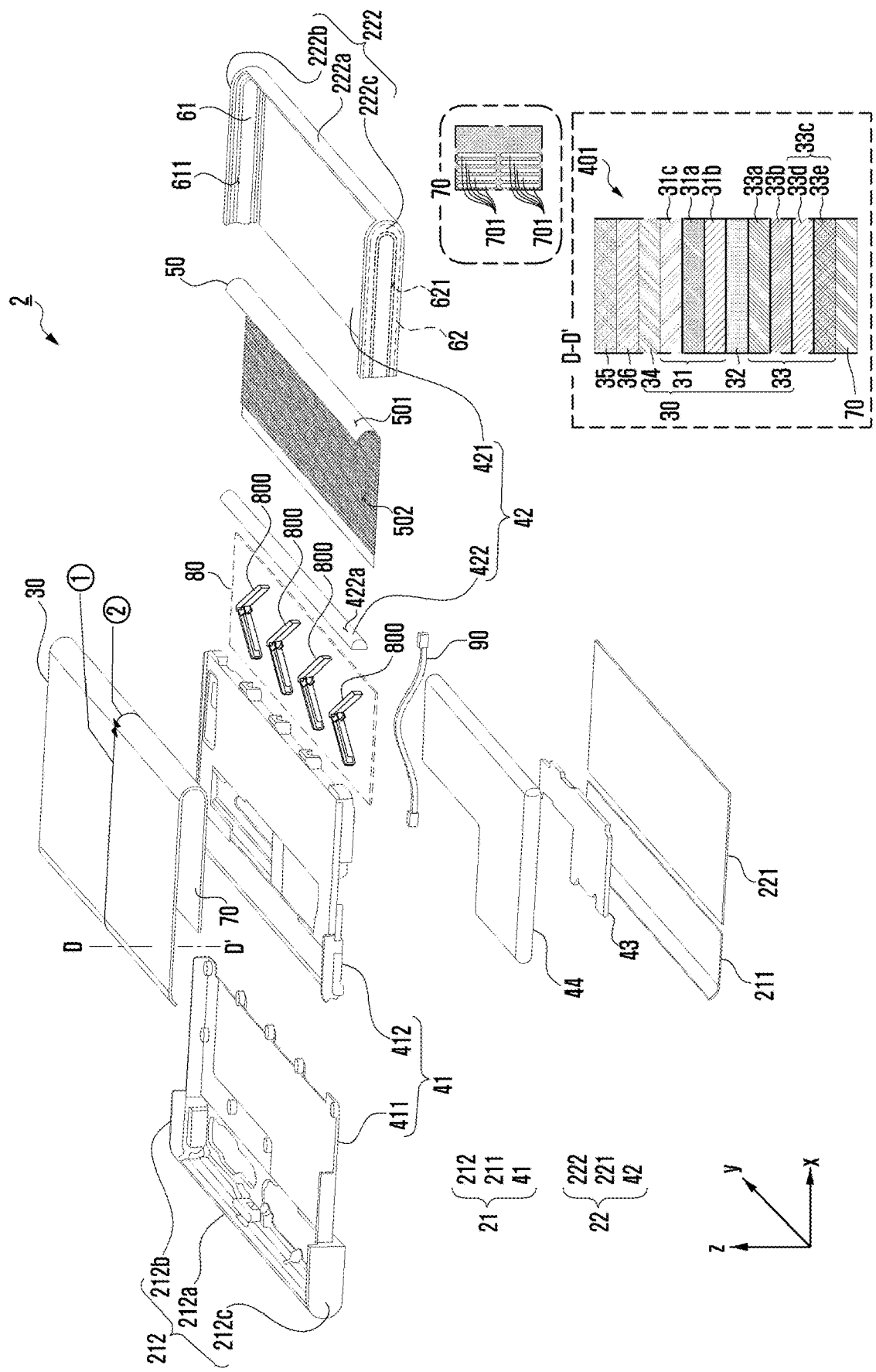
FIG. 4 is an exploded perspective view of the electronic device of FIG. 2A according to various embodiments.
Figure 5:
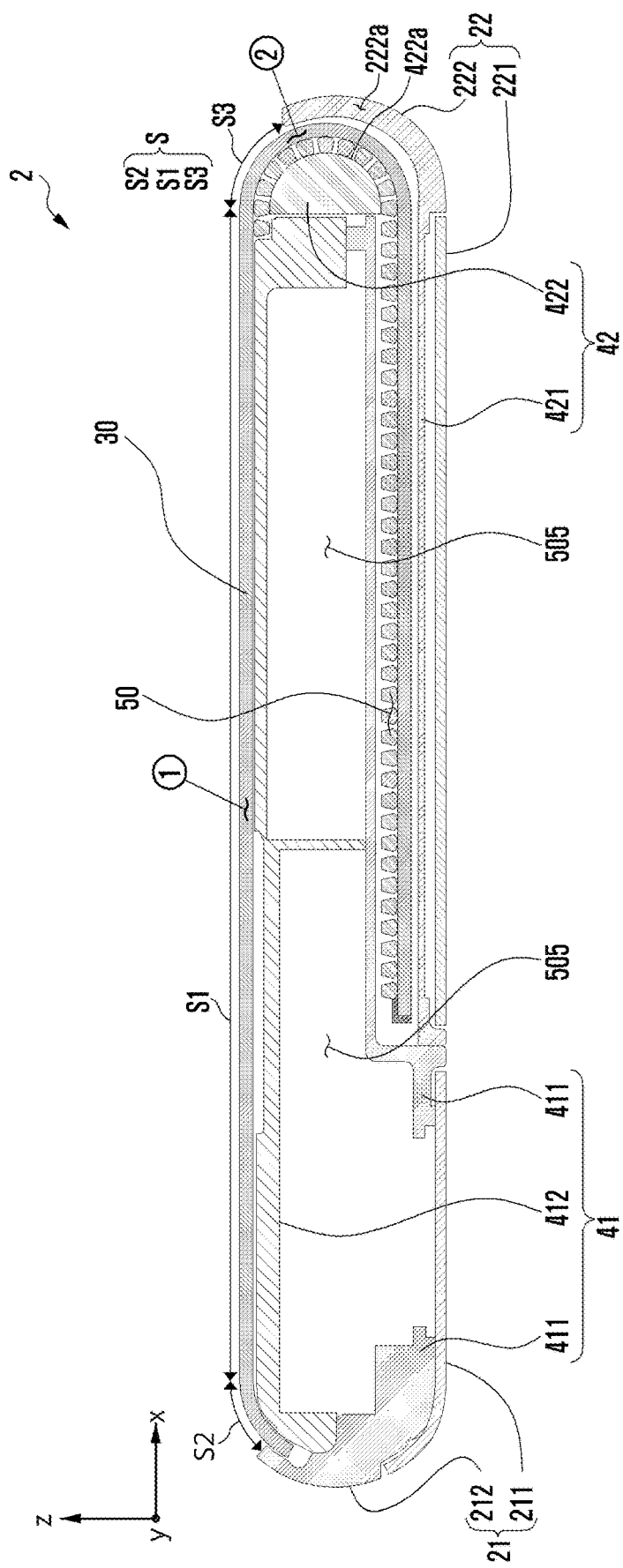
FIG. 5 is a cross sectional view of the electronic device taken along line A-A' of FIG. 2A according to various embodiments.
Figure 6:
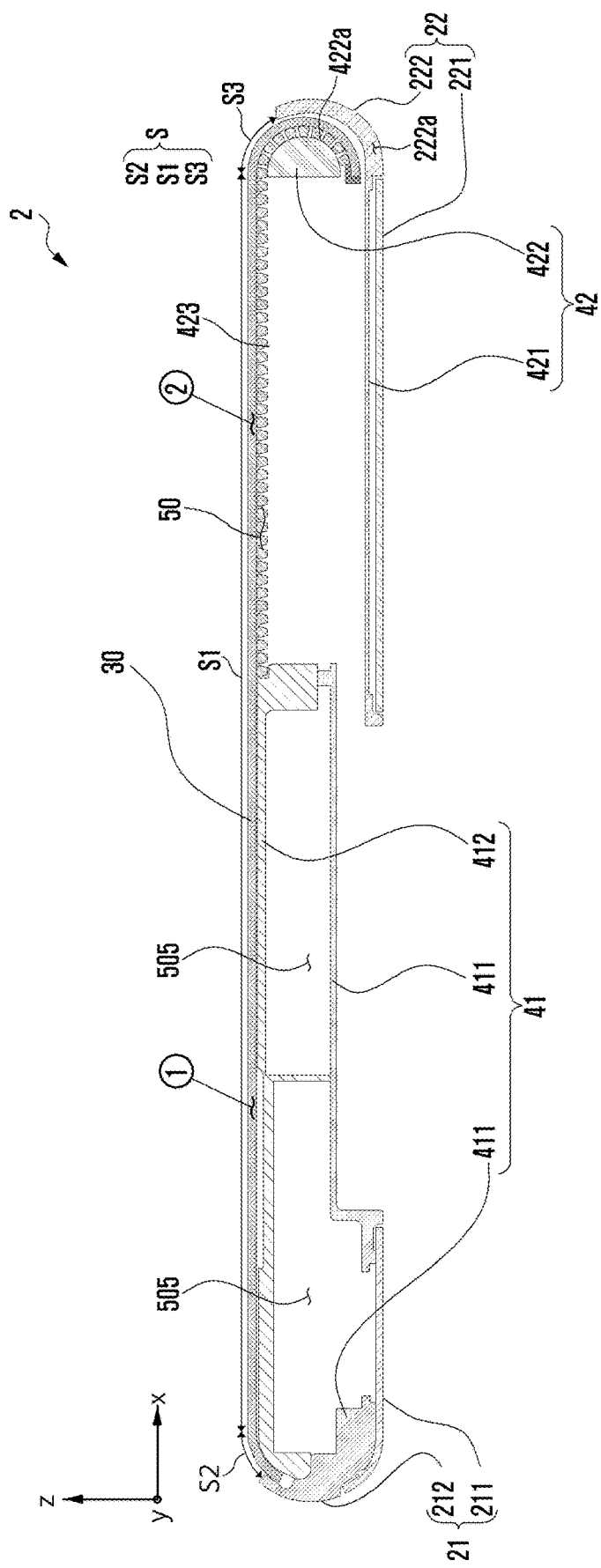
FIG. 6 is a cross sectional view of the electronic device taken along line B-B' of FIG. 3A according to various embodiments.

FIG. 4 is an exploded perspective view of the electronic device 2 of FIG. 2A according to various embodiments. FIG. 5 is a cross sectional view of the electronic device 2 taken along line A-A' of FIG. 2A according to various embodiments. FIG. 6 is a cross sectional view of the electronic device 2 taken along line B-B' of FIG. 3A according to various embodiments.

Referring to FIGS. 4, 5, and 6, an electronic device 2 may include a first housing part 21, a second housing part 22, a flexible display 30, a printed circuit board 43, a battery 44, a display support structure 50 (or, a display support, or the like), a first guide rail structure 61 (or, a first guide rail, or the like), a second guide rail structure 62 (or, a second guide rail, or the like), and/or sliding driving part 80.

According to an embodiment, the first housing part 21 may include a first back cover 211, a first side cover 212, and/or a first support structure 41. For example, the first support structure 41 may be coupled to the first side cover 212, or may be at least partially integrally formed with the first housing part 21. The first support structure 41 may be a frame structure (e.g., a first bracket) capable of enduring a load to contribute to durability or rigidity of the electronic device 2. The first support structure 41 may include multiple support members, and for example, may include a first support member 411 and a second support member 412. For example, the second support member 412 may be coupled to the first support member 411 and/or the first side cover 212 using various methods such as bolt fastening or bonding. In various embodiments, the first support member 411 may be integrally formed with the first side cover 212. The first back cover 211 may be disposed on the first support member 411. In an embodiment, at least a portion of a first area ① of the flexible display 30 may be disposed on the second support member 412. For example, the first area ① of the flexible display 30 may be disposed on the second support member 412 using a heat-reactive adhesive material, a photoreactive adhesive material, a general adhesive, and/or a double-sided tape. The first support structure 41 may not be limited thereto, and may be implemented in various other types.

According to an embodiment, the second housing part 22 may include a second back cover 221, a second side cover 222, and/or a second support structure 42. For example, the second support structure 42 may be coupled to the second side cover 222, or may be at least partially integrally formed with the second side cover 222. The second support structure 42 may be a frame structure (e.g., a second bracket) capable of enduring a load to contribute to durability or rigidity of the electronic device 2. The second support structure 42 may include multiple support members, and for example, may include a third support member 421 and a fourth support member 422. For example, the third support member 421 may be integrally formed with the second side cover 222. The second back cover 221 may be disposed on the third support member 421. For example, the fourth support member 422 may be coupled to the second side cover 222 using various methods such as bolt fastening or bonding. In an embodiment, the fourth support member 422 may be positioned to correspond to a first cover part 222a of the second side cover 222, and may include a curved-surface part 422a to face the first cover part 222a. In various embodiments, the fourth support member 422 may be referred to as a 'curved-surface support', a 'curved-surface member', a 'curved-surface support member', or a 'curved-surface support structure'. One end of the fourth support member 422 may be coupled to a second cover part 222b or a separate support member disposed in the second cover part 222b. The other end of the fourth support member 422 may be coupled to a third cover part 222c or a separate support member disposed in the third cover part 222c. In an embodiment, in a slide-out of the second housing part 22, the fourth support member 422 may be away from the first support structure 41 coupled to the first area ① of the flexible display 30, and at least a portion of a second area ② included in the flexible display 30 may be withdrawn out through a curved shape space between the first cover part 222a and the fourth support member 422. In a slide-in of the second housing part 22, the fourth support member 422 may be brought closer to the first support structure 41 coupled to the first area ①, and at least a portion of the second area ② may be introduced into the inside of the housing 20 through the curved shape space between the first cover part 222a and the fourth support member 422.

According to an embodiment, the printed circuit board 43 (e.g., a printed circuit board (PCB), a flexible PCB (FPCB), or a rigid-flexible PCB (RFPCB)) and/or the battery 44 may be arranged on or coupled to the first support structure 41 in an inner space 505 of the first housing part 21. In an embodiment, when seen from above the screen S (e.g., when seen from the −z axis direction), the printed circuit board 43 and the battery 44 may not overlap with each other. For example, the printed circuit board 43 may be electrically connected to the flexible display 30 through a flexible printed circuit board (FPCB) (not shown). For example, the printed circuit board 43 may have a processor (e.g., the processor 120 of FIG. 1), a memory (e.g., the memory 130 of FIG. 1), and/or an interface (e.g., the interface 177 of FIG. 1) mounted thereon. The electronic device 2 may include various other elements arranged on the printed circuit board 43 or electrically connected to the printed circuit board 43. The battery 44 may be a device for supplying power to at least one element of the electronic device 2, and for example, may include a non-rechargeable primary cell, a rechargeable secondary cell, or a fuel cell. The battery 44 may be integrally disposed inside the electronic device 2, or may be disposed to be attached to or detached from the electronic device 2. At least one electronic component included in the electronic device 2 may be positioned in the second housing part 22 in the inner space of the electronic device 2.

According to an embodiment, the display support structure 50 may be disposed on or coupled to the rear surface of the flexible display 30. The rear surface of the flexible display 30 may refer, for example, to a surface positioned in opposite to a surface in which light is emitted from a display panel including multiple pixels. In an embodiment, at least a portion of the display support structure 50 may be disposed on the rear surface of the second area ② included in the flexible display 30. In a slide-out or a slide-in of the second housing part 22, the display support structure 50 may move along the curved-surface part 422a of the fourth support member 422. The display support structure 50 may support the second area ② so as to maintain a state in which the second area ② of the flexible display 30 is smoothly connected to the first area ① of the flexible display 30. In a closed state or an open state of the electronic device 2, a portion of the display support structure 50 may support the second area ② in between the curved-surface part 422a of the fourth support member 422 and the second area ②. In an open state of the electronic device 2, for example, a portion of the display support structure 50 may support a first flat part S1 included in screen S. For example, the display support structure 50 may contribute that the second area ②  moves while maintaining a state of being smoothly connected to the first area ① in the change between the closed state (refer to FIG. 5) and the open state (refer to FIG. 6) of the electronic device 2.

According to an embodiment, the display support structure 50 may include a first surface 501 facing at least a portion of the second area ② of the flexible display 30, and a second surface 502 positioned at side opposite to the first surface 501. In an embodiment, the display support structure 50 may include a multi-bar structure (or, a multi-bar assembly, or a multi-bar support, or the like). For example, the multi-bar structure may include a form in which multiple support bars extending in a third direction (e.g., the y axis direction) orthogonal to a first direction (e.g., the +x axis direction) of a slide-out are arranged on the second surface 502. The multi-bar structure may have flexibility due to portions between multiple multi-bars, which have a relatively thin thickness. In various embodiments, the multi-bar structure may be implemented without portions for connecting multiple support bars. In various embodiments, the multi-bar structure may be referred to as another term such as a 'flexible track'.

According to an embodiment, the electronic device 2 may include a rail part for guiding the movement of the display support structure 50. The first guide rail structure 61 may be disposed on or coupled to the second cover part 222b of the second side cover 222, and may include a first guide rail 611. The second guide rail structure 62 may be disposed on or coupled to the third cover part 222c of the second side cover 222, may include a second guide rail 621. One side part of the display support structure 50 may be positioned in or inserted into the first guide rail 611, and the other side part of the display support structure 50 may be positioned in or inserted into the second guide rail 621. In an embodiment, the first guide rail 611 and the second guide rail 621 each may include a groove or a recess corresponding to a movement path of the display support structure 50. The display support structure 50 may be guided by the first guide rail 611 and the second guide rail 621 to move. The first guide rail 611 and the second guide rail 621 may be substantially symmetric with reference to a center line C of the electronic device 2, which extends in the third direction (e.g., the y axis direction) orthogonal to a first direction (e.g., the +x axis direction) which is a movement direction of at the time of a slide-out. For example, the center line C of the electronic device 2 may be a line which is a symmetric reference with respect to the screen S. In various embodiments, the first guide rail structure 61 and the second cover part 222b of the second side cover 222 may be integrally formed with each other, and the second guide rail structure 62 and the third cover part 222c of the second side cover 222 may be integrally formed with each other. In an embodiment, the first guide rail 611 and the second guide rail 621 may include a conductive member.

According to an embodiment, a sliding structure for a slide-out or a slide-in of the second housing part 22 may be included between the first housing part 21 and the second housing part 22. In an embodiment, the first support structure 41 may include a first slide (not shown) positioned in or inserted into the first guide rail 611 of the first guide rail structure 61. The first support structure 41 may include a second slide (not shown) positioned in or inserted into the second guide rail 621 of the second guide rail structure 62. When the electronic device 2 is changed between the closed state of FIG. 5 and the open state of FIG. 6, there may be sliding between the first slide and the first guide rail 611 and sliding between the second slide and the second guide rail 621.

According to various embodiments, the electronic device 2 may further include a support sheet 70 disposed on or coupled to the rear surface of the flexible display 30. In the case, the display support structure 50 may be disposed on the support sheet 70. The support sheet 70 may contribute to durability of the flexible display 30. The support sheet 70 may reduce the impact by which a load or stress, which may occur in a change between the closed state of FIG. 5 and the open state of FIG. 6, is applied to the flexible display 30. The support sheet 70 may prevent and/or reduce damage of the flexible display 30 by the force transmitted when the second housing part 22 moves.

For example, a cross sectional structure 401 according to line D-D' of FIG. 4 may include the flexible display 30, a transparent cover 35, an optical transparent adhesive member 36, and/or the support sheet 70. The flexible display 30 may be coupled to the transparent cover 35 using the optical transparent adhesive member 36 (e.g., an optical clear adhesive (OCA), optical clear resin (OCR), or super view resin (SVR)). The transparent cover 35 (e.g., a window) may cover the flexible display 30 to protect the flexible display 30 from the outside. The transparent cover 35 may be implemented in a thin film type (e.g., a thin film layer) having flexibility. For example, the transparent cover 35 may include a plastic film (e.g., a polyimide film) or thin film glass (e.g., ultra-thin glass). In various embodiments, the transparent cover 35 may include multiple layers. For example, the transparent cover 35 may be a form in which various coating layers are arranged on a plastic film or thin film glass. For example, the transparent cover 35 may be a form in which at least one protective layer including a polymer material (e.g., polyester (PET), polyimide (PI), or thermoplastic polyurethane (TPU)) or a coating layer is arranged on a plastic film or thin film glass.

For example, the flexible display 30 may include a display panel 31, a base film 32, a lower panel 33, or an optical layer 34. The display panel 31 may be positioned between the optical layer 34 and the base film 32. The base film 32 may be positioned between the display panel 31 and the lower panel 33. The optical layer 34 may be positioned between the optical transparent adhesive member 36 and display panel 31. An adhesive member (not shown) made of various polymers may be disposed between the display panel 31 and the base film 32, between the base film 32 and the lower panel 33, and/or between the display panel 31 and the optical layer 34. For example, the display panel 31 may include a light-emitting layer 31a, a thin film transistor (TFT) film 31b, and/or an encapsulation 31c (e.g., a thin-film encapsulation (TFE)). For example, the light-emitting layer 31a may include multiple pixels implemented in a light-emitting element such as organic light-emitting diodes (OLEDs) or micro LEDs. The light-emitting layer 31a may be disposed on the TFT film 31b through evaporation of organic. The TFT film 31b may be positioned between the light-emitting layer 31a and the base film 32. The TFT film 31b may refer, for example, to a film structure in which at least one TFT is disposed on a flexible substrate (e.g., a PI film) through a series of processes such as deposition, patterning, and etching. At least one TFT may control current for a light-emitting element of the light-emitting layer 31a to control ON or OFF of a pixel, or brightness of a pixel. For example, at least one TFT may be implemented in an amorphous silicon (a-Si) TFT, a liquid crystalline polymer (LCP) TFT, a low-temperature polycrystalline oxide (LTPO) TFT, or a low-temperature polycrystalline silicon (LTPS) TFT. The display panel 31 may include a storage capacitor, and the storage capacitor may maintain a voltage signal to a pixel, may maintain voltage applied to a pixel within one frame, or may reduce a gate voltage change caused by leakage current during light-emitting time. Due to a routine (e.g., initialization, or data write) for controlling at least one TFT, the storage capacitor may maintain voltage applied to a pixel at predetermined time interval. In an embodiment, the display panel 31 may be implemented on the basis of an OLED, and the encapsulation 31c may cover the light-emitting layer 31a. An emitting-light organic material and an electrode in an OLED may sensitively react with oxygen and/or moisture and thus may lose a light-emitting property. The encapsulation 31c may seal the light-emitting layer 31a such that oxygen and/or moisture does not permeate an OLDE. The base film 32 may include a flexible film formed of polymer such as polyimide or polyester (PET), or plastic. The base film 32 may function to support and protect the display panel 31. In various embodiments, the base film 32 may be referred to as a protective film, a back film, or a back plate.

The lower panel 33 may include multiple layers for various functions. An adhesive member (not shown) made of various polymers may be disposed between multiple layers included in the lower panel 33. For example, the lower panel 33 may include a light-blocking layer 33a, a buffer layer 33b, or a lower layer 33c. The light-blocking layer 33a may be positioned between the base film 32 and the buffer layer 33b. The buffer layer 33b may be positioned between the light-blocking layer 33a and the lower layer 33c. The light-blocking layer 33a may block at least a part of light incident from the outside. For example, the light-blocking layer 33a may include an emboss layer. The emboss layer may be a black layer including a bumpy pattern. The buffer layer 33b may reduce an external impact applied to the flexible display 30. For example, the buffer layer 33b may include a sponge layer or a cushion layer. The lower layer 33c may spread, disperse, or radiate heat generated in the electronic device 2 or the flexible display 30. The lower layer 33c may absorb or shield electromagnetic waves. The lower layer 33c may buffer an external impact applied to the electronic device 2 or the flexible display 30. For example, the lower layer 33c may include a composite sheet 33d or a conductive sheet 33e. In an embodiment, the composite sheet 33d may be a sheet formed by combining and processing sheets or layers having different properties. For example, the composite sheet 33d may include at least one of polyimide or graphite. The composite sheet 33d may be replaced to a single sheet including one material (e.g., polyimide or graphite). The composite sheet 33d may be positioned between the buffer layer 33b and the conductive sheet 33e. The conductive sheet 33e may function to shield an electromagnetic interference (EMI) in order for the flexible display 30. The conductive sheet 33e may include various other metal materials (e.g., copper). In various embodiments, at least a portion of the lower layer 33c may be a conductive member (e.g., a metal plate), may help to reinforce rigidity of the electronic device 2, may shield an ambient noise, and may be used for dispersion of heat radiated from peripheral heat-emitting components (e.g., a display driving circuit (e.g., a DDI)). For example, the conductive member may include at least one of copper (CU), aluminum (Al), stainless steel (SUS), or a CLAD (e.g., a laminated member in which SUS and Al are alternately arranged). The lower panel 33c may include various layers for other various functions. According to various embodiments (not shown), at least one additional polymer layer (e.g., a layer including PI, PET, or TPU) may be further disposed on the rear surface of the display panel 31 in addition to the base film 32. In various embodiments, at least one of multiple layers (e.g., the light-blocking layer 33a, the buffer layer 33b, the composite sheet 33d, and the conductive sheet 33e) included in the lower panel 33 may be omitted.

In various embodiments, the arrangement order of the multiple layers included in the lower panel 33 may be not limited to the embodiment of FIG. 4, and may be variously changed. For example, the optical layer 34 may include a polarization layer (a polarizing layer or polarizer), or a phase delay layer (a retardation layer or retarder). The polarization layer and the phase delay layer may improve the outdoor visibility of a screen. For example, the optical layer 34 may selectively transmit light which is generated from a light source of the display panel 31 and vibrates in a predetermined direction. In various embodiments, one layer into which a polarization layer and a phase delay layer are combined may be provided, and may be defined as a 'circular polarization layer'. The optical transparent adhesive member 36 may be positioned between the transparent cover 35 and the optical layer 34. In various embodiments, a polarization layer (or a circular polarization layer) may be omitted, and in this case, a black pixel define layer (PDL) and/or a color filter may be included in order to replace the polarization layer. The electronic device 2 may include a touch detection circuit (not shown) (e.g., a touch sensor). The touch detection circuit may be implemented in a transparent conductive layer (or film) based on various conductive materials such as an indium tin oxide (ITO). In an embodiment, the touch detection circuit may be positioned between the transparent cover 35 and the optical layer 34 (e.g., an add-on type). In an embodiment, the touch detection circuit may be positioned between the optical layer 34 and the display panel 31 (e.g., an on-cell type). In an embodiment, the display panel 31 may include a touch detection circuit or a touch detection function (e.g., an in-cell type). In various embodiments, the display panel 31 may be based on an OLED, and may include the encapsulation 31c positioned between the light-emitting layer 31a and the optical layer 34. The encapsulation 31c may perform a function of a pixel protective layer for protecting multiple pixels. In an embodiment (not shown), the flexible display 30 may include a conductive pattern such as a metal mesh (e.g., an aluminum metal mesh) which is a touch detection circuit disposed on the encapsulation 31c in between the encapsulation 31c and the optical layer 34. For example, in response to bending of the flexible display 30, the metal mesh may have durability greater than a transparent conductive layer implemented in an ITO. In various embodiments, the flexible display 30 may further include a pressure sensor (not shown) capable of measuring a touch intensity (pressure). Multiple layers included in the display panel 31 or the lower panel 33, a laminated structure thereof, or a laminated order thereof may be various. The flexible display 30, according to the type of provision or the trend of convergence, may be implemented by omitting a portion of elements or adding other elements.

According to an embodiment, the support sheet 70 may be attached to the rear surface of the lower panel 33 so as to cover at least a portion of the lower panel 33 of the flexible display 30. The support sheet 70 may be formed of various metal materials and/or nonmetal materials (e.g., polymer). For example, the support sheet 70 may include stainless steel. As another example, the support sheet 70 may include engineering plastic. In various embodiments, the support sheet 70 may be implemented integrally with the flexible display 30.

According to an embodiment, the support sheet 70 may include a lattice structure at least partially overlapping a portion (e.g., the second area ②, or the first curved-surface part S2 of the screen S) in which a bending portion of the flexible display 30 is disposed. For example, the lattice structure may include multiple openings 701 (or slits). For example, multiple openings 701 may be periodically formed, may have substantially the same or similar shape, and may be repeatedly arranged at predetermined interval. The lattice structure may contribute to flexibility of the second area ②, and the second area ② may be more flexible than the first area ① due to the lattice structure. In various embodiments, the support sheet 70 may include a recess pattern (not shown) including multiple recesses instead of the lattice structure. In various embodiments, the lattice or the recess pattern contributing to flexibility of the flexible display 30 may be expanded to at least a portion of the first flat part S1 of the screen S. In various embodiments, the support sheet 70 including the lattice or the recess pattern, or a conductive member corresponding thereto may be formed in multiple layers. The support sheet 70 may be configured such that elements (e.g., a multi-bar) positioned inside the electronic device 2 is not substantially seen through the flexible display 30. The lattice structure of the support sheet 70 corresponding to the second area ② of the flexible display 30 may include the multiple openings 701, but may be configured to transmit light in a level at which a multi-bar structure is not substantially seen through the flexible display 30. The lattice structure of the support sheet 70 corresponding to the second area ② of the flexible display 30 may include the multiple openings 70, but may also be configured to prevent and/or reduce a phenomena in which multiple multi-bars of a multi-bar structure are seen as protruding through the flexible display 30.

In a state (e.g., the open state of FIG. 6) where the screen S is expanded state, an unsmooth screen may be formed due to a lifting by the elasticity of the flexible display 30 and/or the support sheet 70. In an embodiment, in order to prevent and/or reduce the lifting phenomena, a tension device (or tension structure) for the flexible display 30 and/or the support sheet 70 may be formed. The tension device may contribute to a smooth slide operation while maintaining the tension applied to the flexible display 30 and/or the support sheet 70. For example, the tension device may apply tension to the flexible display 30 and the support sheet 70 using a belt (e.g., a wire shaped or a chain shaped belt). As another example, the tension device may apply tension to the flexible display 30 and the support sheet 70 using an elastic member such as a spring. When tension by the tension device is within a threshold range, in the closed state of FIG. 5 or the open state of FIG. 6, the second area ② of the flexible display 30 may be maintained in a form of being smoothly connected to the first area ① of the flexible display 30 without a lifting. When tension by the tension device is within a threshold range, in a change between the closed state of FIG. 5 and the open state of FIG. 6, the second area ② may move while maintaining a form of being smoothly connected to the first area ① without lifting. When tension by the tension device is within a threshold range, in a change between the closed state of FIG. 5 and the open state of FIG. 6, a slide operation thereof may be smoothly performed. For example, when tension by the tension device is lower than a threshold range, by the elasticity of the flexible display 30 and/or the elasticity of the support sheet 70, the second area ② may lift, or may not be smoothly disposed on the first area ①. As another example, when tension by the tension device is greater than a threshold range, the second area ② may be smoothly disposed on the first area ① without a lifting, but in a change between the closed state of FIG. 5 and the open state of FIG. 6, it may be difficult that a slide operation thereof is smoothly and softly performed.

According to an embodiment, in order to reduce the friction force between the curved-surface part 422a of the fourth support member 422 and the display support structure 50, a lubricant (e.g., grease) may be disposed between the curved-surface part 422a and the display support structure 50. In various embodiments, in order to reduce the friction force between the curved-surface part 422a of the fourth support member 422 and the display support structure 50, the surface of the curved-surface part 422a or the surface of the display support structure 50 may be coated with a lubricant.

In various embodiments, the fourth support member 422 (e.g., a curved-surface support, a curved-surface member, a curved-surface support member, or a curved-surface support structure) may be replaced to a rotating member such as a roller or a pulley. For example, one end of a rotation shaft related to the rotating member may be rotatably coupled to the first guide rail structure 61, and the other end of a rotation shaft related to the rotating member may be rotatably coupled to the second guide rail structure 62. In various embodiments, the rotating member may be defined as a curved-surface support, a curved-surface member, a curved-surface support member, or a curved-surface support structure, which is rotatably implemented on the basis of the friction with the display support structure 50.

According to an embodiment, the sliding driving part 80 may be configured to connect the first housing part 21 and the second housing part 22. The sliding driving part 80 may contribute to a smooth slide-out or slide-in of the second housing part 22 with respect to the first housing part 21. The sliding driving part 80 may drivingly connect the first housing part 21 and the second housing part 22 such that the second housing part 22 substantially moves in a slide-out direction (e.g., the +x axis direction) or in a slide-in direction (e.g., the −x axis direction) with respect to the first housing part 21. The sliding driving part 80 may provide a driving force for a sliding operation of the second housing part 22 with respect to the first housing part 21. For example, the sliding driving part 80 may include an elastic structure, and the elastic structure may provide a driving force which enables the second housing part 22 to be a slide-out or slide-in without an external force applied by a user. As another example, the sliding driving part 80 may include a driving device such as a motor, and the driving device may provide a driving force which enables the second housing part 22 to be a slide-out or slide-in without an external force applied by a user.

According to an embodiment, the sliding driving part 80 may include at least one hinge 800. The hinge 800 may connect the second support member 412 and the fourth support member 422 in between the second support member 412 of the first support structure 41 and the fourth support member 422 of the second support structure 42. For example, the hinge 800 may include a link work including multiple links and multiple joints. For example, the link work may be unfolded at a slide-out of the second housing part 22, or may be folded at a slide-in of the second housing part 22. In various embodiments, the link work may further include an elastic member (e.g., a torsion spring). For example, the elastic member may apply an elastic force which enables the link work to be unfolded at a slide-out of the second housing part 22. In various embodiments, the elastic member may apply an elastic force which enables the link work to be folded at a slide-in of the second housing part 22. The sliding driving part 80 may be implemented in various other types of hinges. The sliding driving part 80 may not be limited to a hinge, and may be implemented in various other types.

Although not illustrated, an electronic device including an expandable screen may not be limited to the electronic device 2 according to the embodiment of FIG. 4, and may be provided in various other types. In various embodiments, an electronic device in a state where a screen is reduced, may be implemented such that a flexible display is positioned in a rolled state in an inner space of an electronic device (or housing). In the case, the flexible display may be referred to as a rollable display.

Figure 7:
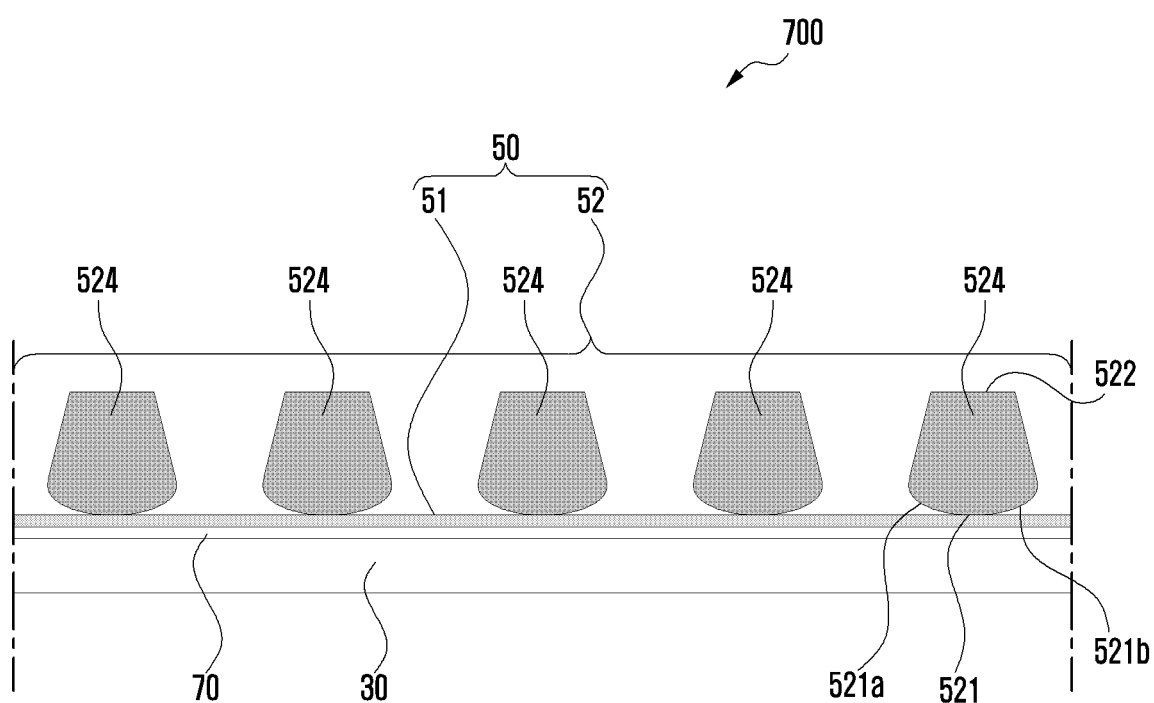
FIG. 7 illustrates a cross sectional view of a display assembly according to various embodiments.

FIG. 7 is a cross sectional view of a display assembly 700 according to various embodiments.

Referring to FIG. 7, a display assembly 700, for example, may include a flexible display 30, a display support structure 50, and/or a support sheet 70.

According to an embodiment, the display support structure 50 (e.g., a multi-bar structure) may include a first layer 51 and a second layer 52 including multiple support bars 524 (or a multi-support bar). The first layer 51 may be positioned between the support sheet 70 and the second layer 52. The first layer 51 may be a film shape or sheet shape having flexibility. The multiple support bars 524 may have substantially the same or similar cross sectional shape, and may be arranged with a predetermined distance from each other. In various embodiments, some of the multiple support bars 524 may be arranged with a first spaced distance from each other, and the other some of the multiple support bars 524 may be arranged with a second spaced distance different from the first spaced distance. The display support structure 50 may have flexibility by a form in which the multiple support bars 524 are separately arranged on the first layer 51, and by the flexibility of the first layer 51. The first layer 51 may include first areas in which the multiple support bars 524 are arranged, and second areas between the first areas. The display support structure 50 may be bent due to the second areas.

According to an embodiment, the multiple support bars 524 included in the second layer 52 may include a first surface 521 facing the first layer 51 and a second surface 522 positioned at a side opposite to the first surface 521. In an embodiment, the multiple support bars 524 each may have a cross sectional shape (e.g., a trapezoid shape) which decreases in a direction from the first surface 521 toward the second surface 522. The cross sectional shape may contribute that the display support structure 50 is bent with a smaller bend radius. The cross sectional shape of the multiple support bars 524 may not be limited to the illustrated embodiment, and may be various. In various embodiments, the second surface 522 may be formed in a curved-surface shape corresponding to the curved-surface part 422*a* included in the fourth support member 422 of FIG. 4. In various embodiments, the second surface 522 may be formed in a curved-surface shape convex in a direction from the first surface 521 toward the second surface 522.

According to an embodiment, both edge areas 521*a* and 521*b* of the first surface 521 included in the multiple support bars 524 may be formed in a curved-surface shape or an inclined surface shape separated from the first layer 51. Both edge areas 521*a* and 521*b* having a curved-surface shape or an inclined surface may contribute that the first layer 51 is smoothly bent. Both edge areas 521*a* and 521*b* having a curved-surface shape or an inclined surface may contribute to flexibility which enables the display support structure 50 to be bent with a smaller bend radius.

When there is a change between a closed state of FIG. 5 and an open state of FIG. 6, stress applied to the first layer 51 of the display support structure 50 may include stress caused by tension (a tensile stress) or stress caused by bending (a bending stress). For example, the tensile stress applied to the first layer 51 may be proportional to a tensile force applied to the first layer 51, and may be inversely proportional to the cross sectional area of the first layer 51. For example, the bending stress applied to the first layer 51 may be proportional to the modulus of direct elasticity (a degree of resistance to tension or compression) of the first layer 51 and/or the thickness of the first layer 51, and may be inversely proportional to the radius of curvature of the curved-surface portion 422*a* included in the fourth support member 422 of FIG. 4. In a change between a closed state of FIG. 5 and an open state of FIG. 6, in order to prevent and/or reduce damage of the first layer 51, the shape or material of the first layer 51 may be selected on the basis of the tensile stress or bending stress. For example, the first layer 51 may include a nonmetal material (e.g., polymer) or a metal material. The first layer 51 may be formed in a thickness enabling a bending characteristic of the display support structure 50 to be secured.

According to an embodiment, the first layer 51 and the second layer 52 may include the same or similar material. For example, the first layer 51 and the second layer 52 may be integrally formed. As another example, the display support structure 50 may be implemented through a method of separately forming the first layer 51 and the second layer 52 and then coupling same.

According to various embodiments, the first layer 51 and the second layer 52 may include different materials, respectively. A second material contained in the second layer 52 may have a strength greater than or hardness (hard properties) greater than a first material contained in the first layer 51.

According to an embodiment, the first layer 51 and the second layer 52 may include a metal material. For example, the first layer 51 and the second layer 52 may include the same or similar metal material. As another example, the first layer 51 may include a first metal material, and the second layer 52 may include a second metal material different from the first metal material. The first metal material of the first layer 51 may include a material having junction affinity with the support sheet 70 and the second metal material of the second layer 52.

According to various embodiments, the first layer 51 may include a first polymer, and the second layer 52 may include a second polymer different from the first polymer. The first polymer contained in the first layer 51 may have a softness (or soft properties) greater than a second polymer contained in the second layer 52. For example, the first polymer may be various such as polyester (PET), polyimide (PI), or thermoplastic polyurethane (TPU). The first polymer may contribute to a coupling force between the support sheet (70) and the second layer 52, and a durability of the display support structure 50. The first polymer may include a material having junction affinity with the support sheet 70 and the second polymer of the second layer 52. The first layer 51 may be formed in a thickness which enables a bending characteristic of the display support structure 50 to be secured according to the soft property of the first polymer. The second polymer contained in the second layer 52 may have a strength greater than or hardness (hard properties) greater than the first polymer contained in the first layer 51. For example, the second polymer may include engineering plastic (e.g., polycarbonate (PC) or polymethyl methacrylate (PMMA)). As another example, the second polymer may include a material (e.g., fiber reinforced plastic (FRP)) obtained by mixing engineering plastic with various reinforcing substrates such as glass fiber or carbon fiber. Due to the hard property of the second polymer, the second layer 52 may support the second area ② such that a state in which the second area ② (refer to FIG. 4, 5, or 6) of the flexible display 30 is smoothly disposed to the first area ① (FIG. 4, 5, or 6) of the flexible display 30 is maintained. When the second layer 52 including the second polymer is disposed on the support sheet 70 without the first layer 51, it may be difficult to secure a coupling force between the second layer 52 and the support sheet 70 due to the hard property of the second polymer.

According to various embodiments, the first layer 51 may include polymer, and the second layer 52 may include a metal material. In the case, in order to increase the mechanical coupling force between the first layer 51 and the second layer 52, a coupling structure in which a portion of the first layer 51 is positioned in a hole or groove formed through the second layer 52 may be included (e.g., an anchor effect).

According to various embodiments, the first layer 51 may be omitted, and in the case, the support sheet 70 may replace the first layer 51.

According to various embodiments, the display support structure 50 or the first layer 51 may function as the support sheet 70, and in the case, the support sheet 70 may be omitted.

According to various embodiments, the second layer 52 of the display support structure 50 may have an elasticity enough to secure a frictional force with the fourth support member 422 so as to be able to reduce the loss generated when movement is transmitted between the display support structure 50 and the fourth support member 422 of FIG. 4. The second layer 52 may extend between the fourth support member 422 and the second area ② of the flexible display 30, and may have an elastic modulus which enables same to be elastically in contact with the curved-surface part 422a included in the fourth support member 422 of FIG. 4.

Figure 8:
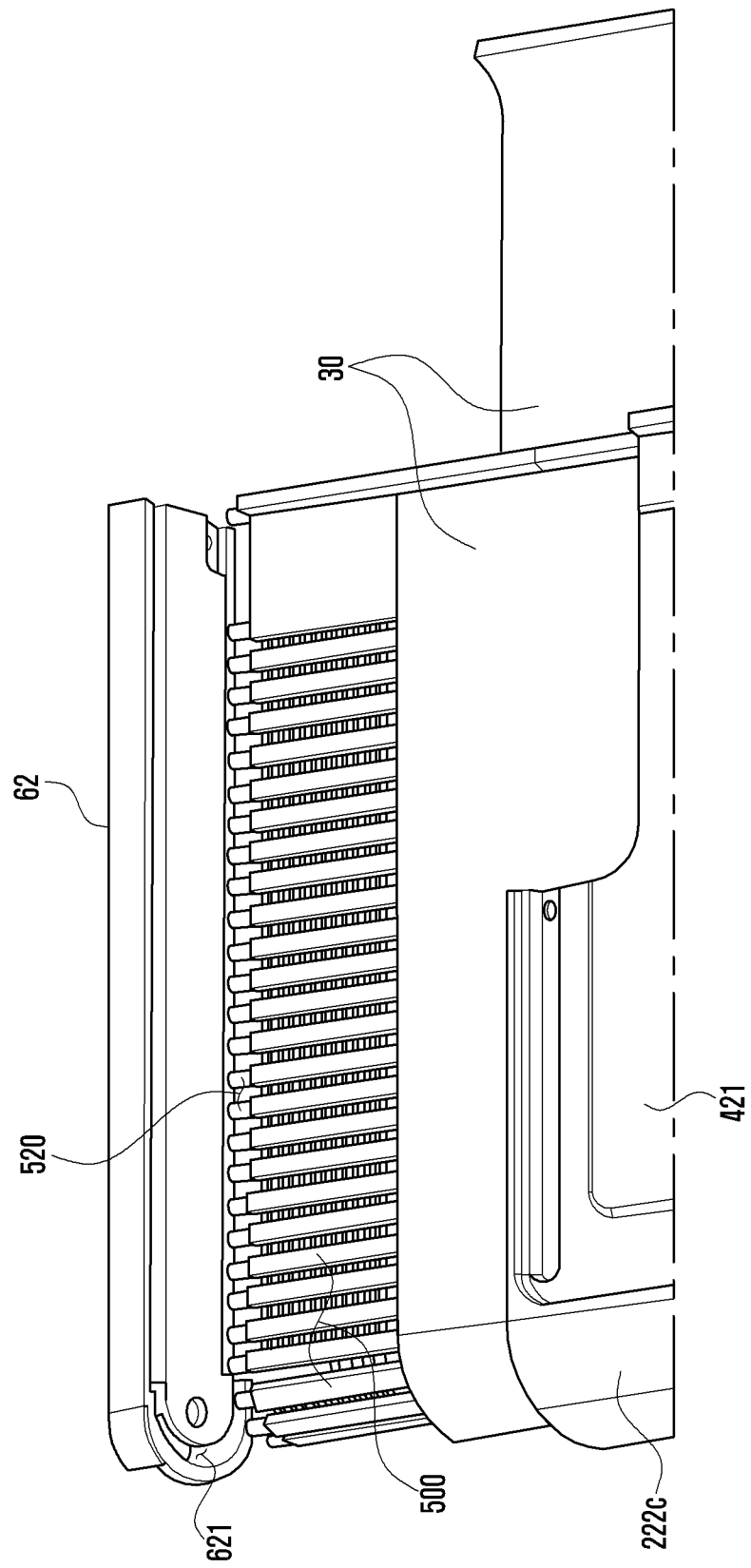
FIG. 8 is a perspective sectional view of a portion of an electronic device according to various embodiments.

FIG. 8 is a partial sectional perspective view illustrating a portion of an electronic device 2 according to various embodiments.

FIG. 8 illustrates a second guide rail structure 62, a multiple support bars 500 (e.g., the multiple support bars 524 in FIG. 7), a flexible display 30, a third cover part 222c, or a third support member 421, which is a portion of the electronic device 2. In an embodiment, one side part 520 of each of the multiple support bars 500 (or a multi-support bar) may be positioned in or inserted into a second guide rail 621 of the second guide rail structure 62. The other side part of each of the multiple support bars 500 may be positioned in or inserted into a first guide rail 611 of the first guide rail structure 61 of FIG. 4. In a state change (e.g., a change between a closed state and an open state) of the electronic device 2, the multiple support bars 500 may be guided by the first guide rail 611 and the second guide rail 621 and move.

Figure 9:
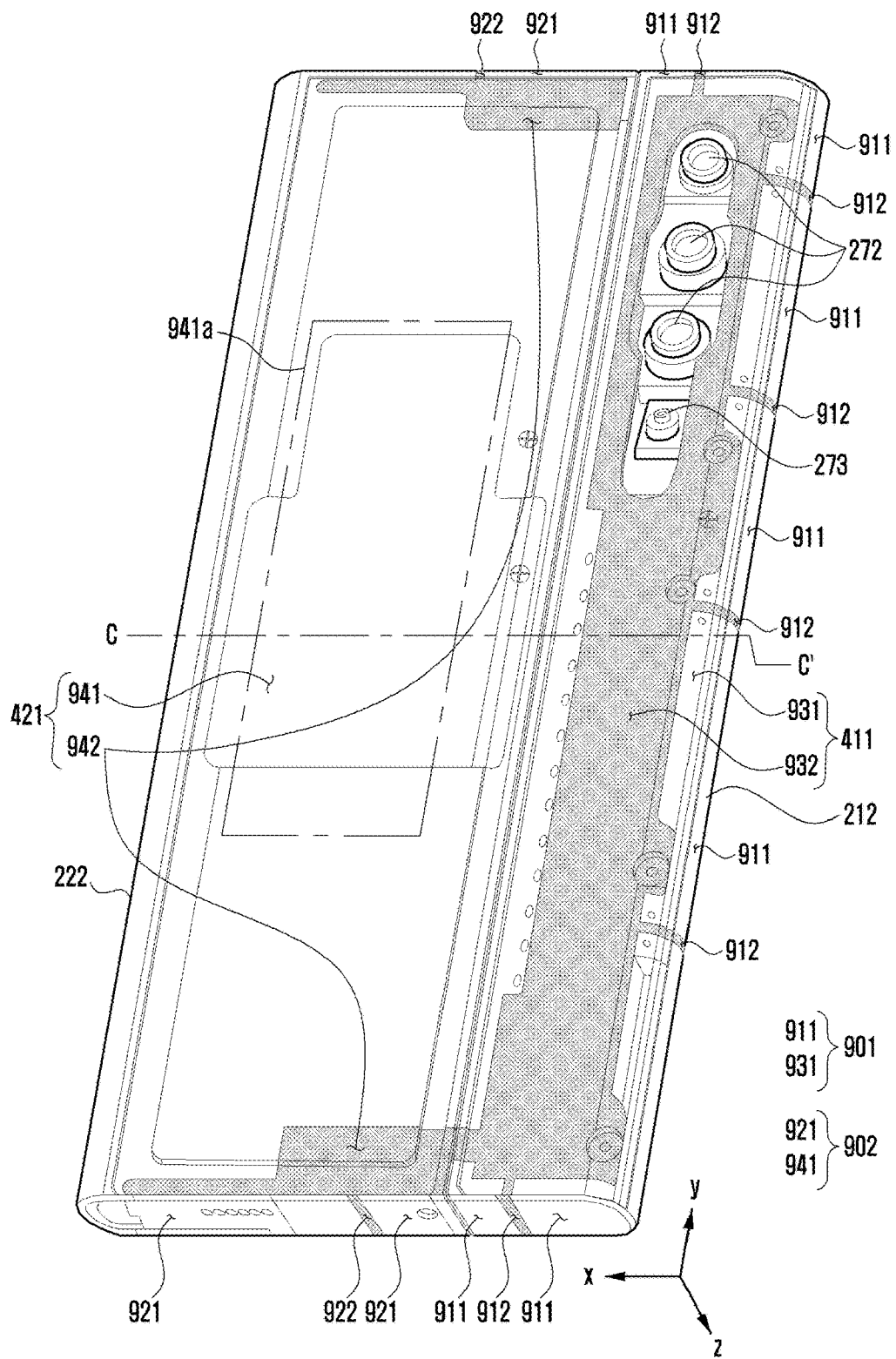
FIG. 9 is a perspective view illustrating a portion of the electronic device in a closed state of FIG. 2A according to various embodiments.
Figure 10:
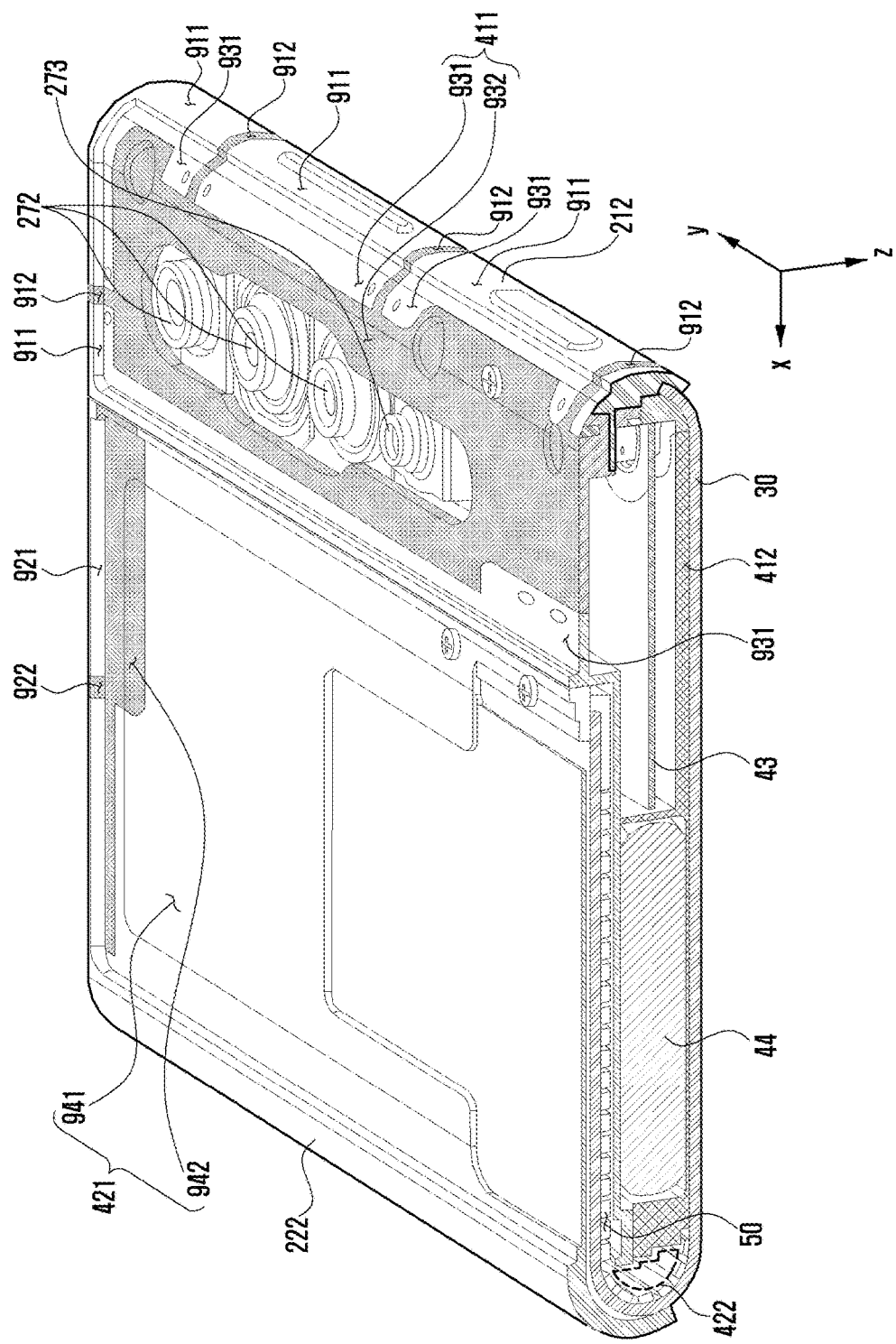
FIG. 10 is a partial perspective cross sectional view of an electronic device taken along line C-C' of FIG. 9 according to various embodiments.

FIG. 9 is a perspective view illustrating a portion of the electronic device of FIG. 2A in a closed state according to various embodiments. FIG. 10 is a perspective partial cross sectional view of an electronic device taken along line C-C' of FIG. 9 according to various embodiments.

For example, FIG. 9 illustrates a first side cover 212, a first support member 411, a second side cover 222, a third support member 421, multiple second camera modules 272, and/or a flash 273, which is a portion of the electronic device 2. For example, FIG. 10 illustrates a cross sectional structure including a first side cover 212, a first support member 411, a second support member 412, a third support member 421, a fourth support member 422, a flexible display 30, a display support structure 50, a printed circuit board 43, and/or a battery 44.

According to an embodiment, at least a portion of the first support member 411 may be connected to the first side cover 212, or may be integrally formed with the first side cover 212. The first side cover 212 may include multiple first conductive parts 911 and multiple first non-conductive parts 912 (or multiple first insulating parts). The multiple first conductive parts 911 may be physically separated by multiple first non-conductive parts 912 (or multiple first insulating parts). The first support member 411 may include at least one third conductive part 931 and at least one third non-conductive part 932. The at least one third conductive part 931 may be connected to or integrally formed with the multiple first conductive parts 911. In an embodiment, the at least one third non-conductive part 932 may be connected to or integrally formed with the multiple first conductive parts 912.

According to an embodiment, at least a portion of the third support member 421 may be connected to the second side cover 222, or may be integrally formed with the second side cover 222. The second side cover 222 may include multiple second conductive parts 921 and multiple second non-conductive parts 922 (or multiple second insulating parts). The multiple second conductive parts 921 may be physically separated by multiple second non-conductive parts 922. The third support member 421 may include at least one fourth conductive part 941 and/or at least one fourth non-conductive part 942. The at least one fourth conductive part 941 may be connected to or integrally formed with the multiple second conductive parts 921. The at least one fourth non-conductive part 942 may be connected to or integrally formed with the multiple second non-conductive parts 922. The configuration including the multiple first conductive parts 911 included in the first side cover 212 and at least one third conductive part 931 included in the first support member 411 may be referred to as a first metal structure 901. The configuration including the first metal structure 901 and the third non-conductive part 932 may be referred to as a first case. The configuration including the multiple second conductive parts 921 included in the second side cover 222 and at least one fourth conductive part 941 included in the third support member 421 may be referred to as a second metal structure 902. The configuration including the second metal structure 902 and the fourth non-conductive part 942 may be referred to as a second case.

According to an embodiment, the electronic device 2 may include at least one antenna and a wireless communication circuit (e.g., the wireless communication module 192 of FIG. 1) electrically connected to the at least one antenna. For example, the antenna may include at least one antenna radiator, a ground, or a transmission line. The at least one antenna radiator may form an electromagnetic field which enables transmission and/or reception of a signal of at least one frequency in a frequency band selected or designated when radiation current is provided from the wireless communication circuit. The wireless communication circuit may process a transmission signal or a reception signal in at least one frequency band through at least one antenna radiator. For example, the designated frequency band may include at least one of a low band (LB) (about 600 MHz-about 1 GHz), a middle band (MB) (about 1 GHz-about 2.3 GHz), a high band (HB) (about 2.3 GHz-about 2.7 GHz), or an ultra-high band (UHB) (about 2.7 GHz-about 6 GHz). The designated frequency band may include other frequency bands other than the above frequency bands. The transmission line may electrically connect the wireless communication circuit and the at least one antenna radiator, and may transfer a signal (voltage, or current) of a radio frequency (RF). For example, the transmission line may include various types of conductive structures for connecting the wireless communication circuit and the at least one antenna radiator, or an electrical path implemented in a wiring. For example, the ground (or an antenna ground) may include a ground (e.g., a ground plane) positioned on or included in the printed circuit board 43. The wireless communication circuit may be positioned on the printed circuit board 43, and in various embodiments, may be positioned on a printed circuit board different from the printed circuit board 43.

According to an embodiment, at least a portion of the first housing part 21 (refer to FIG. 4) may be electrically connected to a wireless communication circuit (e.g., the wireless communication module 192 of FIG. 1) to operate as an antenna radiator. For example, portions of the multiple first conductive parts 911 included in the first side cover 212 may be utilized as an antenna radiator. As another example, the at least one third conductive part 931 included in the first support member 411 may be utilized as an antenna radiator. As another example, a conductive part included in the second support member 412 may be utilized as an antenna radiator. As another example, at least a portion of the first back cover 211 (refer to FIG. 4) may be utilized as an antenna radiator.

According to various embodiments, at least a portion of the second housing part 22 (refer to FIG. 4) may be electrically connected to a wireless communication circuit (e.g., the wireless communication module 192 of FIG. 1) to operate as an antenna radiator. For example, portions of the multiple second conductive parts 921 included in the second side cover 212 may be utilized as an antenna radiator. As another example, the at least one fourth conductive part 941 included in the third support member 421 may be utilized as an antenna radiator. As another example, at least a portion of the second back cover 221 (refer to FIG. 4) may be utilized as an antenna radiator.

According to various embodiments, at least one antenna radiator may be positioned in the first housing part 21 (refer to FIG. 4) or the second housing part 22 (refer to FIG. 4), and may include a conductive pattern positioned inside the electronic device 2. For example, the conductive pattern may be implemented in a laser direct structuring (LDS) method. The LDS method may form a conductive pattern by drawing (or designing) a pattern on a structure formed of a polymer using a laser and then plating a conductive material such as copper or nickel thereon. In various embodiments, the conductive pattern may be implemented in a flexible printed circuit board (FPCB) form. In various embodiments, the conductive pattern may be implemented through various methods such as plating or printing. In various embodiments, the antenna radiator may include a conductive pattern (e.g., a microstrip) positioned on the printed circuit board 43.

According to various embodiments, an antenna may include a frequency adjustment circuit connected to a transmission line between at least one antenna radiator and a wireless communication circuit. The frequency adjustment circuit may include an electric element having components such as inductance, capacitance or conductance which act on the transmission line. For example, the frequency adjustment circuit may include various elements such as a lumped element or a passive element. In an embodiment, the frequency adjustment circuit may include a matching circuit. The matching circuit may control the impedance of the transmission line or the impedance of the antenna radiator. The matching circuit may match the impedance of the transmission line or the impedance of the antenna radiator. For example, the matching circuit may reduce reflections in a selected or a designated frequency (or an operation frequency) for the antenna, and may reduce power loss through the antenna radiator or may enable an efficient signal transmission, in a selected or a designated frequency. In various embodiments, the frequency adjustment circuit may shift the resonant frequency of at least one antenna radiator into a designated frequency, or may shift the resonant frequency by a designated amount.

Figure 11:
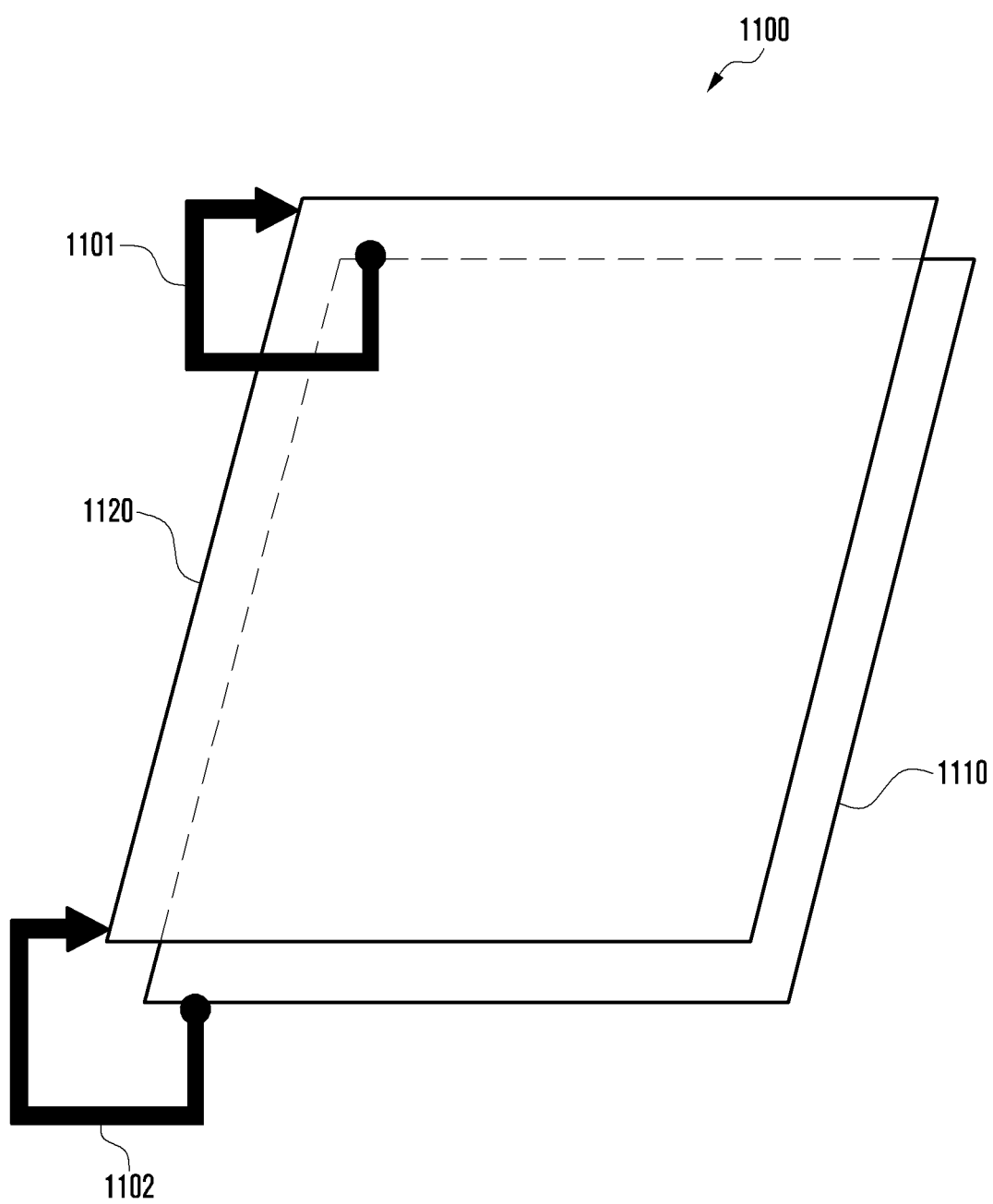
FIG. 11 is a diagram illustrating an example waveguide structure according to various embodiments.

FIG. 11 is a diagram illustrating an example waveguide structure 1100 according to various embodiments.

Referring to FIG. 11, a waveguide structure 1100 may include a first conductive plate 1110 and a second conductive plate 1120 facing each other. A dielectric such as an air layer may be positioned between the first conductive plate 1110 and a second conductive plate 1120. In various embodiments, a dielectric different from air may be positioned between the first conductive plate 1110 and a second conductive plate 1120. For example, a polymer adhesive material may be positioned between the first conductive plate 1110 and a second conductive plate 1120, and the first conductive plate 1110 and a second conductive plate 1120 may be joined by an adhesive material.

According to an embodiment, the first conductive plate 1110 may operate as a ground, and for example, may be electrically connected to a ground plane included in the printed circuit board 43 of FIG. 4. In various embodiments, the first conductive plate 1110 may be referred to as a 'first ground plane'.

According to an embodiment, the second conductive plate 1120 may operate as a ground, and for example, may be electrically connected to the ground plane included in the printed circuit board 43 of FIG. 4. In various embodiments, the second conductive plate 1120 may be referred to as a 'second ground plane'.

For example, the energy emitted from at least one antenna radiator adjacent to the waveguide structure 1100 electrically to connected a wireless communication circuit (e.g., the wireless communication module 192 of FIG. 1) may affect the waveguide structure 1100 (e.g., an electromagnetic coupling), and thus a parasitic resonance may occur in the waveguide structure 1100. For example, the at least one antenna radiator may include at least a portion (e.g., portions of the multiple first conductive parts of FIG. 9) of the first housing part 21 (refer to FIG. 4), or at least a portion (e.g., portions of the multiple second conductive parts of FIG. 9) of the second housing part 22 (refer to FIG. 4). As another example, the at least one antenna radiator may be positioned in the first housing part 21 or the second housing part 22, or may include various conductive patterns positioned inside the electronic device 2. The parasitic resonance caused by the waveguide structure 1100 may reduce an antenna radiation performance of an antenna using at least one antenna. For example, the first conductive plate 1110 and the second conductive plate 1120 may operate as a parallel-plate waveguide (PPW). A portion of electromagnetic waves emitted from the at least one antenna radiator may be reflected on a first surface of the first conductive plate 1110 facing the second conductive plate 1120 and the second surface of the second conductive plate 1120 facing the first conductive plate 1110 and then may travel (e.g., a guided wave). The parasitic resonance (or a waveguide resonance) caused by a guided wave passing between the first conductive plate 1110 and the second conductive plate 1120 may reduce an antenna radiation performance of an antenna using at least one antenna radiator. For example, the parasitic resonance frequency (or a frequency in which a parasitic resonance occurs) may be included in the resonance frequency band of an antenna using at least one antenna radiator, and the power leakage caused thereby may reduce an antenna radiation performance.

According to an embodiment, in order to reduce an effect in which the waveguide structure 1100 affects an antenna radiation performance of an antenna using at least one antenna radiator, the first conductive plate 1110 and the second conductive plate 1120 may be electrically connected to each other in at least one position. For example, the reference numerals '1101' and '1102' respectively indicate electrical paths (or ground paths) formed by connecting the first conductive plate 1110 and the second conductive plate 1120. In an embodiment, at least one ground path may control the parasitic resonance frequency such that the parasitic resonance frequency formed by the waveguide structure 1100 is not included in the resonance frequency band of an antenna using at least one antenna radiator. In various embodiments, at least one ground path may prevent and/or reduce the waveguide structure 1100 of FIG. 11, which allows a guided wave related to a parasitic resonance to pass therethrough, from being substantially formed.

Figure 12A:
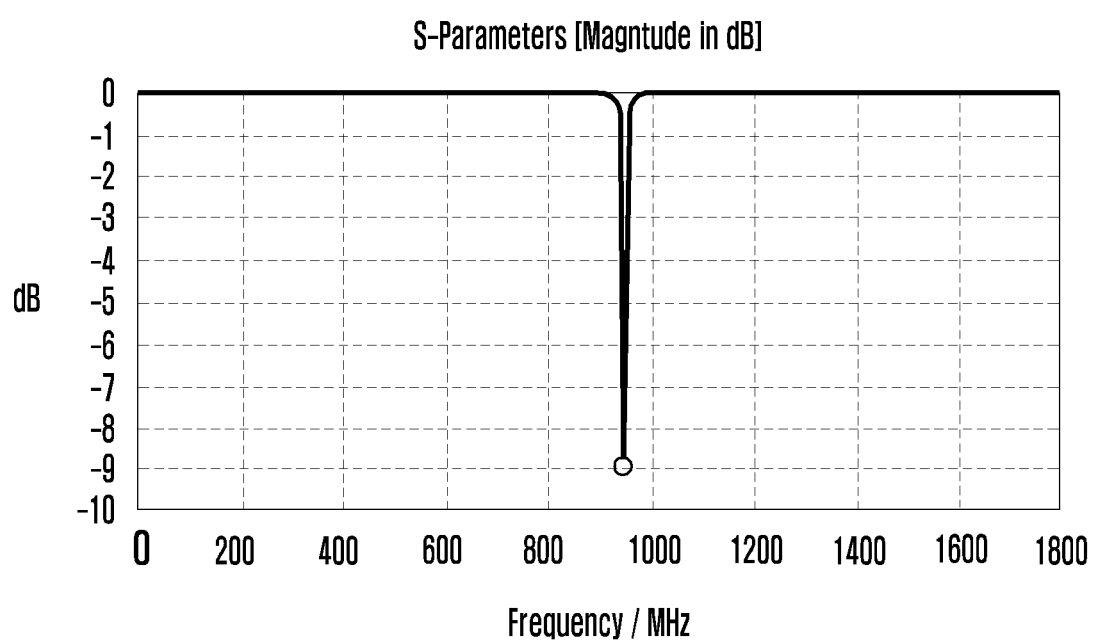
FIG. 12A is a graph illustrating an S parameter of an antenna where a ground path is not implemented between a first conductive plate and a second conductive plate, in the example of FIG. 11 according to various embodiments.
Figure 12B:
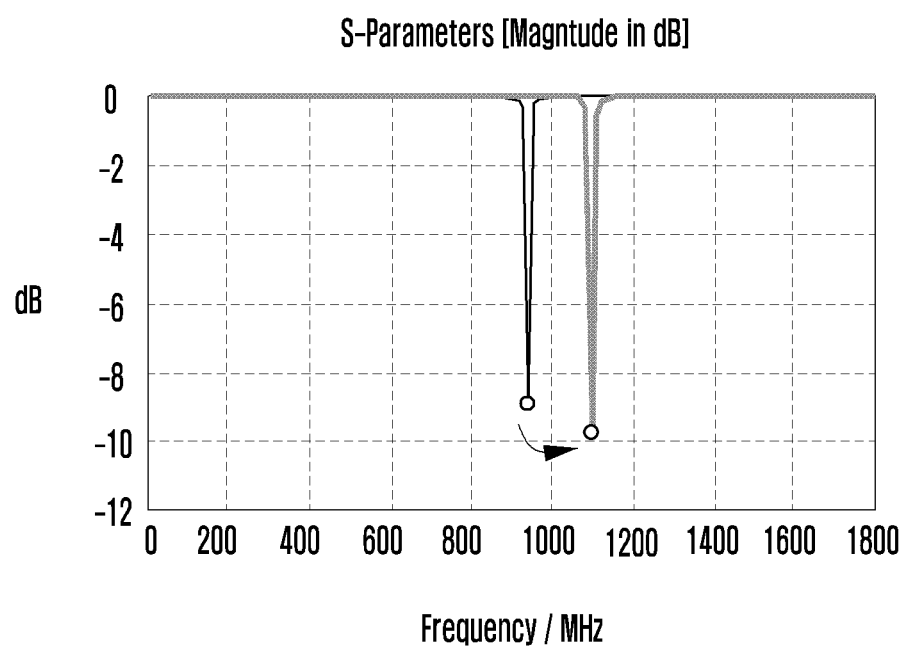
FIG. 12B is a graph illustrating an S parameter of an antenna where one ground path is implemented between a first conductive plate and a second conductive plate, in the example of FIG. 11 according to various embodiments.
Figure 12C:
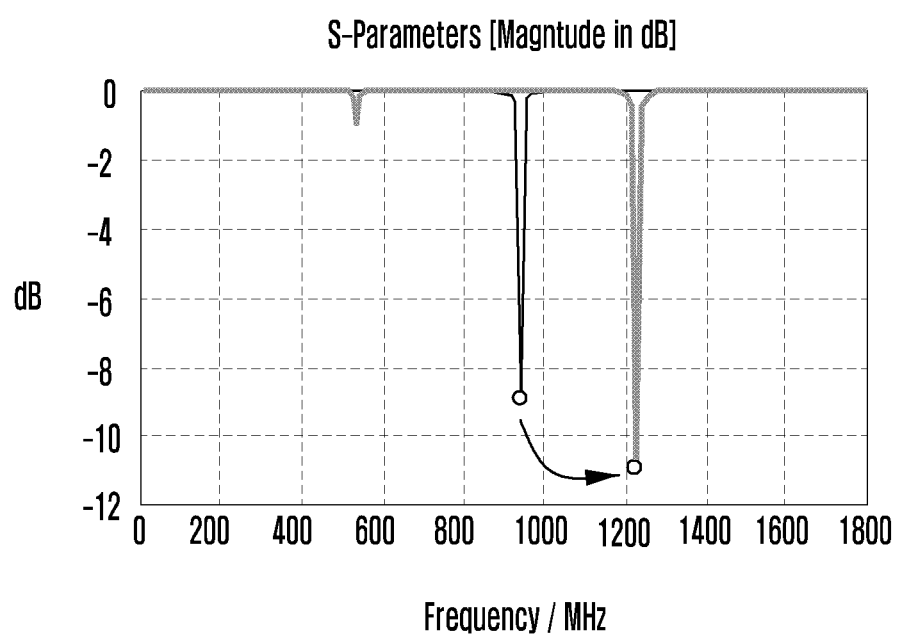
FIG. 12C is a graph showing an S parameter of an antenna where two ground paths are implemented between a first conductive plate and a second conductive plate, in the example of FIG. 11 according to various embodiments.

FIG. 12A is a graph showing an S parameter (e.g., a ratio of input voltage to output voltage on a frequency distribution) of an antenna in a case where a ground path is not implemented between a first conductive plate 1110 and a second conductive plate 1120, in the embodiment of FIG. 11. FIG. 12B is a graph showing an S parameter of an antenna in a case where one ground path 1101 is implemented between a first conductive plate 1110 and a second conductive plate 1120, in the embodiment of FIG. 11. FIG. 12C is a graph showing an S parameter of an antenna in a case where two ground paths 1101 and 1102 are implemented between a first conductive plate 1110 and a second conductive plate 1120, in the embodiment of FIG. 11.

Referring to FIGS. 11, 12A, 12B, and 12C, when at least one ground path 1101 or 1102 is implemented between the first conductive plate 1110 and the second conductive plate 1120, the parasitic resonance frequency may be shifted in comparison with the case where the ground path is not implemented. The shift of a parasitic resonance frequency may be different according to the position or number of a ground path (refer to FIGS. 12B and 12C). The position or number of a ground path may be various. In an embodiment, at least one ground path 1101 or 1102 may control the parasitic resonance frequency such that the parasitic resonance frequency formed in the waveguide structure 1100 is not included in the resonance frequency band of an antenna using at least one antenna radiator. The parasitic resonance frequency formed by the waveguide structure 1100 may be shifted out of the resonance frequency band of an antenna using at least one antenna radiator by the at least one ground path 1101 or 1102 between the first conductive plate 1110 and the second conductive plate 1120, so as to prevent and/or reduce the degradation of an antenna radiation performance due to the parasitic resonance frequency. For example, the parasitic resonance frequency formed in the waveguide structure 1100 may be shifted to a high frequency to be out of the resonance frequency band of an antenna due to the at least one ground path 1101 or 1102. In various embodiments, the parasitic resonance frequency formed in the waveguide structure 1100 may be shifted to a low frequency to be out of the resonance frequency band of an antenna due to the at least one ground path 1101 or 1102.

Figure 13:
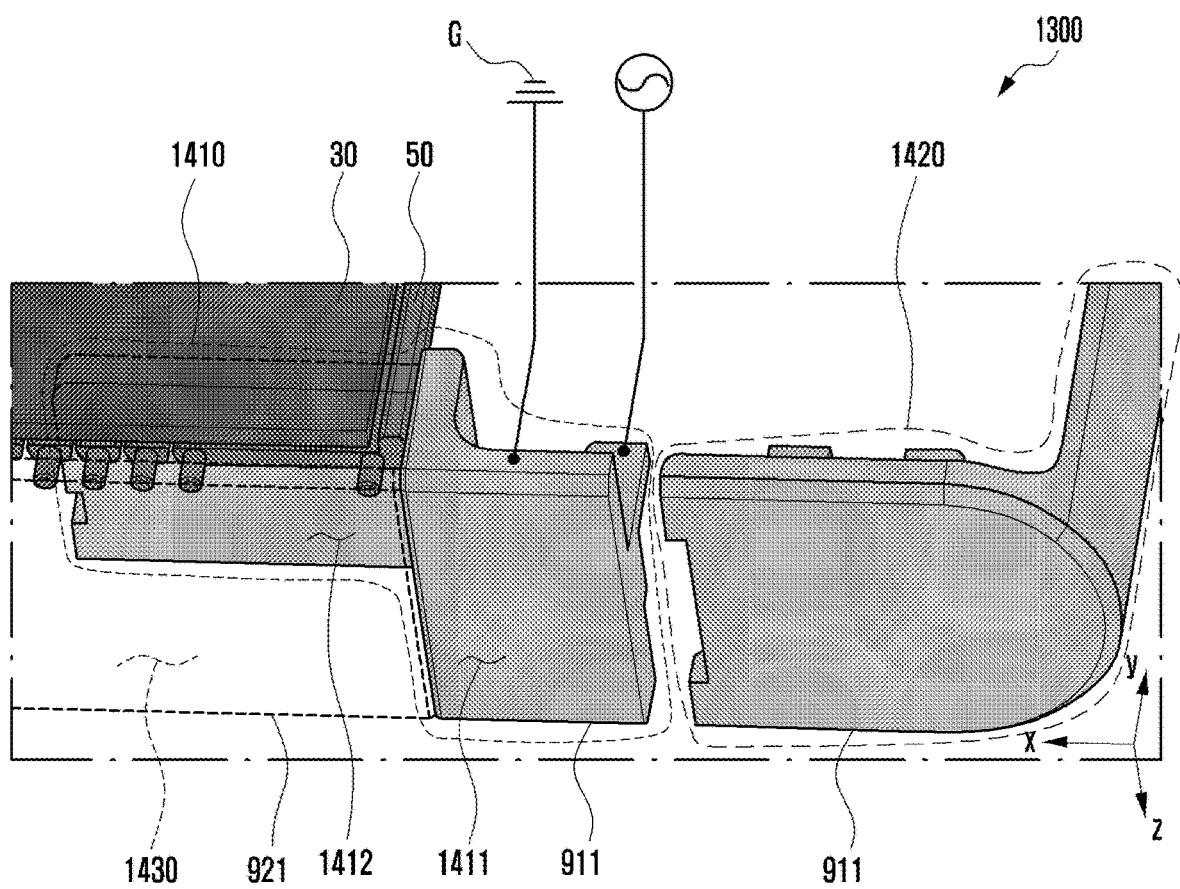
FIG. 13 is a diagram illustrating an example antenna structure included in the electronic device, in the electronic device of FIG. 9 according to various embodiments.
Figure 14:
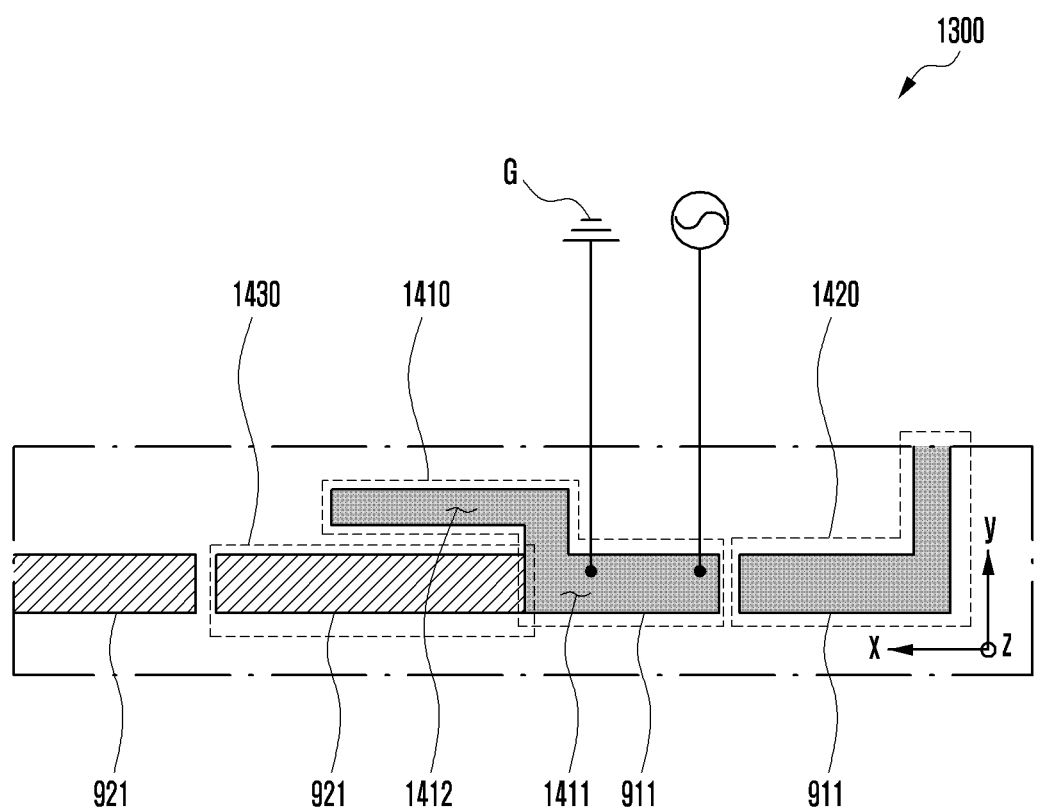
FIG. 14 is a diagram illustrating the antenna structure of FIG. 13 according to various embodiments.

FIG. 13 is a partial perspective view illustrating an antenna structure 1300 included in the electronic device of FIG. 9 according to various embodiments. FIG. 14 is a diagram illustrating an example configuration of the antenna structure 1300 of FIG. 13 according to various embodiments.

Referring to FIGS. 13 and 14, for example, portions of multiple first conductive parts 911 positioned in the first housing part 21 (e.g., the first side cover 212 of FIG. 9) of FIG. 4 may be electrically connected to a wireless communication circuit (e.g., the wireless communication module 192 of FIG. 1) and a ground G, and may operate as an antenna radiator 1410. For example, the ground G may include a ground (e.g., a ground plane) positioned or included in the printed circuit board 43 (refer to FIG. 4). In an embodiment, at least a portion of other first conductive part 911 adjacent to a first conductive part 911 used as an antenna radiator 1410 may be operated as a first coupling conductive pattern 1420 electromagnetically coupled to the antenna radiator 1410. In an embodiment, a portion (e.g., a second conductive pattern 921) of the second housing part 22 (refer to FIG. 4) adjacent to a first conductive part 911 used as an antenna radiator 1410 may be operated as a second coupling conductive pattern 1430 electromagnetically coupled to the antenna radiator 1410. When a wireless communication circuit provides a radiation current to the antenna radiator 1410, in a frequency band selected or designated due to an electromagnetic coupling between the antenna radiator 1410 and at least one coupling conductive pattern 1420 and/or 1430, an electromagnetic field which enables transmission and/or reception of a signal of at least one frequency may be formed. The antenna radiator 1410 may be an element which indirectly provides a radiation current to at least one coupling conductive pattern 1420 and/or 1430, and in various embodiments, may be referred to as a feeding conductive pattern. In an embodiment, the antenna radiator 1410 may include a first portion 1411 forming the exterior of the electronic device 2 and a second portion 1412 extending from the first portion 1411 to the inside of the electronic device 2. The distance between the first portion 1411 and the second coupling conductive pattern 1430 may be changed according to sliding of the first housing part 21. For example, the second portion 1412 may face the second coupling conductive pattern 1430 while being spaced apart therefrom, and the overlapped area between the second portion 1412 and the second coupling conductive pattern 1430 may be changed according to sliding of the second housing part 22. In an embodiment, a spatial position relationship between the antenna radiator 1410 positioned in the first housing part 21 and the second coupling conductive pattern 1430 positioned in the second housing part 22 may be changed according to sliding of the second housing part 22, and thus a frequency adjustment circuit (e.g., a matching circuit) for forming a resonance in at least one selected or designated frequency may be applied to the antenna structure 1300.

For example, the energy emitted from the antenna structure 1300 may affect the waveguide structure 1100 (refer to FIG. 11) including the flexible display 30 and the second housing part 22 (refer to FIG. 4). For example, the first conductive plate 1110 (refer to FIG. 11) of the waveguide structure 1100 may include a conductive part of the flexible display 30, and the second conductive plate 1120 (refer to FIG. 11) of the waveguide structure 1100 may include a conductive part of the second housing part 22, which overlaps the conductive part of the flexible display 30 while being spaced apart therefrom. In an embodiment, in order to reduce an effect in which the waveguide structure 1100 affects an antenna radiation performance of the antenna structure 1300, the conductive portion included in the flexible display 30 and the conductive portion of second housing part 22 may be electrically connected to each other in at least one position so as to form at least one ground path 1101 or 1102 (refer to FIG. 11). In an embodiment, the at least one ground path 1101 or 1102 may control the parasitic resonance frequency such that the parasitic resonance frequency formed by the waveguide structure 1100 is not included in the resonance frequency band of the antenna structure 1300. In various embodiments, the at least one ground path 1101 or 1102 may prevent and/or reduce the waveguide structure 1100 of FIG. 11, which allows a guided wave related to a parasitic resonance to pass therethrough, from being substantially formed.

Figure 15A:
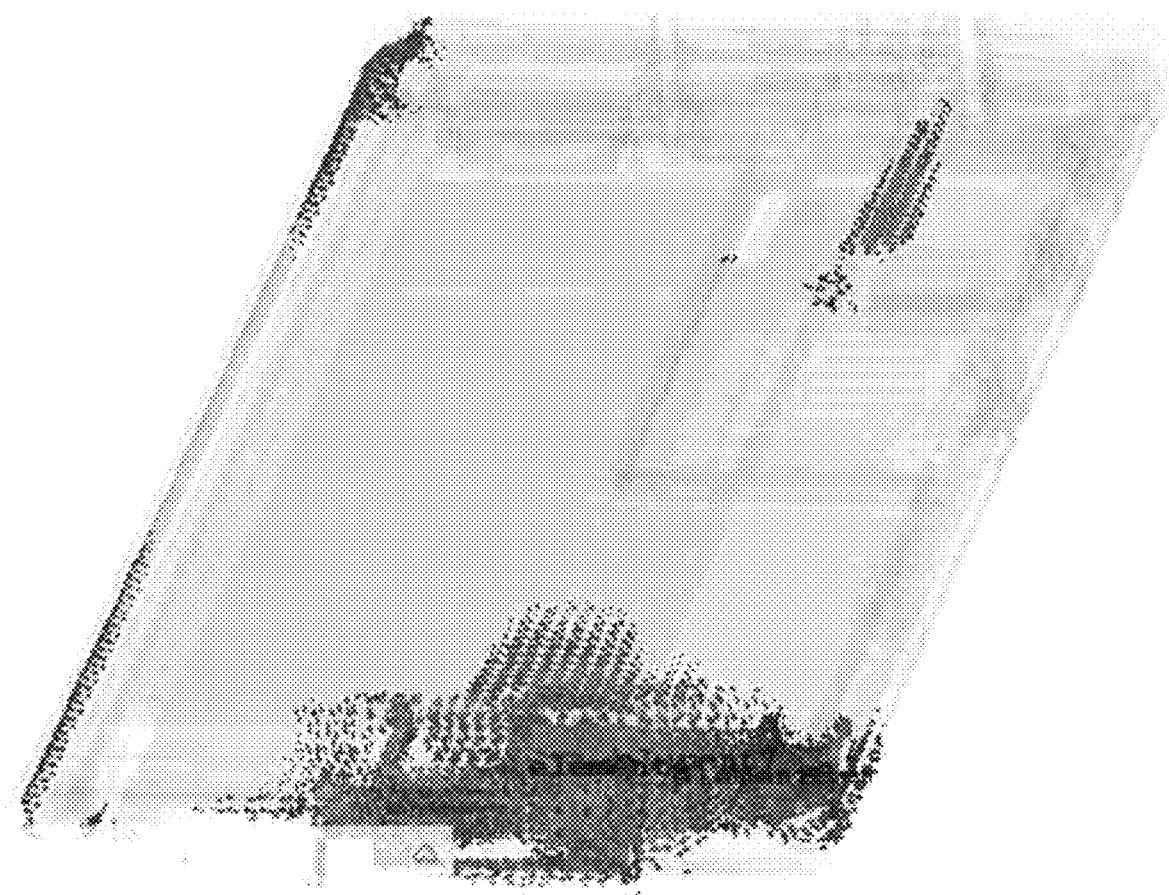
FIG. 15A is a diagram illustrating an example surface current or electric field distribution formed between a flexible display and a second housing part due to the energy emitted from an antenna structure where at least one ground path is implemented according to various embodiments.
Figure 15B:
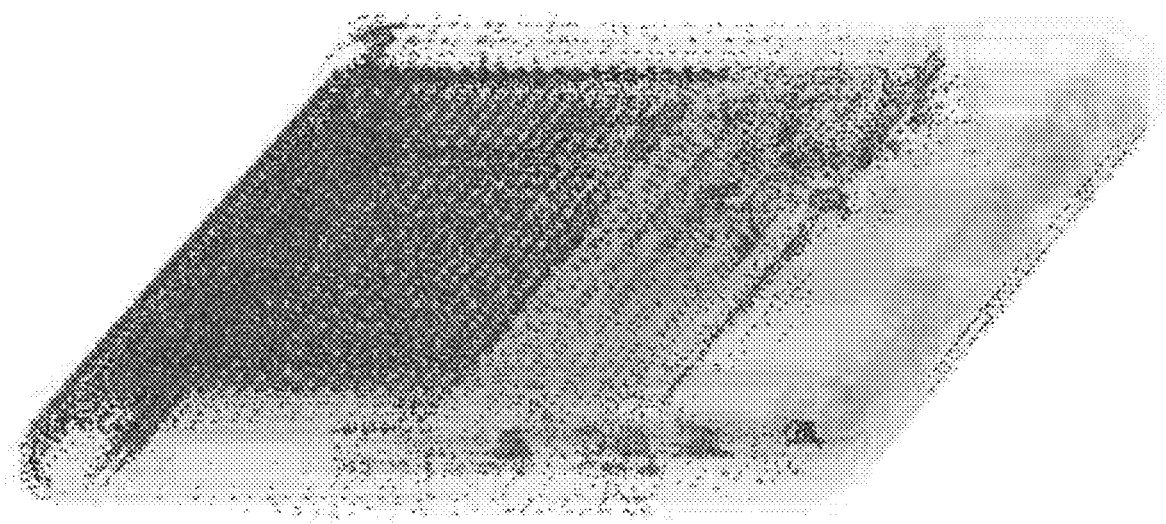
FIG. 15B is a diagram illustrating an example surface current or an electric field distribution formed between a flexible display and a second housing part due to the energy emitted from an antenna structure where at least one ground path is not implemented according to various embodiments.

FIG. 15A is a diagram illustrating a surface current or an electric field distribution formed between a flexible display 30 and a second housing part 22 due to the energy emitted from an antenna structure 1300 where at least one ground path is implemented. FIG. 15B is a diagram illustrating a surface current or an electric field distribution formed between a flexible display 30 and a second housing part 22 due to the energy emitted from an antenna structure 1300 where at least one ground path is not implemented. Referring to FIGS. 15A and 15B, the at least one ground path 1101 or 1102 may reduce a surface current or an electric field between the flexible display 30 and the second housing part 22. The at least one ground path 1101 or 1102 may control the parasitic resonance frequency or reduce the parasitic resonance such that the parasitic resonance frequency formed between the flexible display 30 and the second housing part 22 is not included in the resonance frequency band (e.g., a LB (about 600 MHz-about 1 GHz)) of the antenna structure 1300.

For example, the energy emitted from the antenna structure 1300 may affect the waveguide structure 1100 (refer to FIG. 11) including the flexible display 30 and the display support structure 50. For example, the first conductive plate 1110 (refer to FIG. 11) of the waveguide structure 1100 may include the conductive part of the flexible display 30, and the second conductive plate 1120 (refer to FIG. 11) of the waveguide structure 1100 may include the display support structure 50 overlapping the conductive part of the flexible display 30 while being spaced apart therefrom. In an embodiment, in order to reduce an effect in which the waveguide structure 1100 affects an antenna radiation performance of the antenna structure 1300, the conductive portion included in the flexible display 30 and the display support structure 50 may be electrically connected to each other in at least one position so as to form at least one ground path 1101 or 1102 (refer to FIG. 11). In an embodiment, the at least one ground path 1101 or 1102 may control the parasitic resonance frequency such that the parasitic resonance frequency formed by the waveguide structure 1100 is not included in the resonance frequency band of the antenna structure 1300. In various embodiments, at least one ground path 1101 or 1102 may prevent and/or reduce the waveguide structure 1100 of FIG. 11, which allows a guided wave related to a parasitic resonance to pass therethrough, from being substantially formed.

Figure 16A:
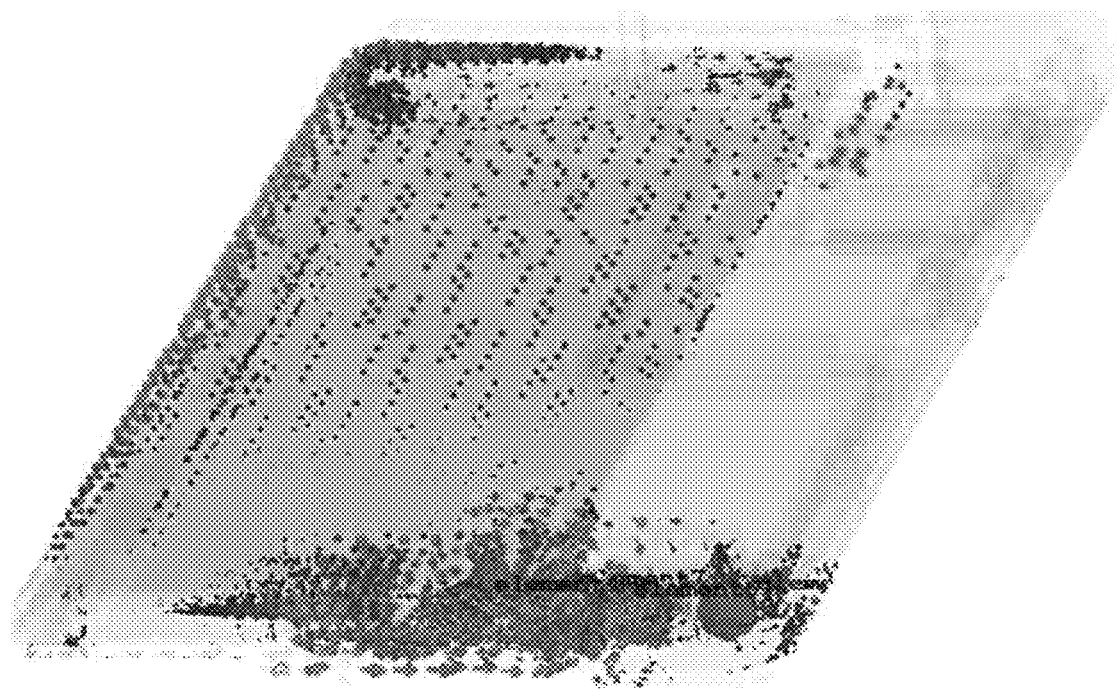
FIG. 16A is a diagram illustrating an example surface current or an electric field distribution formed between a flexible display and a display support structure due to the energy emitted from an antenna structure where at least one ground path is implemented according to various embodiments.
Figure 16B:
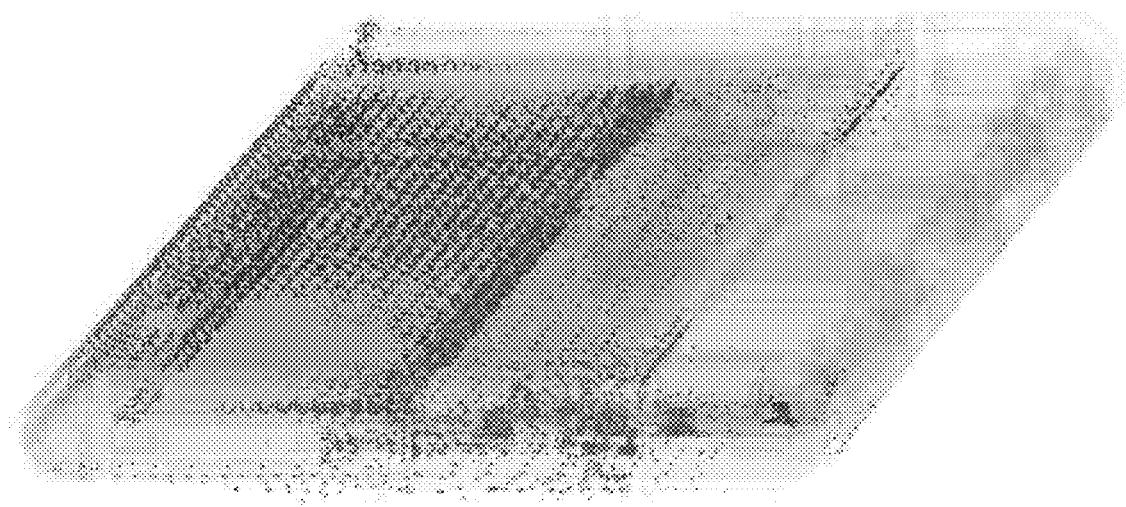
FIG. 16B is a diagram illustrating an example surface current or an electric field distribution formed between a flexible display and a display support structure due to the energy emitted from an antenna structure where at least one ground path is not implemented according to various embodiments.

FIG. 16A is a diagram illustrating a surface current or an electric field distribution formed between a flexible display 30 and a display support structure 50 due to the energy emitted from an antenna structure 1300 where at least one ground path is implemented. FIG. 16B is a diagram illustrating a surface current or an electric field distribution formed between a flexible display 30 and a display support structure 50 due to the energy emitted from an antenna structure 1300 where at least one ground path is not implemented. Referring to FIGS. 16A and 16B, the at least one ground path 1101 or 1102 may reduce a surface current or an electric field between the flexible display 30 and the display support structure 50. The at least one ground path 1101 or 1102 may control the parasitic resonance frequency or reduce the parasitic resonance such that the parasitic resonance frequency formed between the flexible display 30 and the display support structure 50 is not included in the resonance frequency band (e.g., a LB (about 600 MHz-about 1 GHz)) of the antenna structure 1300.

Figure 17:
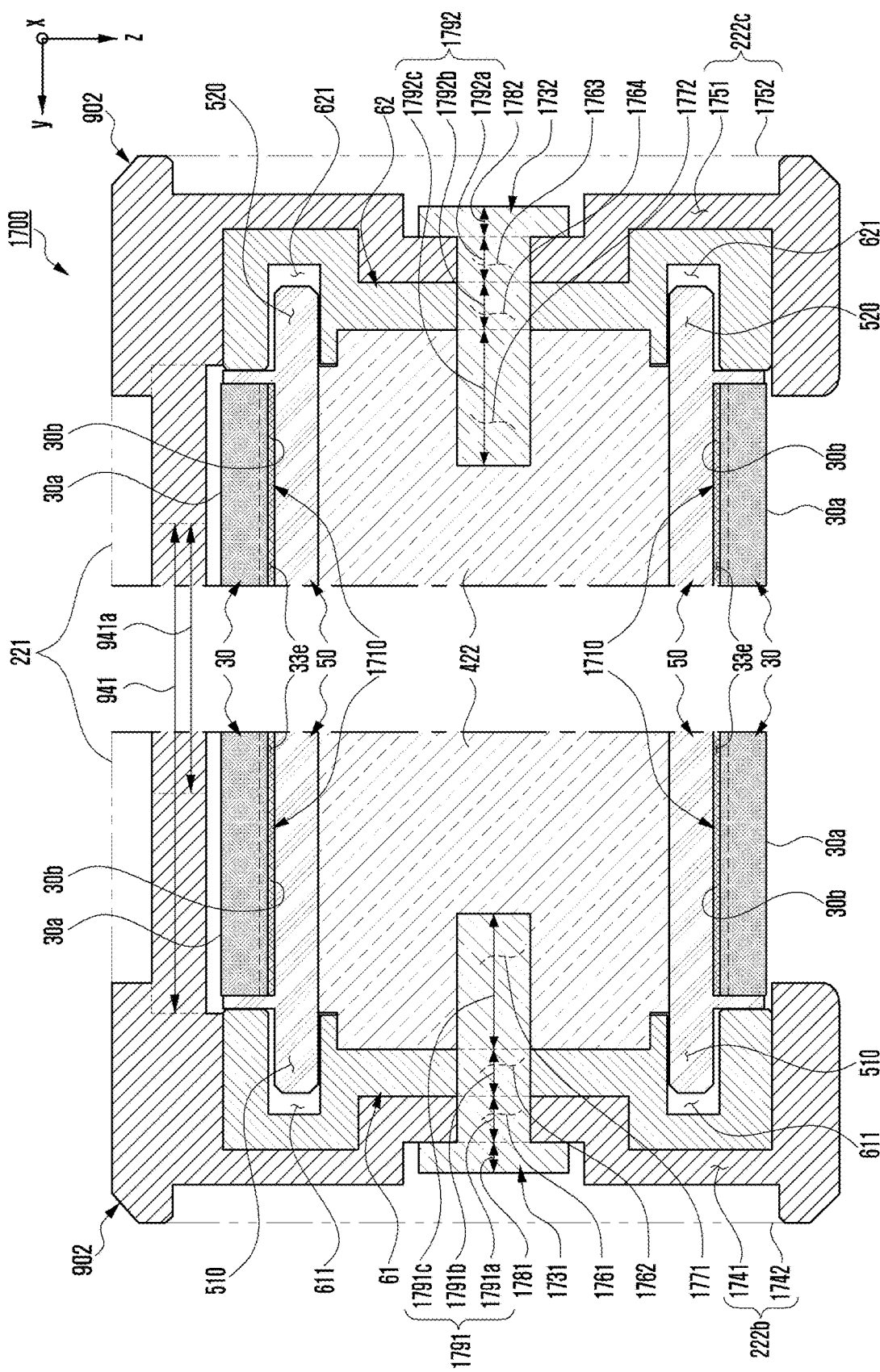
FIG. 17 is a cross sectional view of a portion of the electronic device taken along line E-E' of FIG. 2B according to various embodiments.
Figure 18:
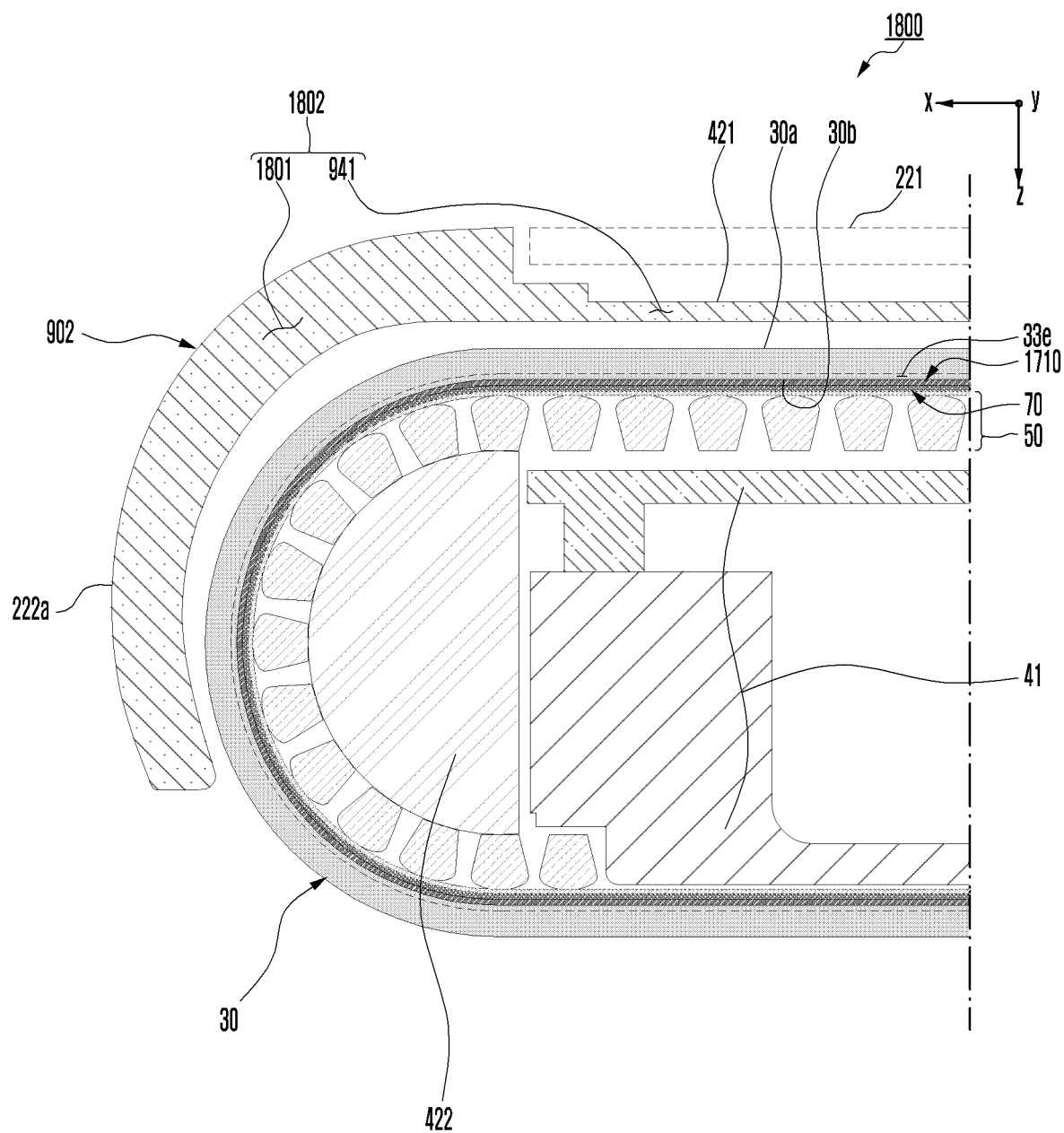
FIG. 18 is a cross-sectional view illustrating a portion of the electronic device taken along line F-F' of FIG. 2B according to various embodiments.
Figure 19:
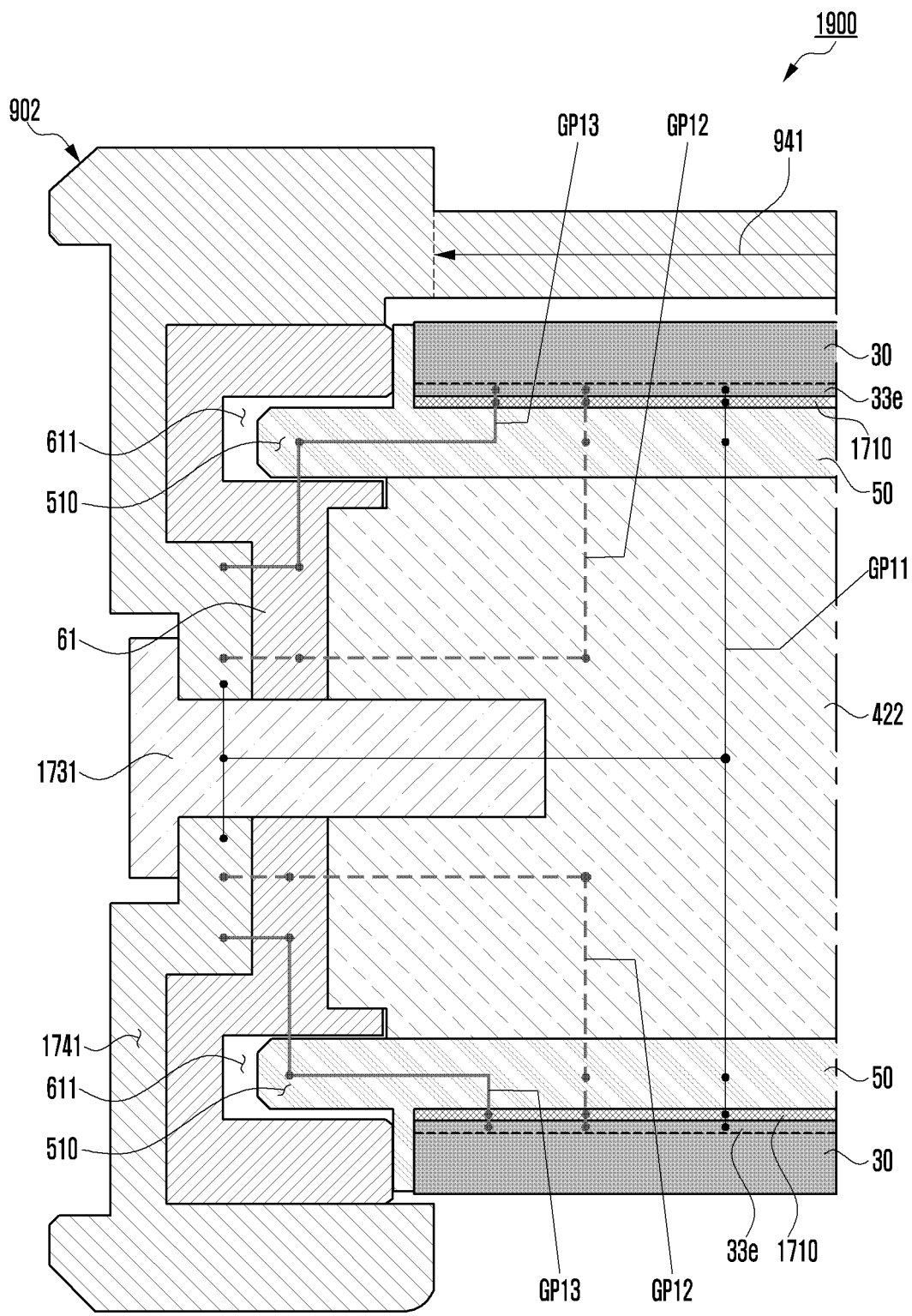
FIG. 19 is a cross sectional view illustrating at least one ground path in connection with the example of FIG. 13 according to various embodiments.

FIG. 17 is a cross sectional view 1700 of a portion of the electronic device 2 taken along line E-E' of FIG. 2B according to various embodiments. FIG. 18 is a cross sectional view 1800 of a portion of the electronic device 2 taken along line F-F' of FIG. 2B according to various embodiments. FIG. 19 is a cross sectional view 1900 illustrating at least one ground path in connection with the embodiment of FIG. 17 according to various embodiments.

Referring to FIGS. 17 and 18, in an embodiment, an electronic device 2 may include a flexible display 30, a display support structure 50, a conductive adhesive member 1710 (or, a conductive adhesive, or the like), a second metal structure 902, a first guide rail structure 61, a second guide rail structure 62, a fourth support member 422, a first bolt 1731 (or a first screw), and/or a second bolt 1732 (or a second screw).

According to an embodiment, the second metal structure 902 may include at least one fourth conductive part 941 included in a third support member 421 facing a second back cover 221. The second metal structure 902 may include a conductive part 1741 included in a second cover part 222b. The second metal structure 902 may include a conductive part 1751 included in a third cover part 222c. The second metal structure 902 may include a conductive part 1801 included in a first cover part 222a. The conductive part 1801 included in the first cover part 222a may be connected to or integrally formed with the fourth conductive part 941 included in the third support member 421, the conductive part 1741 included in a second cover part 222b, and/or the conductive part 1751 included in the third cover part 222c. In an embodiment, the configuration including the conductive part 1801 included in the first cover part 222a and the fourth conductive part 941 included in the third support member 421 may be referred to as a third metal structure 1802. For example, the third metal structure 1802 may be disposed to face a front surface 30a of the flexible display 30. For example, the second cover part 222b may include a non-conductive cover member 1742 coupled to the conductive part 1741 so as to form an outer surface of the electronic device 2. For example, the third cover part 222c may include a non-conductive cover member 1752 coupled to the conductive part 1751 so as to form the outer surface of the electronic device 2.

According to an embodiment, one side part 510 (e.g., one side part of each of the multiple support bars 500 of FIG. 8) of the display support structure 50 may be positioned in or inserted into a first guide rail 611 of the first guide rail structure 61, which is disposed in or coupled to the second cover part 222*b*. The other side part 520 (e.g., the other side part of each of the multiple support bars 500 of FIG. 8) of the display support structure 50 may be positioned in or inserted into a second guide rail 621 of the second guide rail structure 62, which is disposed in or coupled to the third cover part 222*c*. The display support structure 50 may be guided the first guide rail 611 and the second guide rail 621 to move. In an embodiment, when the display support structure 50 moves, the multiple support bars 500 (refer to FIG. 8) included in the display support structure 50 may move while rubbing with the fourth support member 422.

For example, the fourth support member 422 may be positioned between the first guide rail structure 61 and the second guide rail structure 62. In an embodiment, the conductive part 1741 of the second cover part 222*b*, the first guide rail structure 61, and the fourth support member 422 may be coupled using the first bolt 1731. The conductive part 1741 of the second cover part 222*b*, corresponding to the first bolt 1731, may include a first bolt fastening hole 1761. The first guide rail structure 61, corresponding to the first bolt 1731, may include a second bolt fastening hole 1762 aligned with the first bolt fastening hole 1761. The fourth support member 422, corresponding to the first bolt 1731, may include a first bolt fastening groove 1771 aligned with the second bolt fastening hole 1762. The first bolt 1731 may include a first head 1781 and a first shaft 1791 extending from the first head 1781. The first shaft 1791 may include a first portion 1791*a* corresponding to the first bolt fastening hole 1761, a second portion 1791*b* corresponding to the second bolt fastening hole 1762, and/or a third portion 1791*c* corresponding to the first bolt fastening groove 1771. In an embodiment, the third portion 1791*c* of the first shaft 1791 may include male threads capable of being fastened to female threads included in the first bolt fastening groove 1771. In various embodiments, the second portion 1791*b* of the first shaft 1791 may include male threads capable of being fastened to female threads included in the second bolt fastening hole 1762. In various embodiments, the first portion 1791*a* of the first shaft 1791 may include male threads capable of being fastened to female threads included in the first bolt fastening hole 1761. The conductive portion 1751 of the third cover part 222*c*, the second guide rail structure 62, and the fourth support member 422 may be coupled using the second bolt 1732, which is substantially the same as or similar to the manner in which the conductive part 1741 of the second cover part 222*b*, the first guide rail structure 61, and the fourth support member 422 are coupled using the first bolt 1731. The second bolt 1732 may be substantially the same as or similar to the first bolt 1731, and for example, may include a second head 1782 and a second shaft 1792. The second shaft 1792 may include a first portion 1792*a* corresponding to the third bolt fastening hole 1763 included in the conductive portion 1751 of the third cover part 222*c*, a second portion 1792*b* corresponding to the fourth bolt fastening hole 1764 included in the second guide rail structure 62, and a third portion 1792*c* corresponding to the second bolt fastening groove 1772 included in the fourth support member 422.

According to an embodiment, the first cover part 222*a*, the third support member 421, the first guide rail 611, the second guide rail structure 62, the first bolt 1331, the second bolt 1332, or the display support structure 50 may include a conductive member. For example, the display support structure 50, the first guide rail 611, the first bolt 1331, the second metal structure 902, the first cover part 222*a*, or the third support member 421 may be electrically connected to each other. The first cover part 222*a* or the third support member 421 may be integrally formed with or coupled to each other. For example, the first guide rail structure 61, the second rail structure 62, the first bolt 1731, the second bolt 1732, or the display support structure 50 may include a conductive member. For example, the display support structure 50, the first guide rail structure 61, the second rail structure 62, the first bolt 1731, the second bolt 1732, and the third metal structure 1802 may be electrically connected to each other. The conductive portion 1801 included in the first cover part 222*a* of the third metal structure 1802 and the fourth conductive part 941 included in the third support member 421 of the third metal structure 1802 may be integrally formed with or coupled to each other.

According to various embodiments, the fourth support member 422 may be implemented in a rotating member (e.g., the rotating member 1920 of the embodiment of FIG. 19) such as a roller. In the case, the at least one hinge 800 according to the embodiment of FIG. 4 may be omitted. The third portion 1791*c* of the first shaft 1791 included in the first bolt 1731 and the first bolt fastening groove 1771 of the fourth support member 422 may be formed in non-threads. At least one of the first portion 1791*a* and the second portion 1791*b* of the first shaft 1791 may include male threads corresponding to female threads formed in a bolt fastening hole. The third portion 1792*c* of the second shaft 1792 included in the second bolt 1732 and the second bolt fastening groove 1772 of the fourth support member 422 may be formed in non-threads. At least one of the first portion 1792*a* and the second portion 1792*b* of the second shaft 1792 may include male threads corresponding to female threads formed in a bolt fastening hole. The fourth support member 422 implemented in a rotating member may rotate with the third portion 1791*c* of the first shaft 1791 and the third portion 1792*c* of the second shaft 1792 as a rotating shaft thereof.

In an embodiment, when at least a portion (e.g., the multiple conductive parts 921 of FIG. 9) of the second housing part 22 is used as an antenna radiator, for example, at least partially overlapped two among the third metal structure 1802, a conductive sheet 33*e* of the flexible display 30, the display support structure 50, or the metal sheet 70 may form a waveguide structure (e.g., the waveguide structure 1100 of FIG. 11) generating a parasitic resonance. For example, two among the third metal structure 1802, the conductive sheet 33*e* of the flexible display 30, the display support structure 50, or the metal sheet 70, may form a waveguide structure, wherein the two are spaced in a state where a dielectric (e.g., an air layer or an adhesive material) is interposed therebetween, and overlap. In an embodiment, in order to control such that the parasitic resonance frequency generated in a waveguide is not included in an antenna resonance frequency band or in order to prevent and/or reduce a waveguide structure, which allows a guided wave related to a parasitic resonance to pass therethrough, from being substantially formed, at least one ground path (e.g., the ground path 1101 and/or 1102 of FIG. 11) may be formed.

According to an embodiment, the conductive adhesive member 1710 may be positioned between the flexible display 30 and the display support structure 50. The conductive sheet 33*e* included in the flexible display 30 may be electrically connected to the display support structure 50 through the conductive adhesive member 1710. For example, the adhesive sheet 33*e* and the display support structure 50 may be coupled without a substantial gap due to the conductive adhesive member 1710. For example, the conductive adhesive member 1710 may include a heat-reactive conductive adhesive material, a photoreactive conductive adhesive material, a general conductive adhesive material, and/or a conductive double-sided tape. In an embodiment, a ground path (e.g., the at least one ground path 1101 or 1102 of FIG. 11) may be formed by electrically connecting the third metal structure 1802 facing the front surface 30*a* of the flexible display 30 and the conductive sheet 33*e* forming a rear surface 30*b* of the flexible display 30. The conductive adhesive sheet 1710 and the display support structure 50 may be included in the ground path. The conductive sheet 33*e* and the display support structure 50 may be electrically connected by the conductive adhesive member 1710, so as to prevent and/or reduce the waveguide structure 1100 of FIG. 11, which allows a guided wave related to a parasitic resonance to pass therethrough, from being substantially formed. At least one ground path formed by electrically connecting the third metal structure 1802 facing the front surface 30*a* of the flexible display 30 and the conductive sheet 33*e* forming the rear surface 30*b* of the flexible display 30 will be described later with reference to FIG. 19. The ground path may attribute to an antenna radiation performance securing for an antenna (e.g., the antenna structure 1300 of FIG. 13 or 14) using at least one antenna radiator. In an embodiment, the ground path may contribute that the third metal structure 1802 and the conductive sheet 33*e* overlapping the third metal structure 1802 prevent and/or reduce a waveguide structure (e.g., the waveguide structure 1100 of FIG. 11), which allow a guided wave related to the parasitic resonance to pass therethrough, from being substantially formed. In various embodiments, the ground path may contribute such that the parasitic resonance frequency generated in a waveguide structure by the third metal structure 1802 and the conductive sheet 33*e* is not included in the resonance frequency band of an antenna (e.g., the antenna structure 1300 of FIG. 13 or 14) using at least one antenna radiator. For example, the parasitic resonance frequency generated in a waveguide structure by the third metal structure 1802 and the conductive sheet 33*e* may be shifted to be out of the resonance frequency band of an antenna due to the ground path (refer to FIG. 12B or 12C).

According to various embodiments, the metal support sheet 70 may be positioned on the rear surface 30*b* of the flexible display 30. In the case, the conductive adhesive member 1710 may be positioned between the metal support sheet 70 and the display support structure 50. The metal support sheet 70 may be electrically connected to the display support structure 50 through the conductive adhesive member 1710. A conductive adhesive material may be positioned between the conductive sheet 33*e* of the flexible display 30 and the metal support sheet 70, and the conductive sheet 33*e* and the metal support sheet 70 may be electrically connected to each other. The conductive adhesive member 1710, the metal support sheet 70, and the display support structure 50 may be included in a ground path (e.g., the at least one ground path 1101 or 1102 of FIG. 11) for connecting the third metal structure 1802 and the conductive sheet 33*e*. The conductive sheet 33*e* and the metal support sheet 70 may be electrically connected by a conductive adhesive material, so as to prevent and/or reduce the waveguide structure 1100 of FIG. 11, which allows a guided wave related to a parasitic resonance to pass therethrough, from being substantially formed. The metal support sheet 70 and the display support structure 50 may be electrically connected by the conductive adhesive member 1710, so as to prevent and/or reduce the waveguide structure 1100 of FIG. 11, which allows a guided wave related to a parasitic resonance to pass therethrough, from being substantially formed.

According to an embodiment, the first conductive plate 1110 of FIG. 11 may include at least a part of the conductive sheet 33*e* included in the flexible display 30, the display support structure 50, or the metal support sheet 70. The second conductive plate 1120 of FIG. 11 may include the third metal structure 1802 facing the front surface 30*a* of the flexible display 30 or overlapping the conductive sheet 33*e*. In various embodiments, the second conductive plate 1120 of FIG. 11 may include the second back cover 221 including a conductive material. The flexible display 30 may include the front surface 30*a* formed by the transparent cover 35 of FIG. 4 and the rear surface 30*b* formed by the conductive sheet 33*e*. Referring to FIGS. 4, 5, and 6, for example, in a state where the electronic device 2 is closed, a portion of a second area ② of the flexible display 30 may be positioned in the inner space of the electronic device 2, and a portion, which is included in the second area ②, of the front surface 30*a* of the flexible display 30 may face the third metal structure 1802. For example, in a state where the electronic device 2 is closed, a portion of a second area ② of the flexible display 30 may be positioned in the inner space of the electronic device 2, and a portion, which is included in the second area ②, of the front surface 30*a* of the flexible display 30 may face the first cover part 222*a* of the third metal structure 1802. In various embodiments, in a state where the electronic device 2 is open, it may be implemented such that the second area ② of the flexible display 30 does not substantially face the first cover part 222*a* of the third metal structure 1802.

According to an embodiment, a ground path formed by electrically connecting the conductive sheet 33*e* and the third metal structure 1802 may include the conductive part 1741 of the second cover part 222*b* connected to the third metal structure 1802 and/or the conductive part 1751 of the third cover part 222*c* connected to the third metal structure 1802. Hereinafter, a ground path formed by electrically connecting the conductive sheet 33*e* and the third metal structure 1802 may be understood as a ground path formed by electrically connecting the conductive sheet 33*e* and the second metal structure 902. Referring to FIG. 19, for example, at least one ground path formed by electrically connecting the conductive sheet 33*e* and the second metal structure 902 may include a first ground path GP11, a second ground path GP12, and/or a third ground path GP13. The conductive sheet 33*e* may be electrically connected to the conductive part 1741 of the second cover part 222*b* (refer to FIG. 17) through the first ground path GP11, the second ground path GP12, or the third ground path GP13.

According to an embodiment, the first ground path GP11 may include a current flow between the conductive sheet 33*e* and the conductive adhesive member 1710, a current flow between the conductive adhesive member 1710 and the display support structure 50, a current flow between the display support structure 50 and the fourth support member 422, a current flow between the fourth support member 422 and the first bolt 1731, and a current flow between the first bolt 1731 and/or the second metal structure 902. In an embodiment, the first guide rail structure 61 may be formed of a non-conductive material such as polymer. In various embodiments, the first guide rail structure 61 may include a non-conductive surface coated with a non-conductive material, and the inside of the first guide rail structure 61 may include a conductive material. In an embodiment, the first guide rail structure 61 and the second metal structure 902 may be integrally formed with each other. In various embodiments, when the first guide rail structure 61 includes a conductive material, the first guide rail structure 61 may be electrically connected to the display support structure 50 and/or the first bolt 1331.

According to an embodiment, the second ground path GP12 may include a current flow between the conductive sheet 33*e* and the conductive adhesive member 1710, a current flow between the conductive adhesive member 1710 and the display support structure 50, a current flow between the display support structure 50 and the fourth support member 422, a current flow between the fourth support member 422 and the first guide rail structure 61, and/or a current flow between the first guide rail structure 61 and the second metal structure 902. In various embodiments, a conductive adhesive material (e.g., a conductive double-sided tape) or a flexible conductive member (e.g., a C clip (a C shaped conductive member), pogo pin, spring, conductive phorone, conductive rubber, conductive tape, or a conductive connector) may be positioned between the fourth support member 422 and the first guide rail structure 61. In an embodiment, a conductive adhesive material or a flexible conductive member may be positioned between the first guide rail structure 61 and the second metal structure 902. In various embodiments, a conductive adhesive material may be positioned between the fourth support member 422 and the first guide rail structure 61 and between the first guide rail structure 61 and the second metal structure 902, and in the case, the fastening structure using the first bolt 1731 may be omitted. In an embodiment, the first guide rail structure 61 and the second metal structure 902 may be integrally formed with each other.

According to an embodiment, the third ground path GP13 may include a current flow between the conductive sheet 33*e* and the conductive adhesive member 1710, a current flow between the conductive adhesive member 1710 and the display support structure 50, a current flow between the display support structure 50 and the first guide rail structure 61, and a current flow between the first guide rail structure 61 and the second metal structure 902. In various embodiments, a conductive lubricant may be positioned between one side part 510 of the display support structure 50 positioned in or inserted into the first guide rail 611 and the first guide rail 611. In various embodiments, a rotating member such as a roller may be positioned at one side part 510 of the display support structure 50 positioned in or inserted into the first guide rail 611. The rotating member may reduce a frictional force between one side part 510 the display support structure 50 and the first guide rail 611 while maintaining a physical contact therebetween. In various embodiments, a conductive adhesive material or a flexible conductive member may be positioned between the first guide rail structure 61 and the second metal structure 902. In an embodiment, the first guide rail structure 61 and the second metal structure 902 may be integrally formed with each other.

According to various embodiments, when the first ground path GP11 or the second ground path GP12 is formed, the fourth support member 422 may include a conductive surface coated with a conductive material, and the inside of the fourth support member 422 may include a non-conductive material. The ground paths GP11, GP12, and GP13 illustrated in FIG. 19 show an electrical flow between elements in order to help the understanding of the embodiment, and it may be understood that the disclosure has a current flow structure according to a change or modification of elements. When the first ground path GP11 or the second ground path GP12 is formed, at least a portion of the first guide rail structure 61 may include a non-conductive material. For example, the first guide rail 611 may be formed of a non-conductive material.

According to various embodiments, when the first ground path GP11 or the second ground path GP12 is formed, one portion of the fourth support member 422 may include a conductive material for electrically connecting the display support structure 50 and the first bolt 1331, and the other portion of the fourth support member 422 may include a non-conductive material.

According to various embodiments, when the second ground path GP12 is formed, one portion of the first guide rail structure 61 may include a conductive material for electrically connecting the fourth support member 422 and the second metal structure 902, and the other portion of the first guide rail structure 61 may include a non-conductive material.

According to various embodiments, when the third ground path GP13 is formed, one portion of the first guide rail structure 61 may include a conductive material for electrically connecting the display support structure 50 and the second metal structure 902, and the other portion of the first guide rail structure 61 may include a non-conductive material.

According to an embodiment, the conductive sheet 33*e* may be electrically connected to the conductive part 1751 of the third cover part 222*c* through at least one ground path. For example, at least one ground path between the conductive sheet 33*e* and the conductive part 1751 of the third cover part 222*c* may be implemented in substantially the same or similar manner as at least one ground path (e.g., the first ground path GP11) between the conductive sheet 33*e* and the conductive part 1341 of the second cover part 222*b*, the second ground path GP12, or the third ground path GP13.

According to various embodiments, referring to FIGS. 4, 5, and 6, a conductive adhesive member may be positioned between the first area ① of the flexible display 30 and the second support member 412 of the first support structure 41. The conductive sheet 33*e* included in the flexible display 30 may be electrically connected to at least one third conductive part 931 (refer to FIG. 9 or FIG. 10) included in the second support member 412 through a conductive adhesive member. Therefore, the conductive sheet 33*e* and the at least one third conductive part 931 may prevent and/or reduce the waveguide structure 1100 of FIG. 11, which allows a guided wave related to a parasitic resonance to pass therethrough, from being substantially formed, and thus can secure an antenna radiation performance of an antenna (e.g., the antenna structure 1300 of FIG. 13 or 14) using at least one antenna radiator. For example, a conductive adhesive member between the conductive sheet 33*e* and the second support member 412 may include a heat-reactive conductive adhesive material, a photoreactive conductive adhesive material, a general conductive adhesive material, and/or a conductive double-sided tape.

In various embodiments, when the metal support sheet 70 (refer to FIG. 18) is positioned on the rear surface 30*b* of the flexible display 30, a conductive adhesive member may be positioned between the metal support sheet 70 and the second support member 412. The metal support sheet 70 may be electrically connected to at least one third conductive part 931 (refer to FIG. 9 or 10) included the second support member 412 through a conductive adhesive member. Therefore, the metal support sheet 70 and the at least one third conductive part 931 may prevent and/or reduce the waveguide structure 1100 of FIG. 11, which allows a guided wave related to a parasitic resonance to pass therethrough, from being substantially formed, and thus can secure an antenna radiation performance of an antenna (e.g., the antenna structure 1300 of FIG. 13 or 14) using at least one antenna radiator. In various embodiments, the metal support sheet 70 may be disposed not to substantially overlap at least one third conductive part 931 included in the second support member 412.

According to various embodiments, at least a portion of the second metal structure 902 overlapping the conductive sheet 33*e* may include at least one opening. For example, the at least one fourth conductive part 941 may include an opening 941*a* (refer to FIGS. 9 and 17). The parasitic resonance frequency caused by the waveguide structure 1100 of FIG. 11, which includes the conductive sheet 33*e* and at least a portion of the second metal structure 902 overlapping therewith, may be shifted to a low frequency so as to be out of the resonance frequency band of an antenna due to at least one ground path (e.g., the first ground path GP11 of FIG. 19, the second ground path GP12, or the third ground path GP13) and the opening 941*a*. In various embodiments, a non-conductive material (e.g., the at least one fourth non-conductive part 942 of FIG. 9) may be positioned in at least one opening formed through at least a portion of the second metal structure 902 overlapping the conductive sheet 33*e*.

Figure 20:
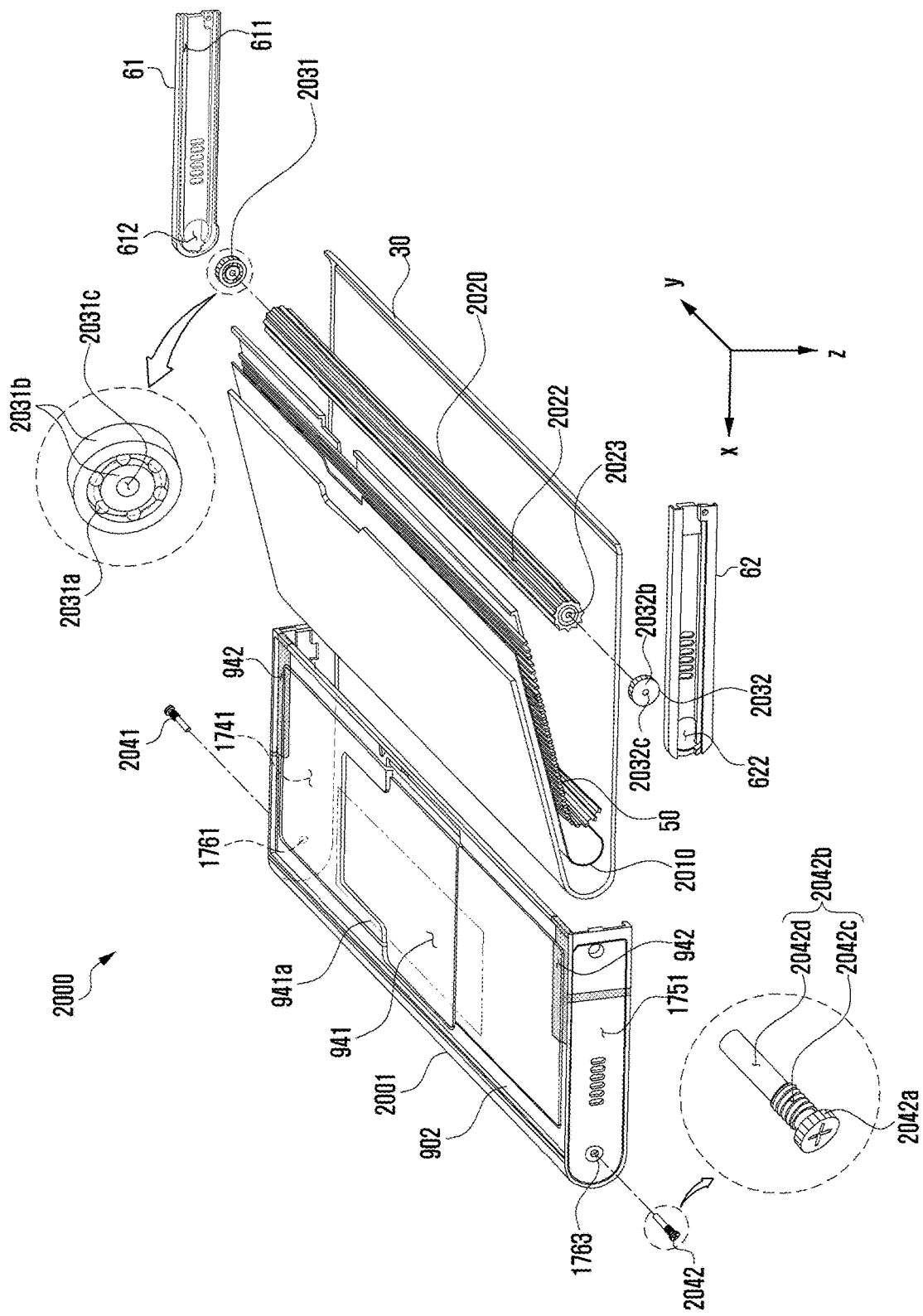
FIG. 20 is an exploded perspective view of a portion of the electronic device of FIG. 2A according to various embodiments.
Figure 21:
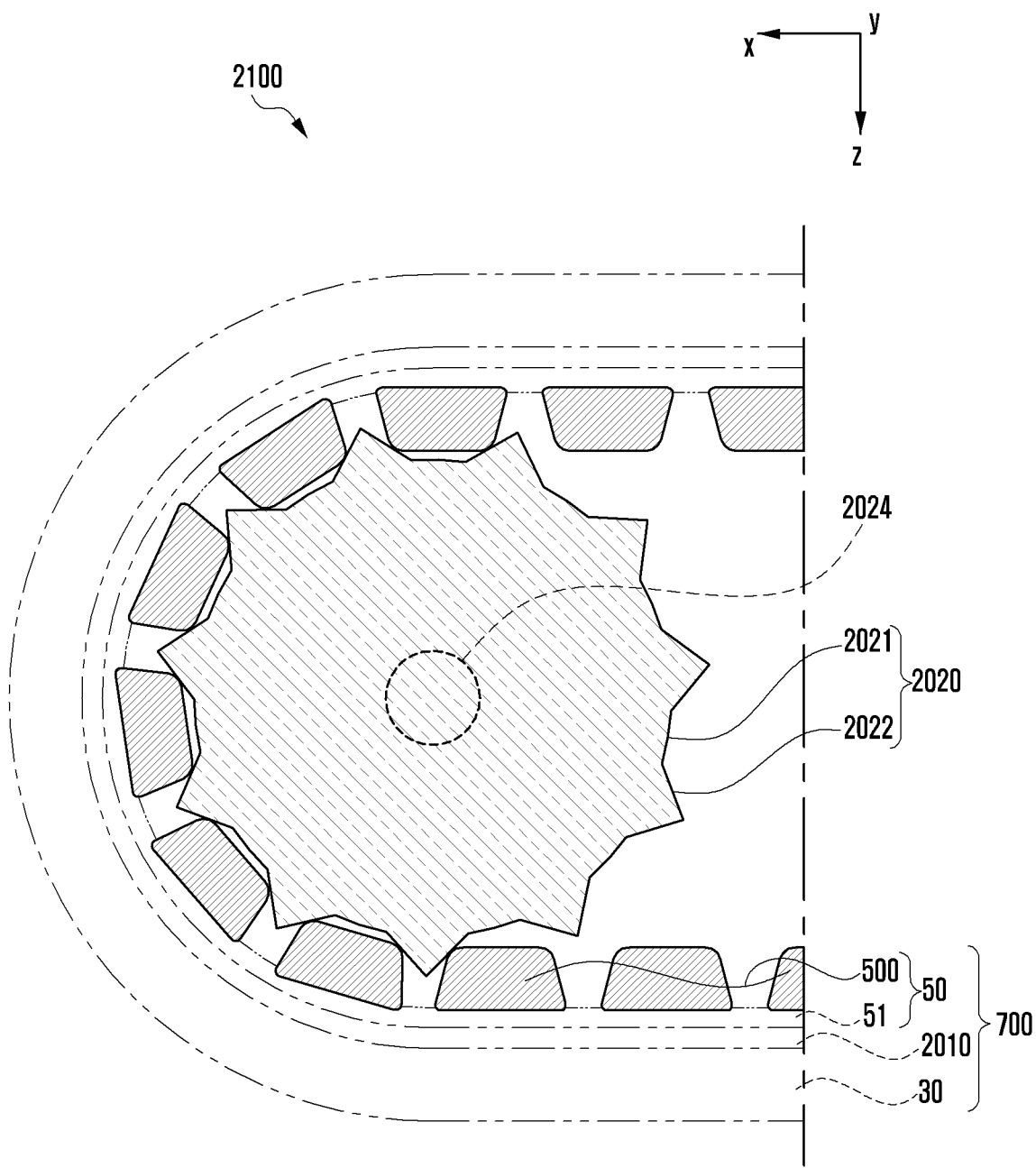
FIG. 21 is a cross sectional view of a portion of the electronic device taken along line F-F' of FIG. 2B in connection with the example of FIG. 20 according to various embodiments.
Figure 22:
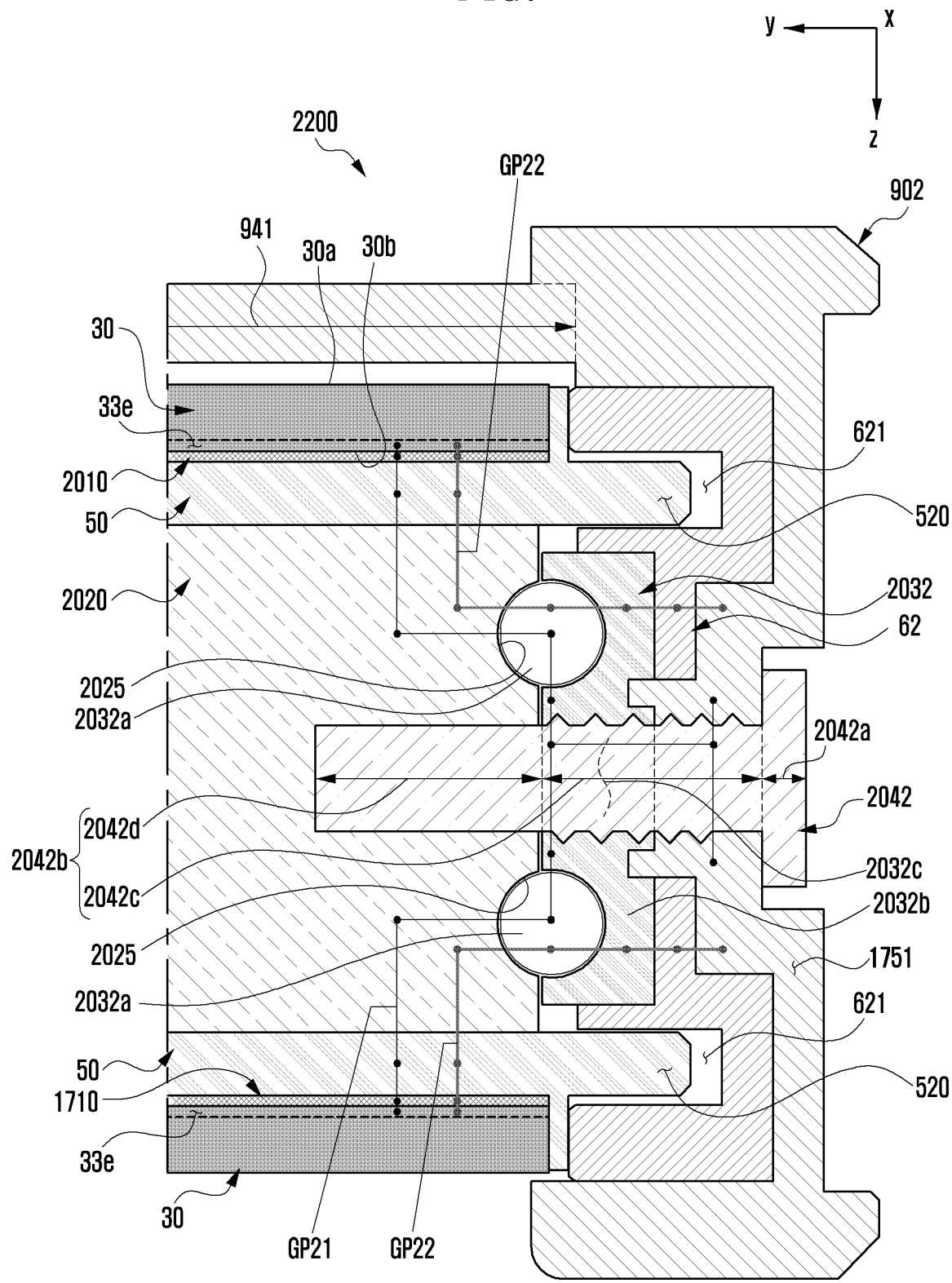
FIG. 22 is a cross sectional view of a portion of the electronic device taken along line E-E' of FIG. 2B in connection with the example of FIG. 20 according to various embodiments.

FIG. 20 is an exploded perspective view of a portion 1500 of the electronic device 2 of FIG. 2A according to various embodiments. FIG. 21 is a cross sectional view 2100 of a portion of the electronic device 2 taken along line F-F' of FIG. 2B in connection with the embodiment of FIG. 20 according to various embodiments. FIG. 22 is a cross sectional view 2200 of a portion of the electronic device 2 taken along line E-E' of FIG. 2B in connection with the embodiment of FIG. 20 according to various embodiments.

Referring to FIGS. 20, 21, and 22, an electronic device 2 may include a flexible display 30, a display support structure 50, a conductive adhesive member 2010, a first case 2001, a first guide rail structure 61, a second guide rail structure 62, a rotating member 2020, a first rotation support member 2031, a second rotation support member 2032, a first bolt 2041, and/or a second bolt 2042. The first case 2001 may include a second metal structure 902 and/or a fourth non-conductive part 942.

For example, the rotating member 2020 may be a rotatable curved-surface member (e.g., a roller) replaceable for the fourth support member 422 of FIG. 4, and in the case, the at least one hinge 800 of FIG. 4 may be omitted. The first bolt 2041 (e.g., the first bolt 1731 of FIG. 17) may be positioned in a first bolt fastening hole 1761 included in a conductive part 1741 of a second cover part 222*b* (refer to FIG. 17), and may become one side rotating shaft of the rotating member 2020. The second bolt 2042 (e.g., the second bolt 1732 of FIG. 17) may be positioned in a third bolt fastening hole 1763 included in a conductive part 1751 of the second cover part 222*c*, and may become the other side rotating shaft of the rotating member 2020. For example, the second bolt 2042 may include a head 2042*a* and a shaft 2042*b* extending from the head 2042*a*. For example, the shaft 2042*b* may include male threads 2042*c* and non-threads 2042*d*. The first bolt 2041 may be substantially the same as or similar to the second bolt 2042. Non-threads of a shaft included in the first bolt 2041 may be inserted in a groove formed on one side of the rotating member 2020, and the non-threads 2042*c* of the shaft 2042*b* included in the second bolt 2042 may be inserted in a groove 2023 formed on the other side of the rotating member 2020. The rotating member 2020 may rotate with the shaft of the first bolt 2041 and the shaft 2042*b* of the second bolt 2042 as a rotating shaft thereof.

According to an embodiment, the rotating member 2020 may include a circular gear or round gear. For example, the circular gear may include a rotating body 2021 having a circular cylindrical shape and gear teeth 2020 arranged along the circumference of the rotating body 2021. The display support structure 50 may have a gear structure capable of engaging with a round gear by a first layer 51 and multiple support bars 500. Due to an engaged state (or a drivingly connected state) between the rotating member 2020 (or a round gear) and the display support structure 50, a movement or force applied thereto can be transferred between a display assembly 700 and the rotating member 2020. In a state change (e.g., a change between a closed state and an open state) of the electronic device 2, the display support structure 50 may be guided by a first guide rail 611 and a second guide rail 621 and move, and the rotating member 2020, on the basis of the friction with the display assembly 700, may rotate with reference to the rotating shaft 2024 (e.g., the shaft of the first bolt 2041 and the shaft 2042*b* of the second bolt 2042).

According to an embodiment, the first rotation support member 2031 may be positioned on or coupled to the first guide rail structure 61 in between the rotating member 2020 and the first guide rail structure 61. The second rotation support member 2032 may be positioned on or coupled to the second guide rail structure 62 in between the rotating member 2020 and the second guide rail structure 62. The rotating member 2020 may be rotate while rubbing with the first rotation support member 2031 and the second rotation support member 2032 in between the first rotation support member 2031 and the second rotation support member 2032. The first rotation support member 2031 and the second rotation support member 2032 may include a rolling member (e.g., at least one rolling elements 2031*a*) capable of reducing a frictional force with the rotating member 2020.

According to an embodiment, the first rotation support member 2031 may include one or more rolling elements 2031*a* (e.g., balls) and a rolling element support part 2031*b*. The one or more rolling elements 2031*a* (or rotating members) may be rotatably positioned in the rolling element support member 2031*b*. For example, the one or more rolling elements 2031*b* may be multiple rolling elements, and may be arranged in a circle with reference to a rotating shaft of the rotating member 2020. The one or more rolling elements 2031*a* included in the first rotation support member 2031 may rotate on the rolling element support part 2031*b* while rubbing with one side surface of the rotating member 2020. The second rotation support member 2032 may be substantially the same as or similar to the first rotation support member 2031. For example, the second rotation support member 2032 may include one or more rolling elements 2032*a* and a rolling element support part 2032*b*. The one or more rolling elements 2032*a* included in the second rotation support member 2032 may rotate on the rolling element support part 2032*b* while rubbing with the other side surface of the rotating member 2020. In various embodiments, the first rotation support member 2031 or the second rotation support member 2032 may be referred to as a bearing. The first rotation support member 2031 or the second rotation support member 2032 may be implemented in various other types including a rolling member (or a rolling friction member) rotatable while rubbing with the rotating member 2020.

According to an embodiment, the rolling element support part 2031b of the first rotation support member 2031 may include a bolt fastening hole 2031c having female threads capable of fastening with the male threads of the shaft included in the first bolt 2041. The rolling element support part 2032b of the second rotation support member 2032 may include a bolt fastening hole 2032c having female threads capable of fastening with the male threads 2042c of the shaft 2042b included in the second bolt 2042.

According to an embodiment, the first bolt fastening hole 1761 included in the second metal structure 902 may be aligned with the bolt fastening hole 2031c of the first rotation support member 2031, and may include female threads capable of fastening with male threads of a shaft included in the first bolt 2041. The first guide rail structure 61 may include an opening 612 corresponding to the first bolt fastening hole 1761 of the second metal structure 902 and the bolt fastening hole 2031c of the first rotation support member 2031. The first rotation support member 2031 and the conductive part 1741 of the second metal structure 902 may be coupled to each other by fastening with the first bolt 2041. The third bolt fastening hole 1763 included in the second metal structure 902 may be aligned with the bolt fastening hole 2032c of the second rotation support member 2032, and may include female threads capable of fastening with the male threads 2042c of the shaft 2042b included in the second bolt 2042. The second guide rail structure 62 may include an opening 622 corresponding to the third bolt fastening hole 1763 of the second metal structure 902 and the bolt fastening hole 2032c of the second rotation support member 2032. The second rotation support member 2032 and the conductive part 1751 of the second metal structure 902 may be coupled to each other by fastening with the second bolt 2042.

According to an embodiment, the conductive adhesive member 2010 (e.g., the conductive adhesive member 1710 of FIG. 17) may be positioned between the flexible display 30 and the display support structure 50. The conductive sheet 33e included in the flexible display 30 may be electrically connected to the display support structure 50 through the conductive adhesive member 2010. In an embodiment, a ground path (e.g., the at least one ground path 1101 or 1102 of FIG. 11) may be formed by electrically connecting the third metal structure 1802 (refer to FIG. 18) facing the front surface 30a of the flexible display 30 and the conductive sheet 33e forming a rear surface 30b of the flexible display 30. The conductive adhesive member 2010 and the display support structure 50 may be included in the ground path. The conductive sheet 33e and the display support structure 50 may be electrically connected by the conductive adhesive member 2010, so as to prevent and/or reduce the waveguide structure 1100 of FIG. 11, which allows a guided wave related to a parasitic resonance to pass therethrough, from being substantially formed. The ground path may attribute to an antenna radiation performance securing for an antenna (e.g., the antenna structure 1300 of FIG. 13 or 14) using at least one antenna radiator. In an embodiment, the ground path may contribute that the third metal structure 1802 (refer to FIG. 18) and the conductive sheet 33e overlapping the third metal structure 1802 prevent and/or reduce a waveguide structure (e.g., the waveguide structure 1100 of FIG. 11), which allows a guided wave related to the parasitic resonance to pass therethrough, from being substantially formed. In various embodiments, the ground path may contribute such that the parasitic resonance frequency generated in a waveguide structure by the third metal structure 1802 (refer to FIG. 18) and the conductive sheet 33e is not included in the resonance frequency band of an antenna (e.g., the antenna structure 1300 of FIG. 13 or 14) using at least one antenna radiator. For example, the parasitic resonance frequency generated in a waveguide structure by the third metal structure 1802 (refer to FIG. 18) and the conductive sheet 33e may be shifted to be out of the resonance frequency band of an antenna due to the ground path (refer to FIG. 12B or 12C).

According to various embodiments, the metal support sheet 70 (refer to FIG. 4, 7, or 18) may be positioned on the rear surface 30b of the flexible display 30. In the case, the conductive adhesive member 2010 may be positioned between the metal support sheet 70 and the display support structure 50. The metal support sheet 70 may be electrically connected to the display support structure 50 through the conductive adhesive member 2010. A conductive adhesive material may be positioned between the conductive sheet 33e of the flexible display 30 and the metal support sheet 70, and the conductive sheet 33e and the metal support sheet 70 may be electrically connected to each other. The conductive adhesive member 2010, the metal support sheet 70, and the display support structure 50 may be included in a ground path (e.g., the at least one ground path 1101 or 1102 of FIG. 11) for electrically connecting the third metal structure 1802 (refer to FIG. 18) and the conductive sheet 33e. The conductive sheet 33e and the metal support sheet 70 may be electrically connected by a conductive adhesive material, so as to prevent and/or reduce the waveguide structure 1100 of FIG. 11, which allows a guided wave related to a parasitic resonance to pass therethrough, from being substantially formed. The metal support sheet 70 and the display support structure 50 may be electrically connected by the conductive adhesive member 2010, so as to prevent and/or reduce the waveguide structure 1100 of FIG. 11, which allows a guided wave related to a parasitic resonance to pass therethrough, from being substantially formed.

Referring to FIG. 22, for example, a first ground path GP21 and/or a second ground path GP22 may include an electrical path for electrically connecting the conductive sheet 33e and the second metal structure 902. The conductive sheet 33e may be electrically connected to the conductive part 1751 of the second metal structure 902 through the first ground path GP21 or the second ground path GP22.

According to an embodiment, the first ground path GP21 may include a current flow between the conductive sheet 33e and the conductive adhesive member 2010, a current flow between the conductive adhesive member 2010 and the display support structure 50, a current flow between the display support structure 50 and the rotating member 2020, a current flow between the rotating member 2020 and the second rotation support member 2032, a current flow between the second rotation support member 2032 and the second bolt 2042, and a current flow between the second bolt 2042 and the second metal structure 902. The one or more rolling elements 2032a may be electrically connected to the rotating member 2020. The one or more rolling elements 2032a and the rolling element support part 2032b may be electrically connected to each other. The rolling element support part 2032b may be electrically connected to the second bolt 2042. In various embodiments, a conductive lubricant may be positioned between the one or more rolling elements 2032a and the rolling element support part 2032b. In an embodiment, one surface of the rotating member 2020, which faces the one or more rolling elements 2032a, may include a curved-surface part 2025 in contact with the one or more rolling elements 2032a. The curved-surface part 2025 may extend in a circle with reference to the rotating member

2020. The curved-surface part 2025 may reduce the gap between the rotating member 2020 and the rolling element support part 2032b while increasing a contact area with the one or more rolling elements 2032a. In various embodiments, a conductive lubricant may be positioned between the one or more rolling elements 2032a and the curved-surface part 2025. In various embodiments, the curved-surface part 2025 may be omitted. The second guide rail structure 62 may be formed of a non-conductive material such as polymer. In various embodiments, the second guide rail structure 62 may include a non-conductive surface coated with a non-conductive material, and the inside of the second guide rail structure 62 may include a conductive material. In various embodiments, the second guide rail structure 62 and the second metal structure 902 may be integrally formed.

According to an embodiment, the second ground path GP22 may include a current flow between the conductive sheet 33e and the conductive adhesive member 2010, a current flow between the conductive adhesive member 2010 and the display support structure 50, a current flow between the display support structure 50 and the rotating member 2020, a current flow between the rotating member 2020 and the second rotation support member 2032, a current flow between the second rotation support member 2032 and the second guide rail structure 62, and a current flow between the second guide rail structure 62 and the second metal structure 902. In various embodiments, a conductive adhesive material (e.g., a conductive double-sided tape) or a flexible conductive member (e.g., a C clip (a C shaped conductive member), pogo pin, spring, conductive phorone, conductive rubber, conductive tape, or a conductive connector) may be positioned between the second guide rail structure 62 and the rolling element support part 2032b of the second rotation support member 2032. In various embodiments, a conductive adhesive material or a flexible conductive member may be positioned between the second guide rail structure 62 and the second metal structure 902. In various embodiments, the second guide rail structure 62 and the second metal structure 902 may be integrally formed. In an embodiment, the rolling element support member 2032b and the second guide rail structure 62 may be integrally formed. In an embodiment, the second rotation support member 2032 or the second guide rail structure 62 may include a conductive material.

According to various embodiments, when the first ground path GP21 or the second ground path GP22 is formed, the rotating member 2020 may include a conductive surface coated with a conductive material, and the inside of the rotating member 2020 may include a non-conductive material. The ground paths GP21 and GP22 illustrated in FIG. 22 show an electrical flow between elements in order to help the understanding of the embodiment, and it may be understood that the disclosure has a current flow structure according to a change or modification of elements.

According to various embodiments, when the first ground path GP21 or the second ground path GP22 is formed, one portion of the rotating member 2020 may include a conductive material for electrically connecting the display support structure 50 and the second rotation support member 2032, and the other portion of the rotating member 2020 may include a non-conductive material.

According to various embodiments, when the second ground path GP22 is formed, one portion of the second guide rail structure 62 may include a conductive material for electrically connecting the second rotation support member 2032 and the second metal structure 902, and the other portion of the second guide rail structure 62 may include a non-conductive material.

According to various embodiments, at least one ground path formed by electrically connecting the conductive sheet 33e and the second metal structure 902 may include a third ground path implemented in substantially the same as or similar to the third ground path GP13 according to the embodiment of FIG. 19. For example, referring to FIG. 22, the third ground path may include a current flow between the conductive sheet 33e and the conductive adhesive member 2210, a current flow between the conductive adhesive member 2210 and the display support structure 50, a current flow between the display support structure 50 and the second guide rail structure 62, and a current flow between the second guide rail structure 62 and the second metal structure 902. In various embodiments, a rotating member such as a roller may be positioned in one side part 520 of the display support structure 50 positioned in or inserted into the second guide rail 621. The rotating member may reduce the frictional force while maintaining a physical contact between the one side part 520 of the display support structure 50 and the second guide rail 621.

According to an embodiment, at least one ground path between the conductive sheet 33e and the conductive part 1741 of the third cover 222c, for example, may be implemented in substantially the same or similar manner as at least one ground path (e.g., the first ground path GP21 or the second ground path GP22) between the conductive sheet 33e and the conductive part 1751 of the third cover part 222c (refer to FIG. 17).

According to various embodiments, at least a portion of the second metal structure 902 overlapping the conductive sheet 33e may include at least one opening. For example, the at least one fourth conductive part 941 may include an opening 941a (refer to FIG. 20). The parasitic resonance frequency caused by the waveguide structure 1100 of FIG. 11, which includes the conductive sheet 33e and at least a portion of the second metal structure 902 overlapping therewith, may be shifted to a low frequency so as to be out of the resonance frequency band of an antenna due to at least one ground path (e.g., the first ground path GP21, the second ground path GP22, or a third ground path GP23 of FIG. 22) and/or the opening 941a. In various embodiments, a non-conductive material (e.g., the at least one fourth non-conductive part 942 of FIG. 9) may be positioned in at least one opening formed through at least a portion of the second metal structure 902 overlapping the conductive sheet 33e.

Figure 23:
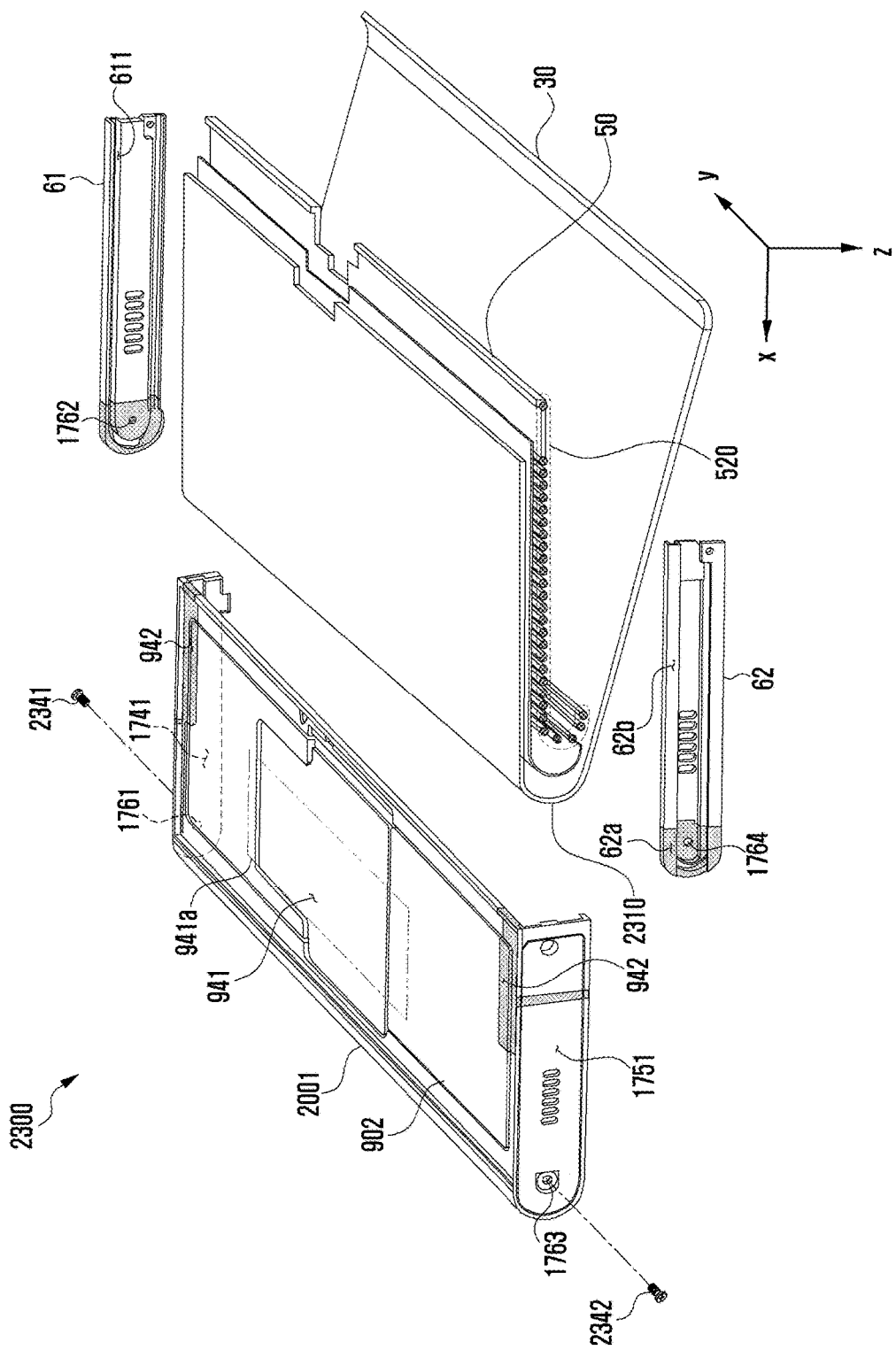
FIG. 23 is an exploded perspective view of a portion of the electronic device of FIG. 2A according to various embodiments.
Figure 24:
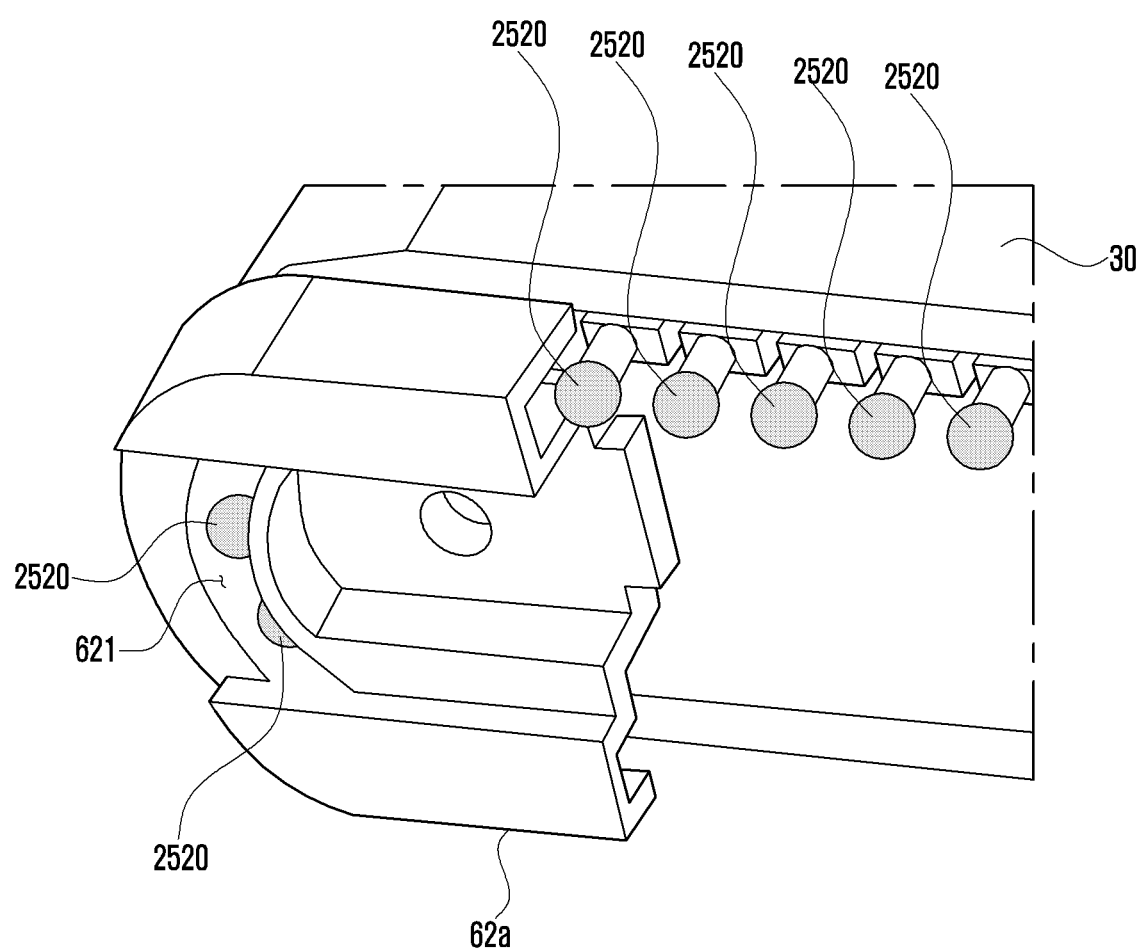
FIG. 24, for example, illustrates a flexible display, a display support structure, and a second guide rail structure in connection with the embodiment of FIG. 23.
Figure 25:
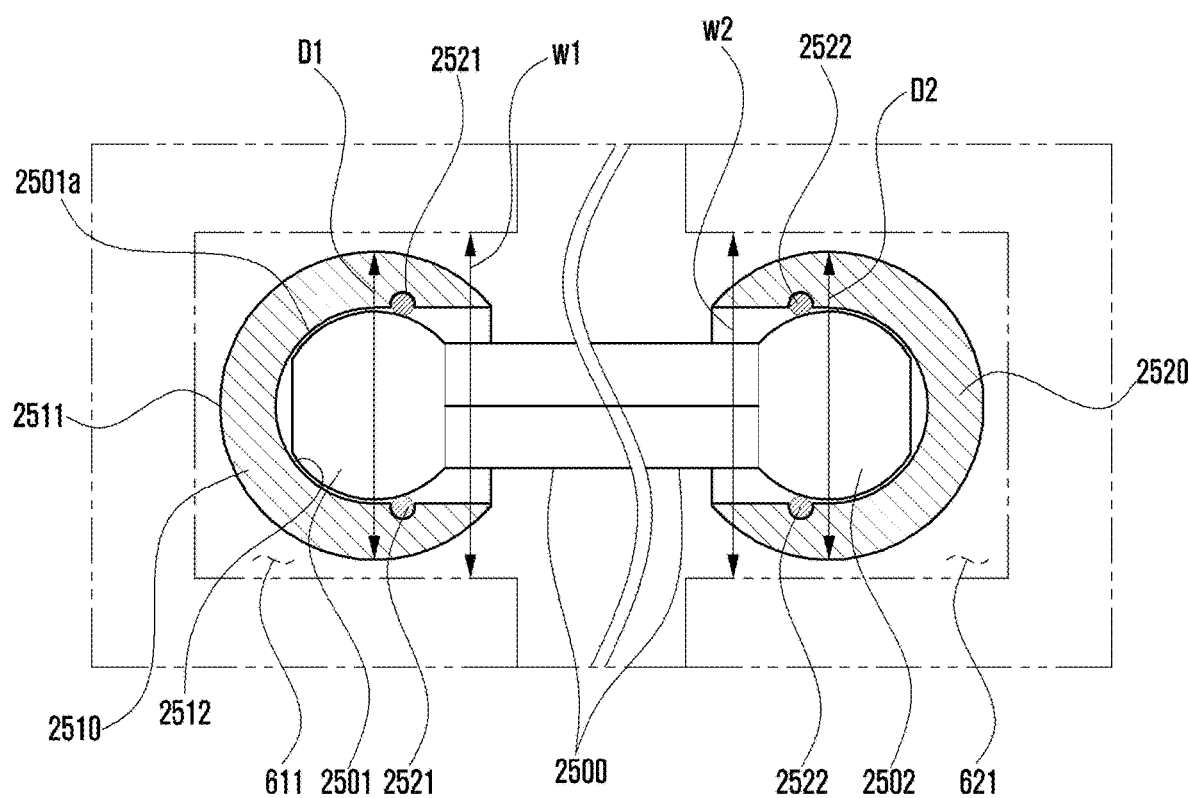
FIG. 25 is a partial cross sectional view of a support bar in connection with the example of FIG. 23 according to various embodiments.
Figure 26:
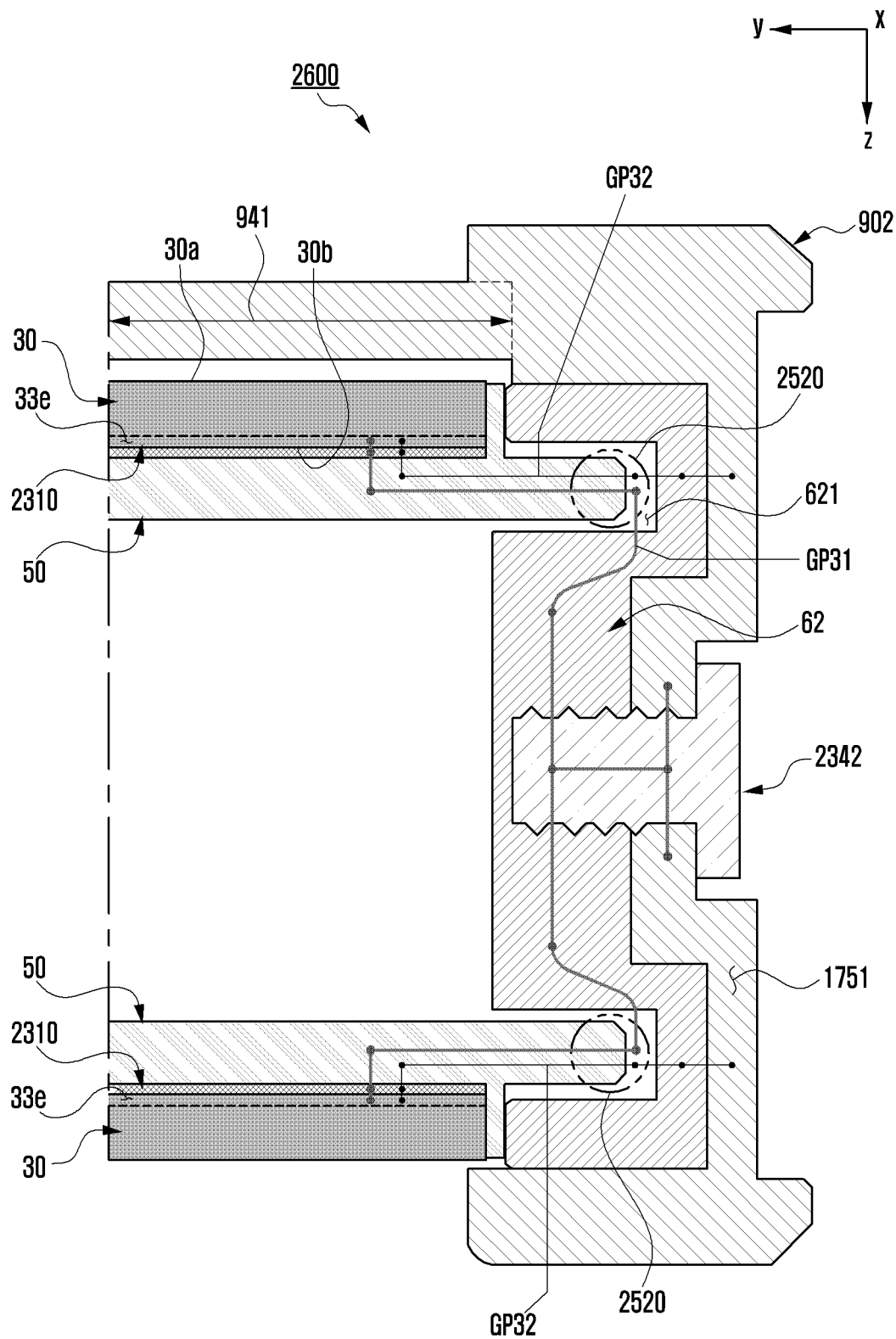
FIG. 26 is a cross sectional view of a portion of the electronic device taken along line E-E' of FIG. 2B in connection with the example of FIG. 23 according to various embodiments.

FIG. 23 is an exploded perspective view of a portion 2300 of the electronic device 2 of FIG. 2A according to various embodiments. FIG. 24 is a partial perspective view illustrating a flexible display 30, a display support structure 50, and a second guide rail structure 62 in connection with the device of FIG. 23 according to various embodiments. FIG. 25 is a partial cross sectional view relating to a support bar 2500 in connection with the device of FIG. 23 according to various embodiments. FIG. 26 is a cross sectional view 2600 relating to a portion of the electronic device 2 taken along line E-E' of FIG. 2B in connection with the device of FIG. 23 according to various embodiments.

Referring to FIGS. 23, 24, and 25, an electronic device 2 may include a flexible display 30, a display support structure 50, a conductive adhesive member 2310, a first case 2001, a first guide rail structure 61, a second guide rail structure 62, a first bolt 2341, and/or a second bolt 2342. The first case 2001 may include a second metal structure 902 and a fourth non-conductive part 942.

According to an embodiment, the first guide rail structure 61 may include a second bolt fastening hole 1762 aligned with the first bolt fastening hole 1761 of the second metal structure 902. The first guide rail structure 61 and the conductive part 1741 of the second metal structure 902 may be coupled to each other by fastening with the first bolt 2341. The second guide rail structure 62 may include a fourth bolt fastening hole 1764 aligned with the third bolt fastening hole 1763 of the second metal structure 902. The second guide rail structure 62 and the conductive part 1751 of the second metal structure 902 may be coupled to each other by fastening with the second bolt 2342.

According to an embodiment, a rotating member such as a roller may be positioned at one side part of the display support structure 50 positioned in or inserted into the first guide rail 611 of the first guide rail structure 61. A rotating member such as a roller may be positioned at the other side part 520 of the display support structure 50 positioned in or inserted into the second guide rail 621 (refer to FIGS. 4 and 24) of the second guide rail structure 62. In the case, the rotating member 2020, the first rotation support member 2031, and the second rotation support member 2032 according to the embodiment of FIG. 20 may be omitted. In an embodiment, the fourth support member 422 and/or the at least one hinge 800 according to the embodiment of FIG. 4 may be omitted. Referring to FIGS. 24 and 25, the display support structure 50 may include a first rotating member 2510 rotatably positioned around one end 2501 of a support bar 2500 and a second rotating member 2520 (or, a rotator, or the like) rotatably positioned around the other end 2502 of the support bar 2500.

In an embodiment, the first rotating member 2510 may include an outer curved-surface 2511 and an inner curved-surface 2512. The outer curved-surface 2511 may have a curvature greater than that of the inner curved-surface 2512. The one end 2501 of the support bar 2500 may include a curved-surface 2501*a* facing the inner curved-surface 2512 of the first rotating member 2510. Multiple rolling elements 2521 (e.g., balls) positioned between the first rotating member 2510 and the one end 2501 of the support bar 2500 may be included therein. When the first rotating member 2510 rotates with respect to the one end 2501 of the support bar 2500, the multiple rolling elements 2521 may reduce a frictional force between the first rotating member 2510 and the one end 2501 of the support bar 2500. In various embodiments, the multiple rolling elements 2521 may be omitted, and a conductive lubricant may be positioned between the first rotating member 2510 and the one end 2501 of the support bar 2500. One side part of the display support structure 50 may be implemented in the first rotating member 2510 according to the embodiment of FIG. 25, which is positioned at one ends of the multiple support bars 500 (refer to FIG. 8), and elements associated therewith. The second rotating member 2520 rotatably positioned around the other end 2502 of the support bar 2500 and multiple rolling elements 2522 associated therewith may be implemented in substantially the same or similar method as the first rotating member 2510 rotatably positioned around the one end 2501 of the support bar 2500 and the multiple rolling elements 2521 associated therewith. The other side part 520 of the display support structure 50 may be implemented in the second rotating member 2520 according to the embodiment of FIG. 25, which is positioned at one ends of the multiple support bars 500 (refer to FIG. 8), and elements associated therewith. In a state change (e.g., a change between a closed state and an open state) of the electronic device 2, a first width W1 in which the first guide rail 611 extends in a direction orthogonal to a direction extending from the one end 2501 of the support bar 2500 to the other end 2502 of the support bar 2500 may be formed greater than the first diameter D1 of the first rotating member 2510 forming the outer curved-surface 2511 such that the first rotating member 2510 may rotate while rubbing with the first guide rail 611. In a state change of the electronic device 2, a second width W2 in which the second guide rail 621 extends in a direction orthogonal to a direction extending from the one end 2501 of the support bar 2500 to the other end 2502 of the support bar 2500 may be formed greater than the second diameter D2 of the second rotating member 2520 forming the outer curved-surface such that the second rotating member 2520 may rotate while rubbing with the second guide rail 621. By a complex action of the elasticity of the display assembly 700 (refer to FIG. 7), a movement or force transferred between elements in a state change of the electronic device 2, and/or the tolerance between elements, the contact state between the first rotating member 2510 and the first guide rail 611, and the contact state between the second rotating member 2520 and the second guide rail 621.

According to an embodiment, the conductive adhesive member 2310 (e.g., the conductive adhesive member 1710 of FIG. 17) may be positioned between the flexible display 30 and the display support structure 50. In an embodiment, a ground path (e.g., the at least one ground path 1101 or 1102 of FIG. 11) may be formed by electrically connecting the third metal structure 1802 (refer to FIG. 18) facing the front surface 30*a* of the flexible display 30 and the conductive sheet 33*e* forming the rear surface 30*b* of the flexible display 30. The conductive adhesive member 2310 and the display support structure 50 may be included in the ground path. The conductive sheet 33*e* and the display support structure 50 may be electrically connected by the conductive adhesive member 2310, so as to prevent and/or reduce the waveguide structure 1100 of FIG. 11, which allows a guided wave related to a parasitic resonance to pass therethrough, from being substantially formed. The ground path may attribute to an antenna radiation performance securing for an antenna (e.g., the antenna structure 1300 of FIG. 13 or 14) using at least one antenna radiator. In an embodiment, the ground path may contribute that the third metal structure 1802 (refer to FIG. 18) and the conductive sheet 33*e* overlapping the third metal structure 1802 prevent and/or reduce a waveguide structure (e.g., the waveguide structure 1100 of FIG. 11), which allows a guided wave related to the parasitic resonance to pass therethrough, from being substantially formed. In various embodiments, the ground path may contribute such that the parasitic resonance frequency generated in a waveguide structure by the third metal structure 1802 (refer to FIG. 18) and the conductive sheet 33*e* is not included in the resonance frequency band of an antenna (e.g., the antenna structure 1300 of FIG. 13 or 14) using at least one antenna radiator. For example, the parasitic resonance frequency generated in a waveguide structure by the third metal structure 1802 (refer to FIG. 18) and the conductive sheet 33*e* may be shifted to be out of the resonance frequency band of an antenna due to the ground path (refer to FIG. 12B or 12C).

According to various embodiments, the metal support sheet 70 (refer to FIG. 4, 7, or 8) may be positioned on the rear surface 30*b* of the flexible display 30. In the case, the conductive adhesive member 2310 may be positioned between the metal support sheet 70 and the display support structure 50. The metal support sheet 70 may be electrically connected to the display support structure 50 through the conductive adhesive member 2310. A conductive adhesive material may be positioned between the conductive sheet 33e of the flexible display 30 and the metal support sheet 70, and the conductive sheet 33e and the metal support sheet 70 may be electrically connected to each other. The conductive adhesive member 2310, the metal support sheet 70, and the display support structure 50 may be included in a ground path (e.g., the at least one ground path 1101 or 1102 of FIG. 11) for electrically connecting the third metal structure 1802 (refer to FIG. 18) and the conductive sheet 33e. The conductive sheet 33e and the metal support sheet 70 may be electrically connected by a conductive adhesive material, so as to prevent and/or reduce the waveguide structure 1100 of FIG. 11, which allows a guided wave related to a parasitic resonance to pass therethrough, from being substantially formed. The metal support sheet 70 and the display support structure 50 may be electrically connected by the conductive adhesive member 2310, so as to prevent and/or reduce the waveguide structure 1100 of FIG. 11, which allows a guided wave related to a parasitic resonance to pass therethrough, from being substantially formed.

Referring to FIG. 26, for example, at least one ground path formed by electrically connecting the conductive sheet 33e and the second metal structure 902 may include a first ground path GP31 and/or a second ground path GP32. The conductive sheet 33e may be electrically connected to the conductive part 1751 of the second metal structure 902 through the first ground path GP31 or the second ground path GP32.

According to an embodiment, the first ground path GP31 may include a current flow between the conductive sheet 33e and the conductive adhesive member 2310, a current flow between the conductive adhesive member 2310 and the display support structure 50, a current flow between the display support structure 50 and the second rotating member 2520, a current flow between the second rotating member 2520 and the second guide rail structure 62, a current flow between the second guide rail structure 62 and the second bolt 2342, and a flow current between the second bolt 2342 and the second metal structure 902. In various embodiments, the second guide rail structure 62 may include a conductive surface coated with a conductive material, and the inside of the second guide rail structure 62 may include a non-conductive material. In various embodiments, the second guide rail structure 62 and the second metal structure 902 may be integrally formed with each other.

According to an embodiment, the second ground path GP32 may include a current flow between the conductive sheet 33e and the conductive adhesive member 2310, a current flow between the conductive adhesive member 2310 and the display support structure 50, a current flow between the display support structure 50 and the second rotating member 2520, a current flow between the second rotating member 2520 and the second guide rail structure 62, and a current flow between the second guide rail structure 62 and the second metal structure 902. In various embodiments, a conductive lubricant may be positioned between one side part 520 (refer to FIG. 8) of the display support structure 50 positioned in or inserted into the second guide rail 621 and the second guide rail 621. In various embodiments, a conductive adhesive material (e.g., a conductive double-sided tape) or a flexible conductive member (e.g., a C clip (a C shaped conductive member), pogo pin, spring, conductive phorone, conductive rubber, conductive tape, or a conductive connector) may be positioned between the second guide rail structure 62 and the second metal structure 902. In various embodiments, the second guide rail structure 62 and the second metal structure 902 may be integrally formed with each other.

According to an embodiment, when the first ground path GP31 or the second ground path GP32 is formed, one portion 62a (refer to FIGS. 23 and 24) of the second guide rail structure 62 may include a conductive material for electrically connecting the second rotating member 2520 and the second metal structure 902, and the other portion 62b (refer to FIGS. 23 and 24) of the second guide rail structure 62 may include a non-conductive material. In various embodiments, the second guide rail structure 62 may be formed in an integrated conductive member.

According to an embodiment, the conductive sheet 33e may be electrically connected to the conductive part 1741 of the third cover part 222c (refer to FIG. 17) through at least one ground path. For example, at least one ground path between the conductive sheet 33e and the conductive part 1741 of the third cover part 222c may be implemented in substantially the same or similar manner as at least one ground path (e.g., the first ground path GP31 or the second ground path GP32) between the conductive sheet 33e and the conductive part 1751 of the third cover part 222c (refer to FIG. 17).

According to various embodiments, at least a portion of the second metal structure 902 overlapping the conductive sheet 33e may include at least one opening. For example, the at least one fourth conductive part 941 may include an opening 941a (refer to FIG. and 23). The parasitic resonance frequency caused by the waveguide structure 1100 of FIG. 11, which includes the conductive sheet 33e and at least a portion of the second metal structure 902 overlapping therewith, may be shifted to a low frequency so as to be out of the resonance frequency band of an antenna due to at least one ground path (e.g., the first ground path GP31 or the second ground path GP32 of FIG. 26) and the opening 941a. In various embodiments, a non-conductive material (e.g., the at least one fourth non-conductive part 942 of FIG. 9) may be positioned in at least one opening formed through at least a portion of the second metal structure 902 overlapping the conductive sheet 33e.

Figure 27:
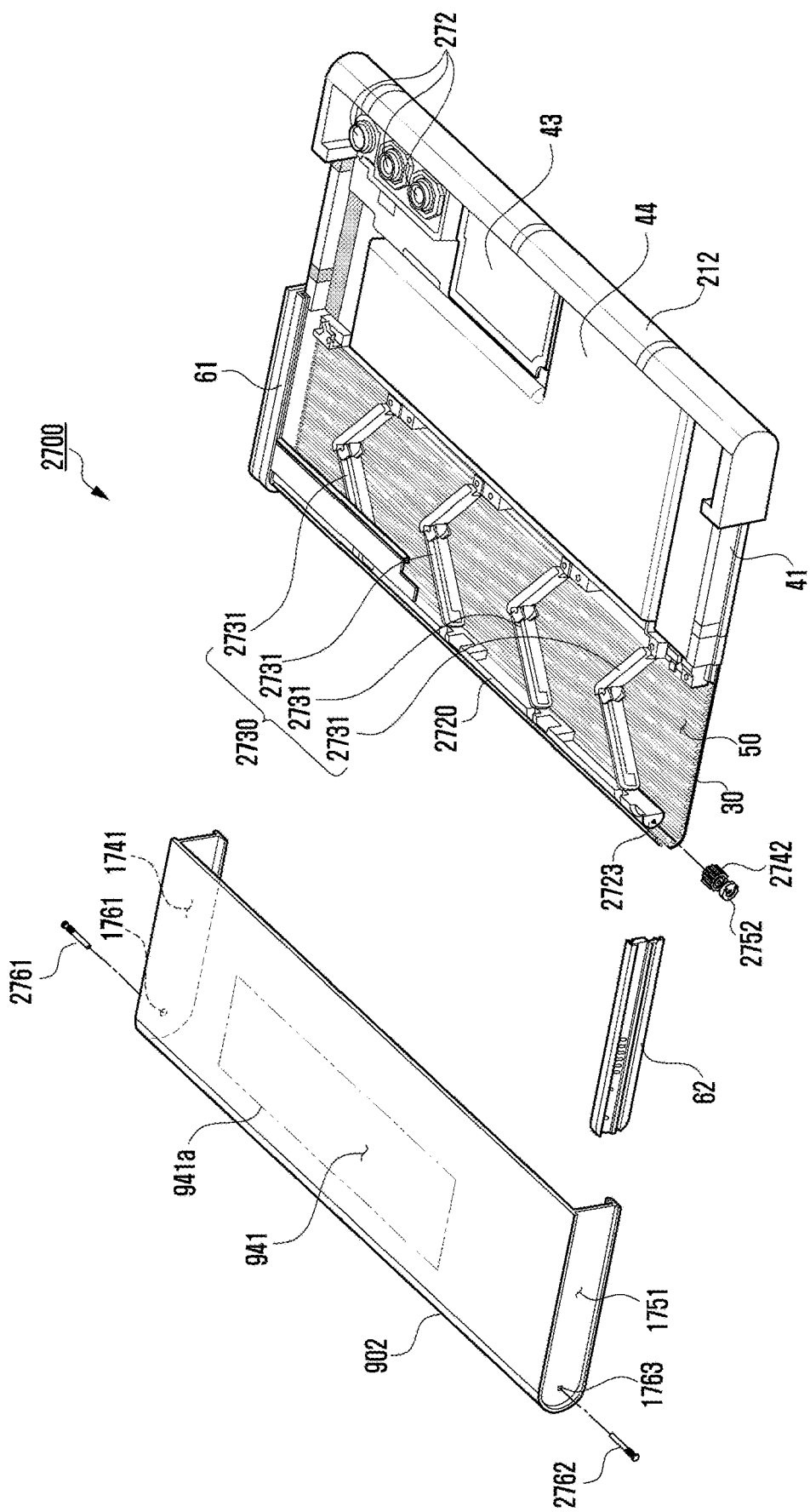
FIG. 27 is an exploded perspective view of a portion of the electronic device of FIG. 2A according to various embodiments.
Figure 28:
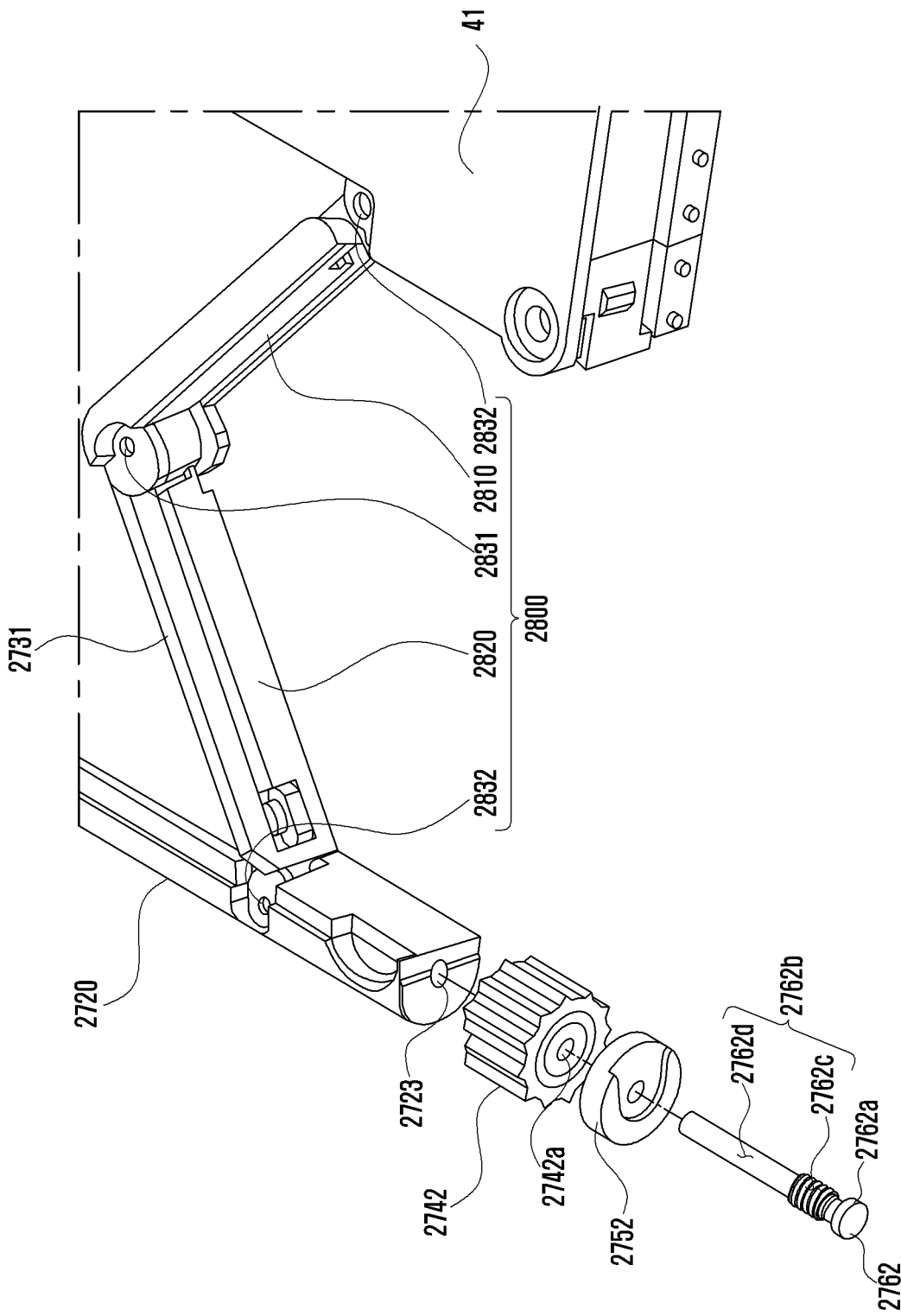
FIG. 28 is a perspective view illustrating an example curved-surface member, a first support structure, a link work, a second rotating member, a second rotation support member, and/or a second bolt according to the example of FIG. 27 according to various embodiments.
Figure 29:
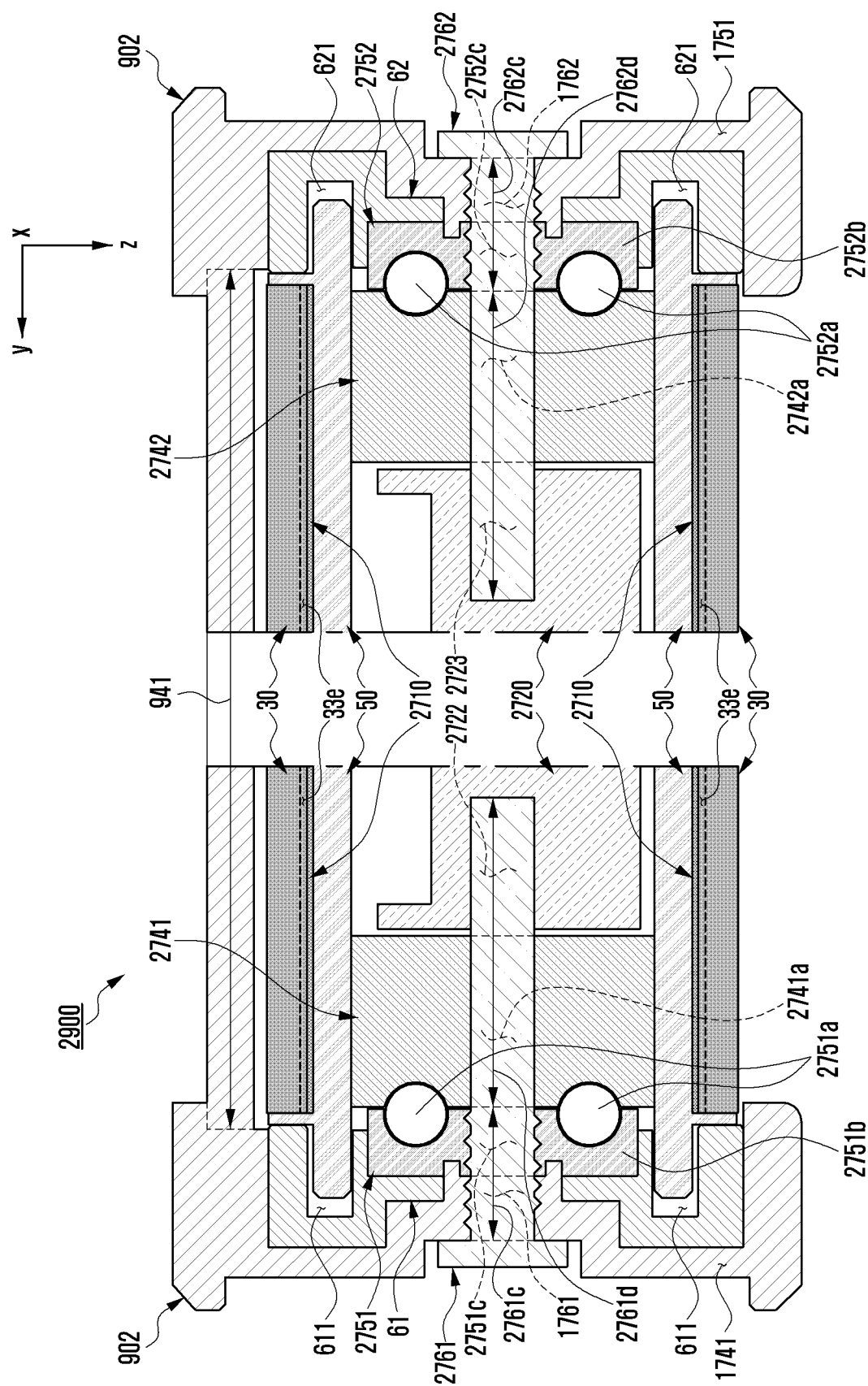
FIG. 29 is a cross sectional view of a portion of the electronic device taken along line F-F' of FIG. 2B in connection with the example of FIG. 27 according to various embodiments.
Figure 30:
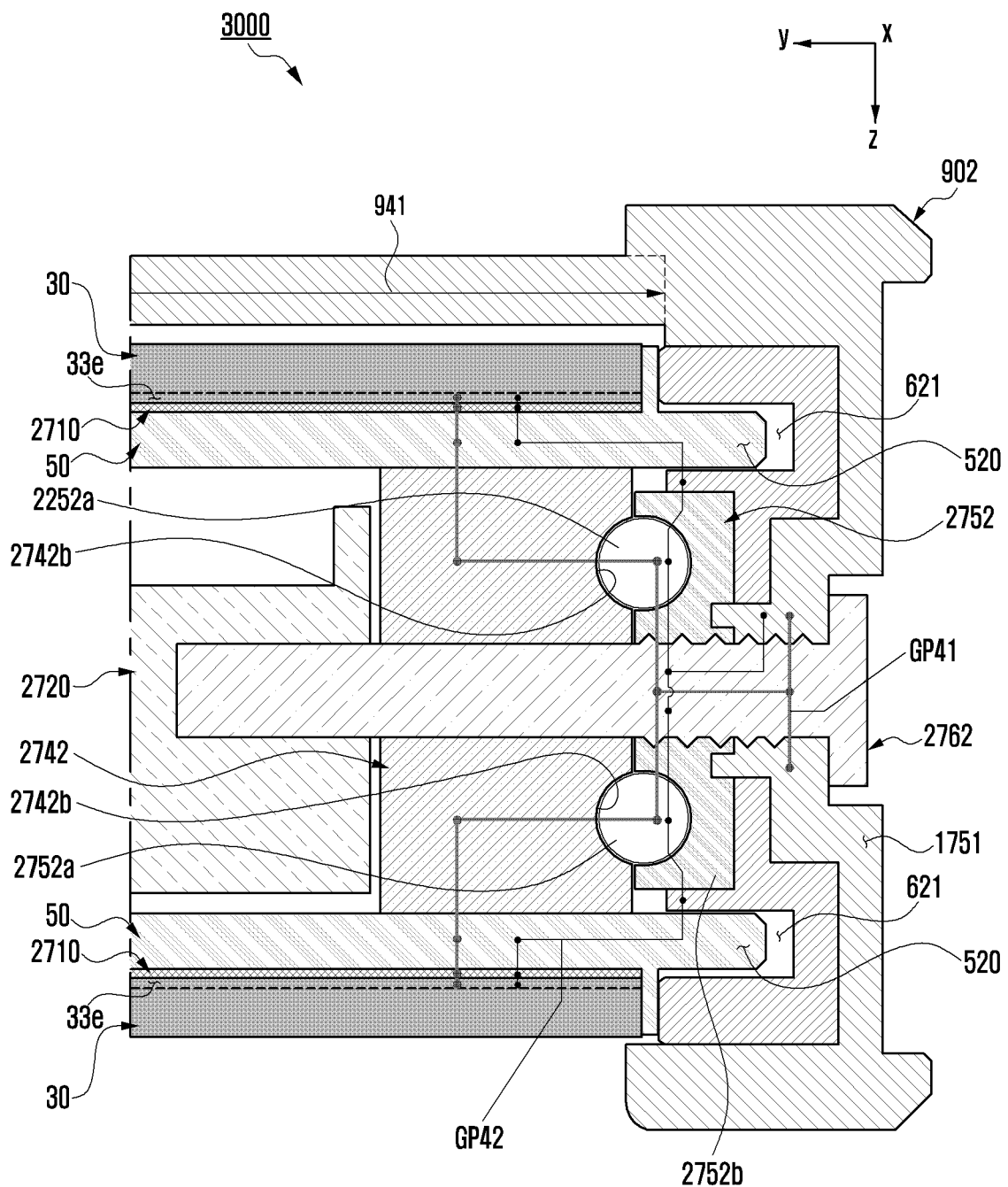
FIG. 30 is a cross sectional view illustrating at least one ground path in connection with the example of FIG. 27 according to various embodiments.

FIG. 27 is an exploded perspective view of a portion 2700 of the electronic device 2 of FIG. 2A according to various embodiments. FIG. 28 is a partial perspective sectional view illustrating a fourth support member 2720, a first support structure 41, a hinge 2731, a second rotating member 2742, a second rotation support member 2752, and/or a second bolt 2762 according to the example of FIG. 27 according to various embodiments. FIG. 29 is a cross sectional view 2900 of a portion of the electronic device 2 taken along line F-F' of FIG. 2B in connection with the example of FIG. 27 according to various embodiments. FIG. 30 is a sectional view 3000 illustrating at least one ground path in connection with the example of FIG. 27 according to various embodiments.

Referring to FIGS. 27, 28, and 29, an electronic device 2 may include a flexible display 30, a display support structure 50, a conductive adhesive member 2710, a second metal structure 902, a first guide rail structure 61, a second guide rail structure 62, a fourth support member 2720, a sliding driving part 2730, a first rotating member 2741, a second rotating member 2742, a first rotation support member 2751, a second rotation support member 2752, a first bolt 2761, a second bolt 2762, a first support structure 41, a second side cover 212, a printed circuit board 43, a battery 44, and/or multiple second camera modules 272.

For example, the fourth support member 2720 (e.g., the fourth support member 422 of FIG. 4) may be coupled to the second metal structure 902 by a first bolt 2761 fastened to a first bolt fastening hole 1761 of the second metal structure 902 and a second bolt 2762 fastened to a third bolt fastening hole 1763 of the second metal structure 902. The second bolt 2762 may include a head 2762a and a shaft 2762b extending from the head 2762a. The shaft 2762b may include male threads 2762c and non-threads 2762d. The first bolt 2761 may be substantially the same as or similar to the second bolt 2762. Non-threads of a shaft included in the first bolt 2761 may be inserted in a groove 2722 formed on one side of the fourth support member 2720, and the non-threads 2762c of the shaft 2762b included in the second bolt 2762 may be inserted in a groove 2723 formed on the other side of the fourth support member 2720.

For example, the sliding driving part 2730 (e.g., the sliding driving part 80 of FIG. 4) may include at least one hinge 2731. The hinge 2731 may connect the first support structure 41 and the fourth support member 2720 in between the first support structure 41 and the fourth support member 2720.

In an embodiment, the hinge 2731 may include a link work 2800 (refer to FIG. 28). For example, the link work 2800 may include a first link 2810, a second link 2820, a first joint 2831, a second joint 2832, and/or a third joint 2833. One end of the first link 2810 and one end of the second link 2820 may be connected using the first joint 2831, and the first link 2810 and the second link 2820 may rotate with reference to the first joint 2831 with each other. The other end of the first link 2810 may be connected to the first support structure 41 using the second joint 2832, and the first link 2810 may rotate with respect to the first support structure 41 with reference to the second joint 2832. The other end of the second link 2820 may be connected to the fourth support member 2720 using the third joint 2833, and the second link 2820 may rotate with respect to the fourth support member 2720 with reference to the third joint 2833. For example, the first joint 2831, the second joint 2832, and the third joint 2833 may include a rotating shaft such as a pin or a shaft.

According to an embodiment, the first rotating member 2741 may be positioned between the fourth support member 2720 and the first guide rail structure 61. The first rotating member 2741 may be rotatably positioned around non-threads 2761d of the first bolt 2761 extending through a hole 2741a of the first rotating member 2741. The second rotating member 2742 may be positioned between the fourth support member 2720 and the second guide rail structure 62. The second rotating member 2742 may be rotatably positioned around non-threads 2762d of the second bolt 2762 extending through a hole 2742a of the second rotating member 2742. The first rotating member 2741 and the second rotating member 2742 may include a circular gear or round gear. For example, the circular gear may include a rotating body having a circular cylindrical shape and gear teeth arranged along the circumference of the rotating body. The display support structure 50 may have a gear structure capable of engaging with the first rotating member 2741 and the second rotating member 2742 by means of the first layer 51 (refer to FIG. 7) and multiple support bars 500 (refer to FIG. 8). Due to a state (or a drivingly connected state) where the first rotating member 2741 and the second rotating member 2742 are engaged with the display support structure 50, a movement or force applied thereto can be transferred between the first rotating member 2741 and the display assembly 700 (refer to FIG. 7) and between the second rotating member 2742 and the display assembly 700. In a state change (e.g., a change between a closed state and an open state) of the electronic device 2, the display support structure 50 may be guided by the first guide rail 611 and the second guide rail 621 to move while rubbing with the fourth support member 2720.

According to an embodiment, the first rotation support member 2751 may be positioned in or coupled to the first guide rail structure 61 in between the first rotating member 2741 and the first guide rail structure 61. The first rotating member 2741 can rotate while rubbing with the first rotation support member 2751. The second rotation support member 2752 may be positioned in or coupled to the second guide rail structure 62 in between the second rotating member 2742 and the second guide rail structure 62. The second rotating member 2742 can rotate while rubbing with the second rotation support member 2752. The first rotation support member 2751 may include a rolling member (or a rolling friction part) (e.g., one or more rolling elements 2751a) capable of reducing a frictional force with the first rotating member 2741. The second rotation support member 2252 may include a rolling member (or a rolling friction part) (e.g., one or more elements 2752a) capable of reducing a frictional force with the second rotating member 2242.

For example, the first rotation support member 2751 may be substantially the same as or similar to the first rotation support member 2031 of FIG. 20. The first rotation support member 2751 may include one or more rolling elements 2751a (e.g., balls) and a rolling element support part 2751b. The one or more rolling elements 2751a included in the first rotation support member 2751 may rotate on the rolling element support part 2751b while rubbing with the first rotating member 2741. For example, the second rotation support member 2752 may be substantially the same as or similar to the second rotation support member 2032 of FIG. 20. The second rotation support member 2752 may include one or more rolling elements 2752a and a rolling element support part 2752b. The one or more rolling elements 2752a included in the second rotation support member 2752 may rotate on the rolling element support part 2752b while rubbing with the second rotating member 2742. In various embodiments, the first rotation support member 2751 or the second rotation support member 2752 may be referred to as a bearing. The first rotation support member 2751 or the second rotation support member 2752 may be implemented in various other forms.

According to an embodiment, the rolling element support part 2751b of the first rotation support member 2751 may include a bolt fastening hole 2751c having female threads capable of fastening with male threads 2761c of the first bolt 2761. The rolling element support part 2752b of the second rotation support member 2752 may include a bolt fastening hole 2752c having female threads capable of fastening with the male threads 2762c of the second bolt 2762.

According to an embodiment, the first bolt fastening hole 1761 included in the second metal structure 902 may be aligned with the bolt fastening hole 2751c of the first rotation support member 2751, and may include female threads capable of fastening with the male threads 2761c of the first bolt 2761. The first guide rail structure 61 may include a through-hole corresponding to the first bolt fastening hole 1761 of the second metal structure 902 and the bolt fastening hole 2751c of the first rotation support member 2751. The first rotation support member 2751 and the conductive part 1741 of the second metal structure 902 may be coupled to each other by fastening with the first bolt 2761. The third bolt fastening hole 1763 included in the second metal structure 902 may be aligned with the bolt fastening hole 2752c of the second rotation support member 2752, and may include female threads capable of fastening with the male threads 2762c of the second bolt 2762. The second guide rail structure 62 may include a through-hole corresponding to the third bolt fastening hole 1763 of the second metal structure 902 and the bolt fastening hole 2752c of the second rotation support member 2752. The second rotation support member 2752 and the conductive part 1751 of the second metal structure 902 may be coupled to each other by fastening with the second bolt 2762.

According to an embodiment, the conductive adhesive member 2710 (e.g., the conductive adhesive member 1710 of FIG. 17) may be positioned between the flexible display 30 and the display support structure 50. The conductive sheet 33e included in the flexible display 30 may be electrically connected to the display support structure 50 through the conductive adhesive member 2710. In an embodiment, a ground path (e.g., the at least one ground path 1101 or 1102 of FIG. 11) may be formed by electrically connecting the third metal structure 1802 (refer to FIG. 18) facing the front surface 30a of the flexible display 30 and the conductive sheet 33e forming the rear surface 30b of the flexible display 30. The conductive adhesive member 2710 and the display support structure 50 may be included in the ground path. The conductive sheet 33e and the display support structure 50 may be electrically connected by the conductive adhesive member 2710, so as to prevent and/or reduce the waveguide structure 1100 of FIG. 11, which allows a guided wave related to a parasitic resonance to pass therethrough, from being substantially formed. The ground path may attribute to an antenna radiation performance securing for an antenna (e.g., the antenna structure 1300 of FIG. 13 or 14) using at least one antenna radiator. In an embodiment, the ground path may contribute that the third metal structure 1802 (refer to FIG. 18) and the conductive sheet 33e overlapping the third metal structure 1802 prevent and/or reduce a waveguide structure (e.g., the waveguide structure 1100 of FIG. 11), which allows a guided wave related to the parasitic resonance to pass therethrough, from being substantially formed. In various embodiments, the ground path may contribute such that the parasitic resonance frequency generated in a waveguide structure by the third metal structure 1802 (refer to FIG. 18) and the conductive sheet 33e is not included in the resonance frequency band of an antenna (e.g., the antenna structure 1300 of FIG. 13 or 14) using at least one antenna radiator. For example, the parasitic resonance frequency generated in a waveguide structure by the third metal structure 1802 (refer to FIG. 18) and the conductive sheet 33e may be shifted to be out of the resonance frequency band of an antenna due to the ground path (refer to FIG. 12B or 12C).

According to various embodiments, the metal support sheet 70 (refer to FIG. 4, 7, or 18) may be positioned on the rear surface 30b of the flexible display 30. In the case, the conductive adhesive member 2710 may be positioned between the metal support sheet 70 and the display support structure 50. The metal support sheet 70 may be electrically connected to the display support structure 50 through the conductive adhesive member 2710. A conductive adhesive material may be positioned between the conductive sheet 33e of the flexible display 30 and the metal support sheet 70, and the conductive sheet 33e and the metal support sheet 70 may be electrically connected to each other. The conductive adhesive member 2710, the metal support sheet 70, and the display support structure 50 may be included in a ground path (e.g., the at least one ground path 1101 or 1102 of FIG. 11) for electrically connecting the third metal structure 1802 (refer to FIG. 18) and the conductive sheet 33e. The conductive sheet 33e and the metal support sheet 70 may be electrically connected by a conductive adhesive material, so as to prevent and/or reduce the waveguide structure 1100 of FIG. 11, which allows a guided wave related to a parasitic resonance to pass therethrough, from being substantially formed. The metal support sheet 70 and the display support structure 50 may be electrically connected by the conductive adhesive member 2710, so as to prevent and/or reduce the waveguide structure 1100 of FIG. 11, which allows a guided wave related to a parasitic resonance to pass therethrough, from being substantially formed.

Referring to FIG. 30, for example, at least one ground path for electrically connecting the conductive sheet 33e and the second metal structure 902 may include a first ground path GP41 and/or a second ground path GP42. The conductive sheet 33e may be electrically connected to the conductive part 1751 of the second metal structure 902 through the first ground path GP41 or the second ground path GP42.

According to an embodiment, the first ground path GP41 may include a current flow between the conductive sheet 33e and the conductive adhesive member 2710, a current flow between the conductive adhesive member 2710 and the display support structure 50, a current flow between the display support structure 50 and the second rotating member 2742, a current flow between the second rotating member 2742 and the second rotation support member 2752, a current flow between the second rotation support member 2752 and the second bolt 2762, and a current flow between the second bolt 2762 and the second metal structure 902. The one or more rolling elements 2752a may be electrically connected to the second rotating member 2742. The one or more rolling elements 2752a and the rolling element support part 2752b may be electrically connected to each other. The rolling element support part 2752b may be electrically connected to the second bolt 2762. In various embodiments, a conductive lubricant may be positioned between the one or more rolling elements 2752a and the rolling element support part 2752b. In an embodiment, one surface of the second rotating member 2742, which faces the one or more rolling elements 2752a, may include a curved-surface part 2742b (e.g., the curved-surface 2025 of FIG. 22) in contact with the one or more rolling elements 2752a. In various embodiments, a conductive lubricant may be positioned between the one or more rolling elements 2752a and the curved-surface part 2742b. In various embodiments, the curved-surface part 2742b may be omitted. The second guide rail structure 62 may be formed of a non-conductive material such as polymer. In various embodiments, the second guide rail structure 62 may include a non-conductive surface coated with a non-conductive material, and the inside of the second guide rail structure 62 may include a conductive material. In various embodiments, the second guide rail structure 62 and the second metal structure 902 may be integrally formed with each other.

According to an embodiment, the second ground path GP42 may include a current flow between the conductive sheet 33e and the conductive adhesive member 2710, a current flow between the conductive adhesive member 2710 and the display support structure 50, a current flow between the display support structure 50 and the second guide rail structure 62, a current flow between the second guide rail structure 62 and the second rotation support member 2752, a current flow between the second rotation support member 2752 and the second bolt 2762, and/or a current flow between the second bolt 2762 and the second metal structure 902. In various embodiments, a conductive lubricant may be positioned between one side part 520 of the display support structure 50 positioned in or inserted into the second guide rail 621 and the second guide rail 621. In various embodiments, a rotating member such as a roller may be positioned at one side part 520 of the display support structure 50 positioned in or inserted into the second guide rail 621. In various embodiments, a conductive adhesive material (e.g., a conductive double-sided tape) or a flexible conductive member (e.g., a C clip (a C shaped conductive member), pogo pin, spring, conductive phorone, conductive rubber, conductive tape, or a conductive connector) may be positioned between the second guide rail structure 62 and the rolling element support part 2752b. In various embodiments, the second guide rail structure 62 and the second metal structure 902 may be integrally formed with each other. In various embodiments, the rolling element support member 2752b and the second guide rail structure 62 may be integrally formed with each other.

In various embodiments, at least one ground path for electrically connecting the conductive sheet 33e and the second metal structure 902 may include a third ground path implemented in substantially the same as or similar to the third ground path GP13 according to the embodiment of FIG. 19. For example, referring to FIG. 30, the third ground path may include a current flow between the conductive sheet 33e and the conductive adhesive member 2710, a current flow between the conductive adhesive member 2710 and the display support structure 50, a current flow between the display support structure 50 and the second guide rail structure 62, and the second guide rail structure 62 and the second metal structure 902.

According to an embodiment, the conductive sheet 33e may be electrically connected to the conductive part 1741 (refer to FIGS. 27 and 30) of the second cover part 222b (refer to FIG. 17) through at least one ground path. According to an embodiment, at least one ground path between the conductive sheet 33e and the conductive part 1741 of the second cover 222b, for example, may be implemented in substantially the same or similar manner as at least one ground path (e.g., the first ground path GP41 or the second ground path GP42) between the conductive sheet 33e and the conductive part 1751 (refer to FIGS. 27 and 30) of the third cover part 222c (refer to FIG. 17).

According to various embodiments, at least a portion of the second metal structure 902 overlapping the conductive sheet 33e may include at least one opening. For example, the at least one fourth conductive part 941 may include an opening 941a (refer to FIG. 27). The parasitic resonance frequency caused by the waveguide structure 1100 of FIG. 11, which includes the conductive sheet 33e and at least a portion of the second metal structure 902 overlapping therewith, may be shifted to a low frequency so as to be out of the resonance frequency band of an antenna due to at least one ground path (e.g., the first ground path GP41 or the second ground path GP42 of FIG. 30) and the opening 941a. In various embodiments, a non-conductive material (e.g., the at least one fourth non-conductive part 942 of FIG. 9) may be positioned in at least one opening formed through at least a portion of the second metal structure 902 overlapping the conductive sheet 33e.

Figure 31:
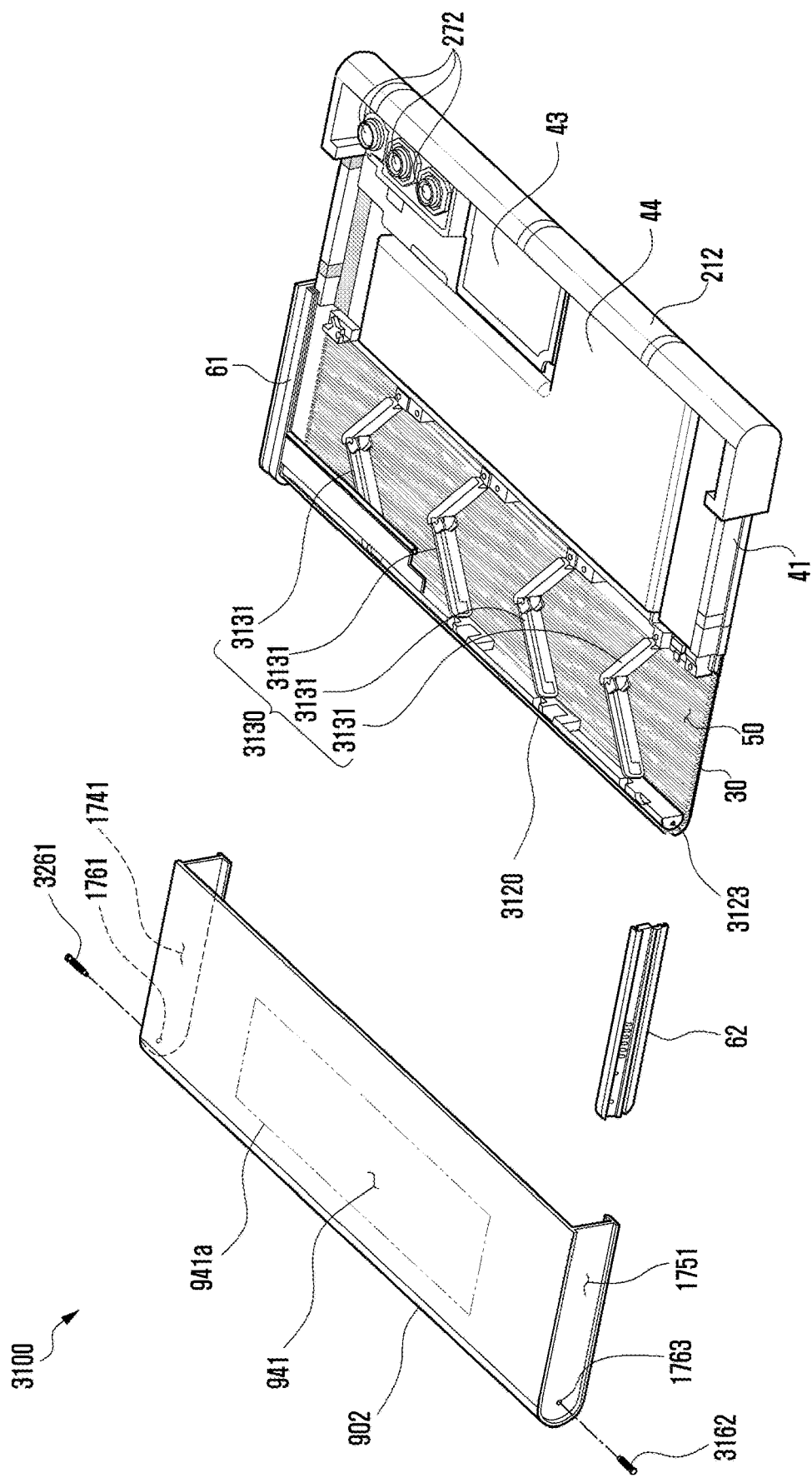
FIG. 31 is an exploded perspective view of a portion of the electronic device of FIG. 2A according to various embodiments.
Figure 32:
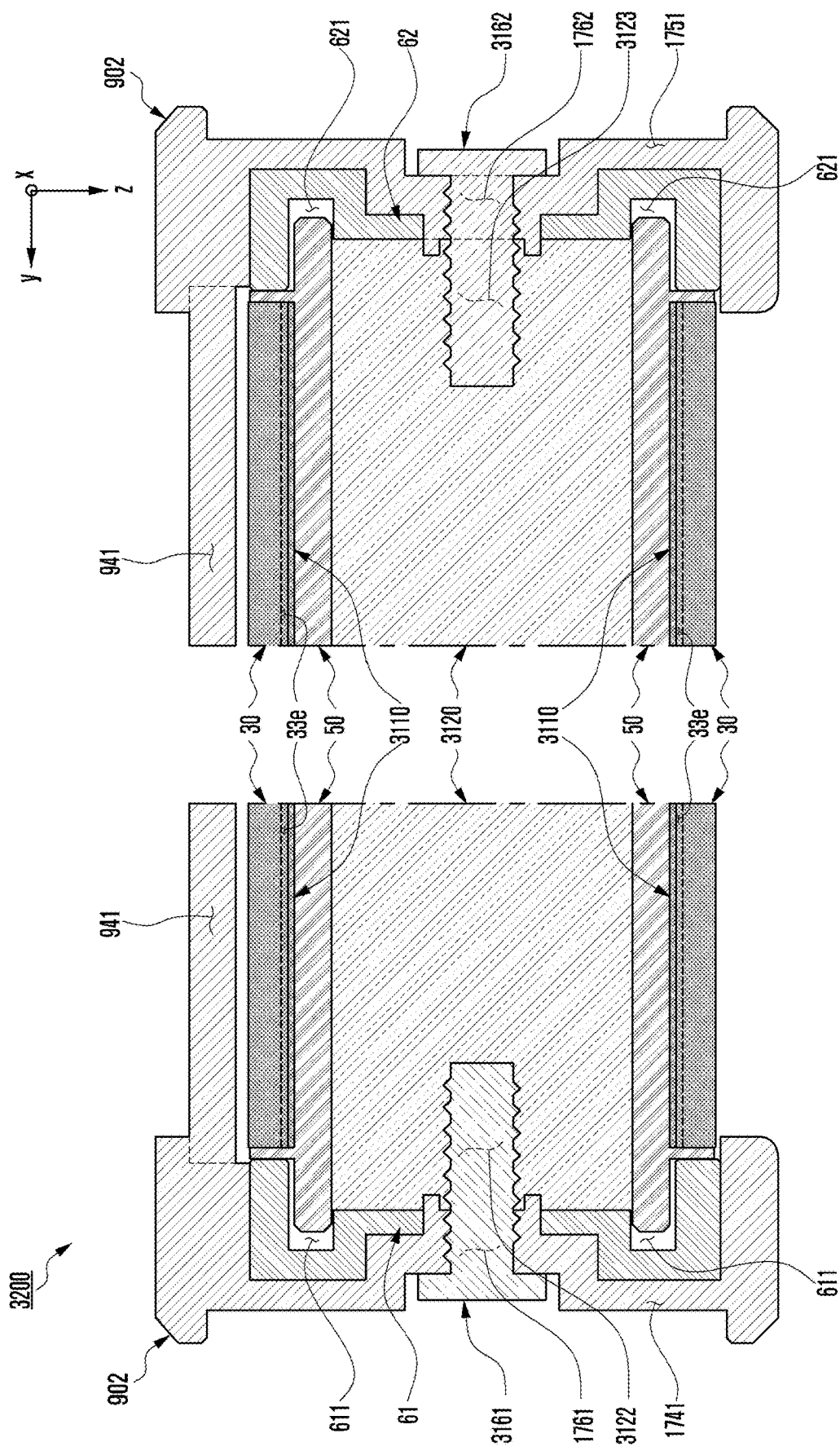
FIG. 32 is a cross sectional view of a portion of the electronic device taken along line F-F' of FIG. 2B in connection with the example of FIG. 31 according to various embodiments.
Figure 33:
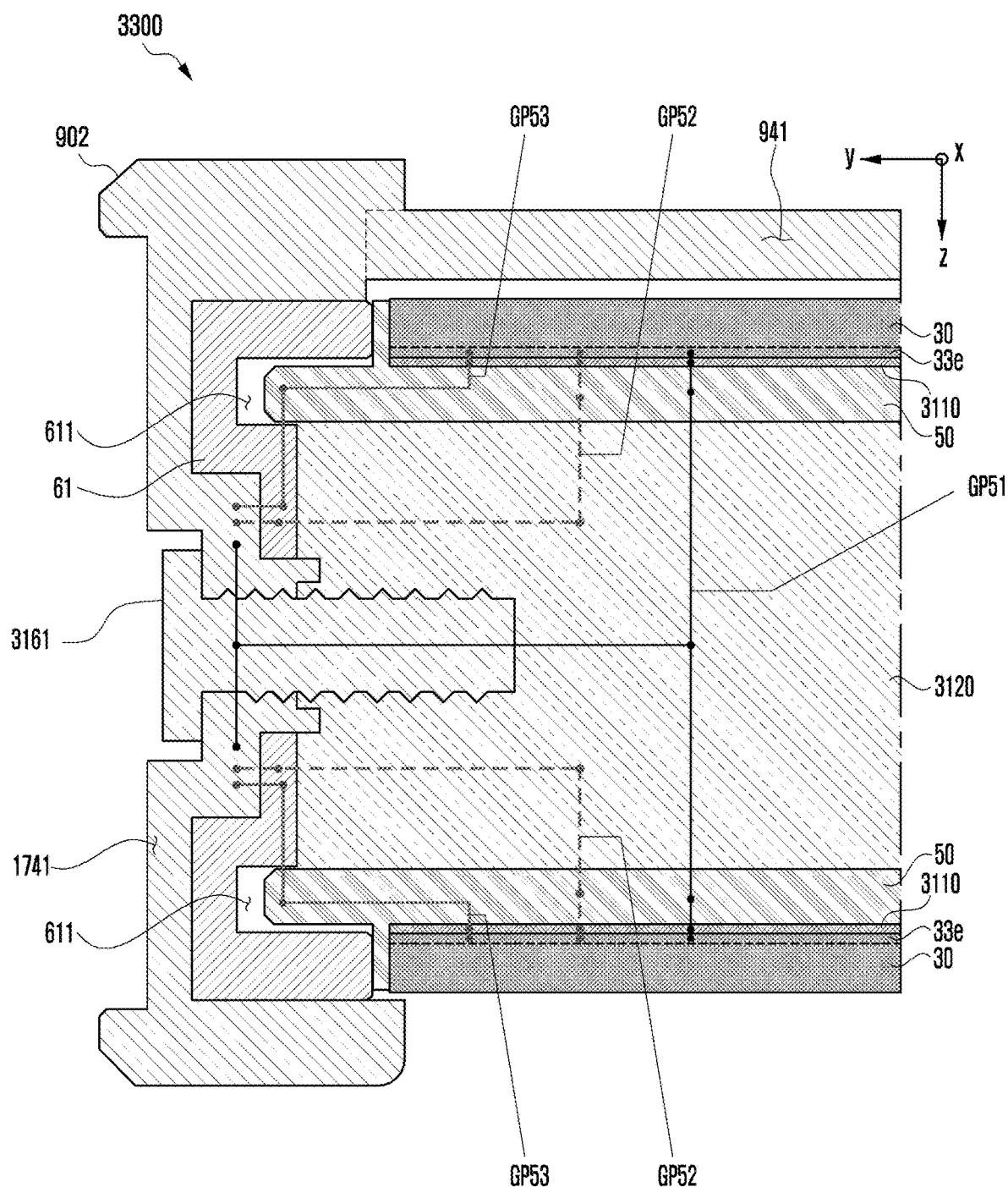
FIG. 33 is a cross sectional view illustrating at least one ground path in connection with the example of FIG. 31 according to various embodiments.

FIG. 31 is a partial exploded perspective view of a portion 3100 of the electronic device 2 of FIG. 2A according to various embodiments. FIG. 32 is a cross sectional view 3200 of a portion of the electronic device 2 taken along line F-F' of FIG. 2B in connection with the example of FIG. 31 according to various embodiments. FIG. 33 is a cross sectional view 3300 for showing at least one ground path in connection with the example of FIG. 31 according to various embodiments.

Referring to FIGS. 31 and 32, an electronic device 2 may include a flexible display 30, a display support structure 50, a conductive adhesive member 3110, a second metal structure 902, a first guide rail structure 61, a second guide rail structure 62, a fourth support member 3120, a sliding driving part 3130, a first bolt 3161, a second bolt 3162, a first support structure 41, a second side cover 212, a printed circuit board 43, a battery 44, and/or multiple second camera modules 272.

For example, FIGS. 31 and 32 illustrate various embodiments into which the embodiments of FIGS. 27 and 29 may be changed or modified, and the first rotating member 2741, the second rotating member 2742, and multiple rolling elements 2751a and 2752a of FIG. 27 may be omitted. In an embodiment, the fourth support member 3120 may be implemented in a shape further extending toward a first bolt fastening hole 1761 and a second bolt fastening hole 1762 of the second metal structure 902 in comparison with the fourth support member 2720 according to the embodiment of FIGS. 31 and 32. In an embodiment, the fourth support member 3120 (e.g., the fourth support member 422 of FIG. 4) may be coupled to the second metal structure 902 using the first bolt 3261 and the second bolt 3262. For example, the first bolt 3261 may be fastened in the first bolt fastening hole 1761 of the second metal structure 902 and the first groove 3122 formed on one side of fourth support member 3120. The second bolt 3262 may be fastened in the second bolt fastening hole 1762 of the second metal structure 902 and the second groove 3123 formed on the other side of the fourth support member 3120.

For example, the sliding driving part 3130 (e.g., the sliding driving part 80 of FIG. 4)) may include at least one hinge 3131. The hinge 3131 may connect the first support structure 41 and the fourth support member 3120 in between the first support structure 41 and the fourth support member 3120. The hinge 3131 may be implemented in substantially the same as or similar to the hinge 2731 for connecting the fourth support member 2720 and the first support structure 41 of the embodiment of FIG. 27. The display support structure 50 and the first guide rail structure 61 and the second guide rail structure 62 which are correspond thereto may be implemented in substantially the same as or similar to the embodiment of the FIG. 27.

According to an embodiment, the conductive adhesive member 3110 (e.g., the conductive adhesive member 1710 of FIG. 17) may be positioned between the flexible display 30 and the display support structure 50. The conductive sheet 33e included in the flexible display 30 may be electrically connected to the display support structure 50 through the conductive adhesive member 3110. In an embodiment, a ground path (e.g., the at least one ground path 1101 or 1102 of FIG. 11) may be formed by electrically connecting the third metal structure 1802 (refer to FIG. 18) facing the front surface 30a of the flexible display 30 and the conductive sheet 33e forming the rear surface 30b of the flexible display 30. The conductive adhesive member 3110 and the display support structure 50 may be included in a ground path. The conductive sheet 33e and the display support structure 50 may be electrically connected by the conductive adhesive member 3110, so as to prevent and/or reduce the waveguide structure 1100 of FIG. 11, which allows a guided wave related to a parasitic resonance to pass therethrough, from being substantially formed. The ground path may attribute to an antenna radiation performance securing for an antenna (e.g., the antenna structure 1300 of FIG. 13 or 14) using at least one antenna radiator. In an embodiment, the ground path may contribute that the third metal structure 1802 (refer to FIG. 18) and the conductive sheet 33*e* overlapping the third metal structure 1802 prevent and/or reduce a waveguide structure (e.g., the waveguide structure 1100 of FIG. 11), which allows a guided wave related to the parasitic resonance to pass therethrough, from being substantially formed. In various embodiments, the ground path may contribute such that the parasitic resonance frequency generated in a waveguide structure by the third metal structure 1802 (refer to FIG. 18) and the conductive sheet 33*e* is not included in the resonance frequency band of an antenna (e.g., the antenna structure 1300 of FIG. 13 or 14) using at least one antenna radiator. For example, the parasitic resonance frequency generated in a waveguide structure by the third metal structure 1802 (refer to FIG. 18) and the conductive sheet 33*e* may be shifted to be out of the resonance frequency band of an antenna due to the ground path (refer to FIG. 12B or 12C).

According to various embodiments, the metal support sheet 70 (refer to FIG. 4, 7, or 18) may be positioned on the rear surface 30*b* of the flexible display 30. In the case, the conductive adhesive member 3110 may be positioned between the metal support sheet 70 and the display support structure 50. The metal support sheet 70 may be electrically connected to the display support structure 50 through the conductive adhesive member 3110. A conductive adhesive material may be positioned between the conductive sheet 33*e* of the flexible display 30 and the metal support sheet 70, and the conductive sheet 33*e* and the metal support sheet 70 may be electrically connected to each other. The conductive adhesive member 3110, the metal support sheet 70, and the display support structure 50 may be included in a ground path (e.g., the at least one ground path 1101 or 1102 of FIG. 11) for electrically connecting the third metal structure 1802 (refer to FIG. 18) and the conductive sheet 33*e*. The conductive sheet 33*e* and the metal support sheet 70 may be electrically connected by a conductive adhesive material, so as to prevent and/or reduce the waveguide structure 1100 of FIG. 11, which allows a guided wave related to a parasitic resonance to pass therethrough, from being substantially formed. The metal support sheet 70 and the display support structure 50 may be electrically connected by the conductive adhesive member 3110, so as to prevent and/or reduce the waveguide structure 1100 of FIG. 11, which allows a guided wave related to a parasitic resonance to pass therethrough, from being substantially formed.

Referring to FIG. 33, for example, at least one ground path for electrically connecting the conductive sheet 33*e* and the second metal structure 902 may include a first ground path GP51, a second ground path GP52, and/or a third ground path GP53. The first ground path GP51 may be substantially the same as or similar to the first ground path GP11 according to the embodiment of FIG. 19. The second ground path GP52 may be substantially the same as or similar to the second ground path GP12 according to the embodiment of FIG. 19. The third ground path GP53 may be substantially the same as or similar to the third ground path GP13 according to the embodiment of FIG. 19.

According to various embodiments, at least a portion of the second metal structure 902 overlapping the conductive sheet 33*e* may include at least one opening. For example, at least one fourth conductive part 941 may include an opening 941*a* (refer to FIG. 31). The parasitic resonance frequency caused by the waveguide structure 1100 of FIG. 11, which includes the conductive sheet 33*e* and at least a portion of the second metal structure 902 overlapping therewith, may be shifted to a low frequency so as to be out of the resonance frequency band of an antenna due to at least one ground path (e.g., the first ground path GP51, the second ground path GP52, or the third ground path G53 of FIG. 33) and the opening 941*a*. In various embodiments, a non-conductive material (e.g., the at least one fourth non-conductive part 942 of FIG. 9) may be positioned in at least one opening formed through at least a portion of the second metal structure 902 overlapping the conductive sheet 33*e*.

Figure 34:
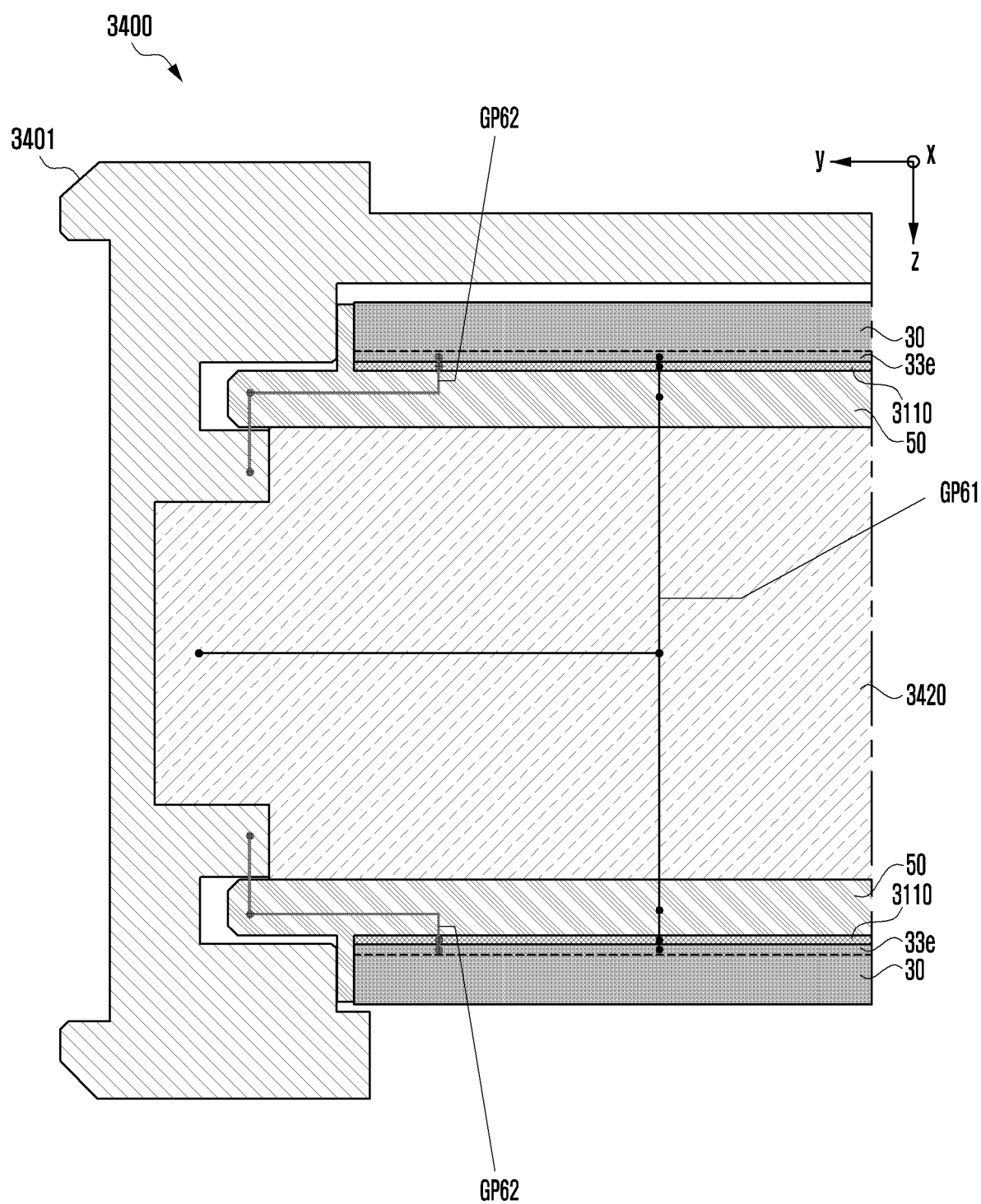
FIG. 34 is a cross sectional view of an example in which the example of FIG. 31 is changed or modified according to various embodiments.

FIG. 34, in an embodiment, illustrates a cross sectional structure 3400 of an embodiment in which the embodiment of FIG. 31 is changed or modified.

Referring to FIG. 34 is a diagram illustrating a metal structure 3401 in which the second metal structure 902 of FIG. 33 and the first guide rail structure 61 (or the second guide rail structure 62) of FIG. 33 may be integrally formed according to various embodiments. In various embodiments, in the embodiment of FIG. 34, the first guide rail structure 61 and the second guide rail structure 62 may be separately formed as the embodiment of FIG. 33. A fourth support member 3420 may be coupled to the metal structure 3401 without a bolt in comparison with the fourth support member 3120 according to the embodiment of FIG. 33. For example, one end and the other end of the fourth support member 3420 may be coupled to the metal structure 3401 in various connection types such as a type of being inserted and fitted into the metal structure 3401 or a hook fastening type.

According to an embodiment, for example, at least one ground path (e.g., the at least one ground path 1101 or 1102 of FIG. 11) for electrically connecting the conductive sheet 33*e* and the metal structure 3401 may include a first ground path GP61 and/or a second ground path GP62. The first ground path GP61 may include a current flow between the conductive sheet 33*e* and the conductive adhesive member 3110, a current flow between the conductive adhesive member 3110 and the display support structure 50, a current flow between the display support structure 50 and the fourth support member 3420, and the fourth support member 3420 and the metal structure 3401. The second ground path GP62 may include a current flow between the conductive sheet 33*e* and the conductive adhesive member 3110, a current flow between the conductive adhesive member 3110 and the display support structure 50, and a current flow between the display support structure 50 and the metal structure 3401.

Figure 35:
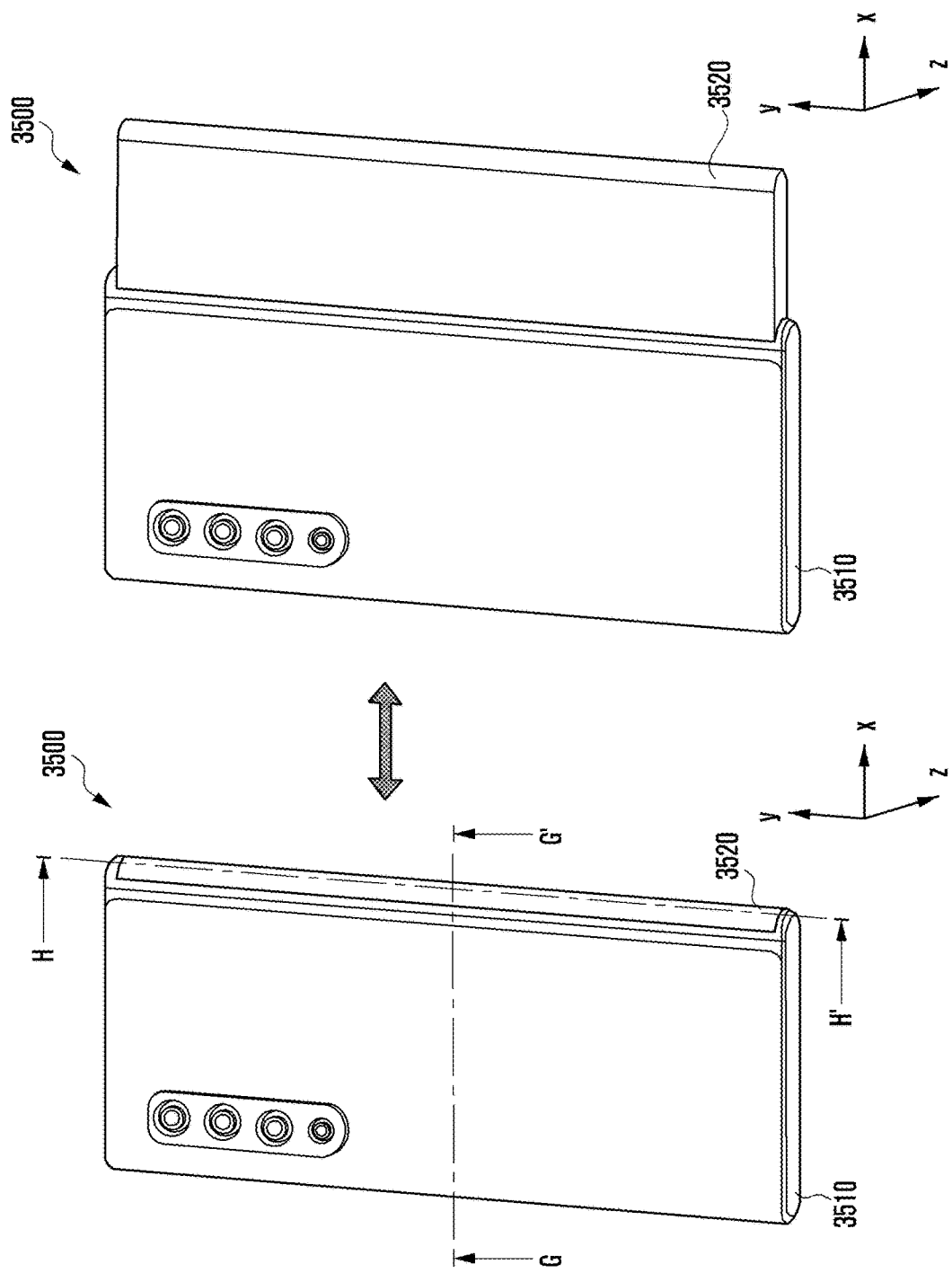
FIG. 35 is a perspective view illustrating an electronic device according to various embodiments.
Figure 36:
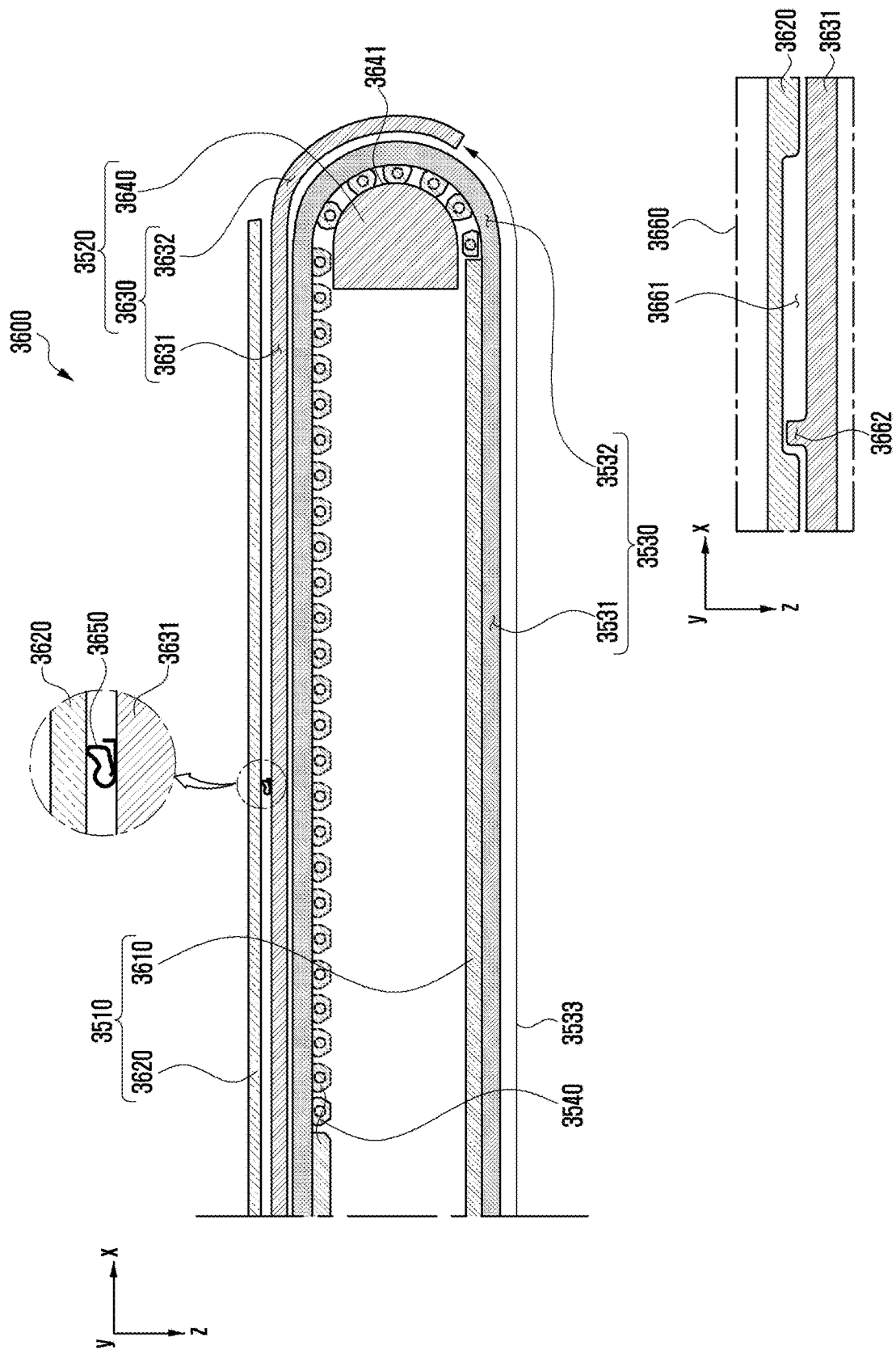
FIG. 36 is a cross sectional view of a portion of an electronic device taken along line G-G' of FIG. 35 according to various embodiments.

FIG. 35 is a perspective view illustrating an example electronic device 3500 according to various embodiments. FIG. 36 is a cross sectional view 3600 of a portion of an electronic device 3500 taken along line G-G' of FIG. 35 according to various embodiments.

Referring to FIGS. 35 and 36, an electronic device 3500 (e.g., the electronic device 101 of FIG. 1) may include a first housing part 3510 (or a first housing structure), a second housing part 3520 (or a second housing structure), a flexible display 3530, and/or a display support structure 3540.

For example, the second housing part 3520 may be slidably positioned in the first housing part 3510 with respect to the first housing part 3510. A sliding structure for sliding of the second housing part 3520 may be included between the first housing part 3510 and the second housing part 3520. The state where the second housing part 3520 at least partially moves in a first direction (e.g., the +x axis direction) with respect to the first housing part 3510 may be referred to as a "slide-out" of the second housing part 3520. The state where the second housing part 3520 at least partially moves in a second direction (e.g., the −x axis direction) opposite to the first direction with respect to the first housing part 3510 may be referred to as a "slide-in" of the second housing part 3520. The first housing part 3510 may include a first plate 3610 and a second plate 3620 which are positioned to be spaced from each other in a direction (e.g., the z axis direction) orthogonal to a slide-out or a slide-in direction of the second housing part 3520. The second housing part 3520 may include a third plate 3630 and a curved-surface member 3640. The third plate 3630 may include a first portion 3631 facing the second plate 3620 of the first housing part 3510 and a curve-shaped second portion 3632 extending from the first portion 3631 and corresponding to a curved-surface part 3641 of the curved-surface member 3640. At least a portion of the first portion 3631 may move between the first plate 3610 and the second plate 3620 of the first housing part 3510 in a slide-in of the second housing part 3520. When seen from the +z axis direction, an area in which the first portion 3631 and the second plate 3620 overlap, may decrease at a slide-out of the second housing part 3520 and may increase at a slide-in of the second housing part 3520. The flexible display 3530 may include a first area 3531 coupled to the first plate 3610 and a second area 3532 which extends from the first area 3531 and is positioned in the second housing part 3520. In a slide-out of the second housing part 3520, due to a spatial position relation between the first housing part 3510 and the second housing part 3520, the second area 3532 of the flexible display 3530 may be withdrawn out through between the second portion 3632 of the third plate 3630 and the curved-surface part 3641 of the curved-surface member 3640 (e.g., the expansion of a screen 3533). In a slide-in of the second housing part 3520, due to a spatial position relation between the first housing part 3510 and the second housing part 3520, the second area 3532 of the flexible display 3530 may be introduced into the inner space of the second housing part 3520 through between the second portion 3632 of the third plate 3630 and the curved-surface part 3641 of the curved-surface member 3640 (e.g., the reduction of the screen 3533). The display support structure 3540 (e.g., the display support structure 50 of FIG. 4) may be coupled to the rear surface of the flexible display 3530. For example, a display assembly including the flexible display 3530 and the display support structure 3540 may be substantially the same as or similar to the display assembly 700 according to the embodiment of FIG. 7. For example, the flexible display 3530 may have the cross sectional structure 401 of the flexible display 30 illustrated in FIG. 4.

According to an embodiment, the electronic device 3500 may include a sliding driving part (not shown) for connecting the first housing part 3510 and the second housing part 3520. The sliding driving part may contribute to a smooth slide-out or slide-in of the second housing part 3520 with respect to the first housing part 3510. The sliding driving part may drivingly connect the first housing part 3510 and the second housing part 3520 such that the second housing part 3520 may substantially move in a slide-out direction (e.g., the +x axis direction) or a slide-in direction (e.g., the −x axis direction) with respect to the first housing part 3510. The sliding driving part may provide a driving force for a sliding operation of the second housing part 3520 with respect to the first housing part 3510. For example, the sliding driving part may include an elastic structure, and the elastic structure may provide a driving force which enables the second housing part 3520 to be a slide-out or slide-in without an external force applied by a user. As another example, the sliding driving part may include a driving device such as a motor, and the driving device may provide a driving force which enables the second housing part 3520 to be a slide-out or slide-in without an external force applied by a user. In an embodiment, the sliding driving part may include at least one hinge (e.g., the hinge 800 of FIG. 8) for connecting between the first housing part 3510 and the fourth curved-surface member 3640 of the second housing part 3520. For example, the hinge may include a link work including multiple links and multiple joints. For example, the link work may be unfolded at a slide-out of the second housing part 3520, or may be folded at a slide-in of the second housing part 3520. In various embodiments, the link work may further include an elastic member (e.g., a torsion spring). For example, the elastic member may apply an elastic force which enables the link work to be unfolded at a slide-out of the second housing part 3520. In various embodiments, the elastic member may apply an elastic force which enables the link work to be folded at a slide-in of the second housing part 3520. The sliding driving part may be implemented in various other types of hinges. The sliding driving part may not be limited to a hinge, and may be implemented in various other types.

For example, the electronic device 3500 may include at least one antenna and a wireless communication circuit (e.g., the wireless communication module 192 of FIG. 1) electrically connected to at least one antenna. For example, the antenna may include at least one antenna radiator, a ground, or a transmission line. The at least one antenna radiator may form an electromagnetic field which enables transmission and/or reception of a signal of at least one frequency in a frequency band selected or designated when radiation current is provided from a wireless communication circuit. The wireless communication circuit may process a transmission signal or a reception signal in at least one designated frequency band (e.g., about 600 MHz-about 1 GHz (LB), about 1 GHz-about 2.3 GHz (MB), about 2.3 GHz-about 2.7 GHz (HB), about 2.7 GHz-about 6 GHz (UHB), or various other frequency bands) through at least one antenna radiator. For example, the transmission line may include an electrical path implemented in various types of conductive structures or wirings for connecting a wireless communication circuit and at least one antenna radiator. For example, a ground (or an antenna ground) may include a ground (e.g., ground plane) positioned on or included in the printed circuit board positioned in the first housing part 3510.

According to an embodiment, at least a portion of the first housing part 3510 or the second housing part 3520 may be electrically connected to a wireless communication circuit (e.g., the wireless communication module 192 of FIG. 1) to operate as an antenna radiator.

According to various embodiments, at least one antenna radiator may be positioned in the first housing part 3510 or the second housing part 3520, and may include a conductive pattern positioned inside the electronic device 3500. For example, the conductive pattern may be implemented in an LDS method. In various embodiments, the conductive pattern may be implemented in a flexible printed circuit board (FPCB) form. In various embodiments, the conductive pattern may be implemented through various methods such as plating or printing. In various embodiments, the antenna radiator may include a conductive pattern (e.g., a microstrip) positioned on a printed circuit board. An antenna may include a frequency adjustment circuit (e.g., a matching circuit) connected to the transmission line between the at least one antenna radiator and the wireless communication circuit. The frequency adjustment circuit may include an electric element having components such as inductance, capacitance or conductance acting on the transmission line. In various embodiments, the electronic device 3500 may include an antenna structure implemented in substantially the same or similar method as the antenna structure 1300 of FIG. 13 or 14.

According to an embodiment, the electronic device 3500 may include at least one ground path formed by electrically connecting a first conductive part at least partially included in the second plate 3620 and a second conductive part at least partially included in the third plate 3630. For example, the at least one ground path may include a flexible conductive member 3650 positioned between the second plate 3620 and the third plate 3630 (e.g., the first portion 3631). For example, the flexible conductive member 3650 may include a conductive clip (e.g., a C clip) coupled to the first portion 3631 of the third plate 3630. In various embodiments, the flexible conductive member 3650 may be coupled to the second plate 3620. The flexible conductive member 3650 may be implemented in various forms such as a pogo pin, spring, conductive phorone, conductive rubber, conductive tape, or a conductive connector. At least one ground path formed by electrically connecting the first conductive part at least partially included in the second plate 3620 and the second conductive part at least partially included in the third plate 3630, may shift the parasitic resonance frequency caused by the waveguide structure 1100 of FIG. 11, which includes the first conductive part at least partially included in the second plate 3620 and the second conductive part at least partially included in the first portion 3631 of the third plate 3630, to out of the resonance frequency band of an antenna, so as to reduce the degradation of an antenna radiation performance of an antenna.

In various embodiments, referring to the cross sectional structure indicated by the reference numeral '3660', a structure for limiting a sliding position of the second plate 3620 may be positioned between the first conductive part at least partially included in the second plate 3620 and the first portion 3631 of the third plate 3630. For example, the second plate 3620 may include a recess 3661 formed to face the first portion 3631 of the third plate 3630. The first portion 3631 of the third plate 3630 may include a protrusion 3662 inserted in the recess 3661. The recess 3661 may be formed to have a length corresponding to a slide-out or a slide-in of the second housing part 3520. Due to the recess 3661 and the protrusion 3662 corresponding thereto, the state (e.g., an open state of the electronic device 3500) in which the second housing part 3520 does not move anymore in a slide-out direction (e.g., the +x axis direction), i.e., is maximumly moved, may be formed. Due to the recess 3661 and the protrusion 3662 corresponding thereto, the state (e.g., a closed state of the electronic device 3500) in which the second housing part 3520 does not move anymore in a slide-in direction (e.g., the −x axis direction), i.e., is maximumly moved, may be formed. In an embodiment, at least one ground path for electrically connecting the first conductive part at least partially included in the second plate 3620 and the second conductive part at least partially included in the third plate 3630, may include a flexible conductive member such as a conductive phorone, conductive rubber, or conductive tape, which are positioned between the recess 3661 and the protrusion 3662.

Figure 37:
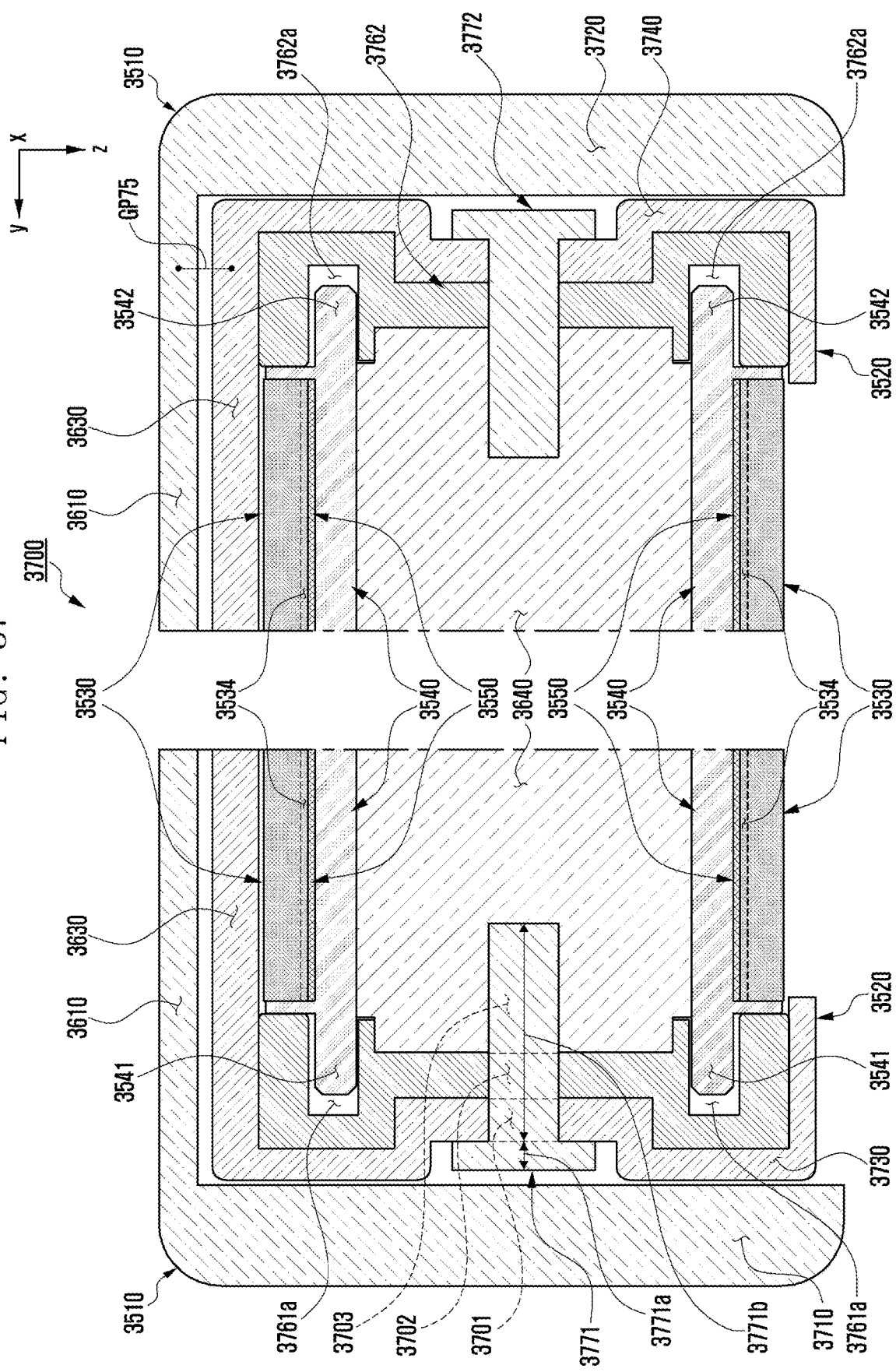
FIG. 37 is a cross sectional view of a portion of the electronic device taken along line H-H' of FIG. 35 according to various embodiments.
Figure 38:
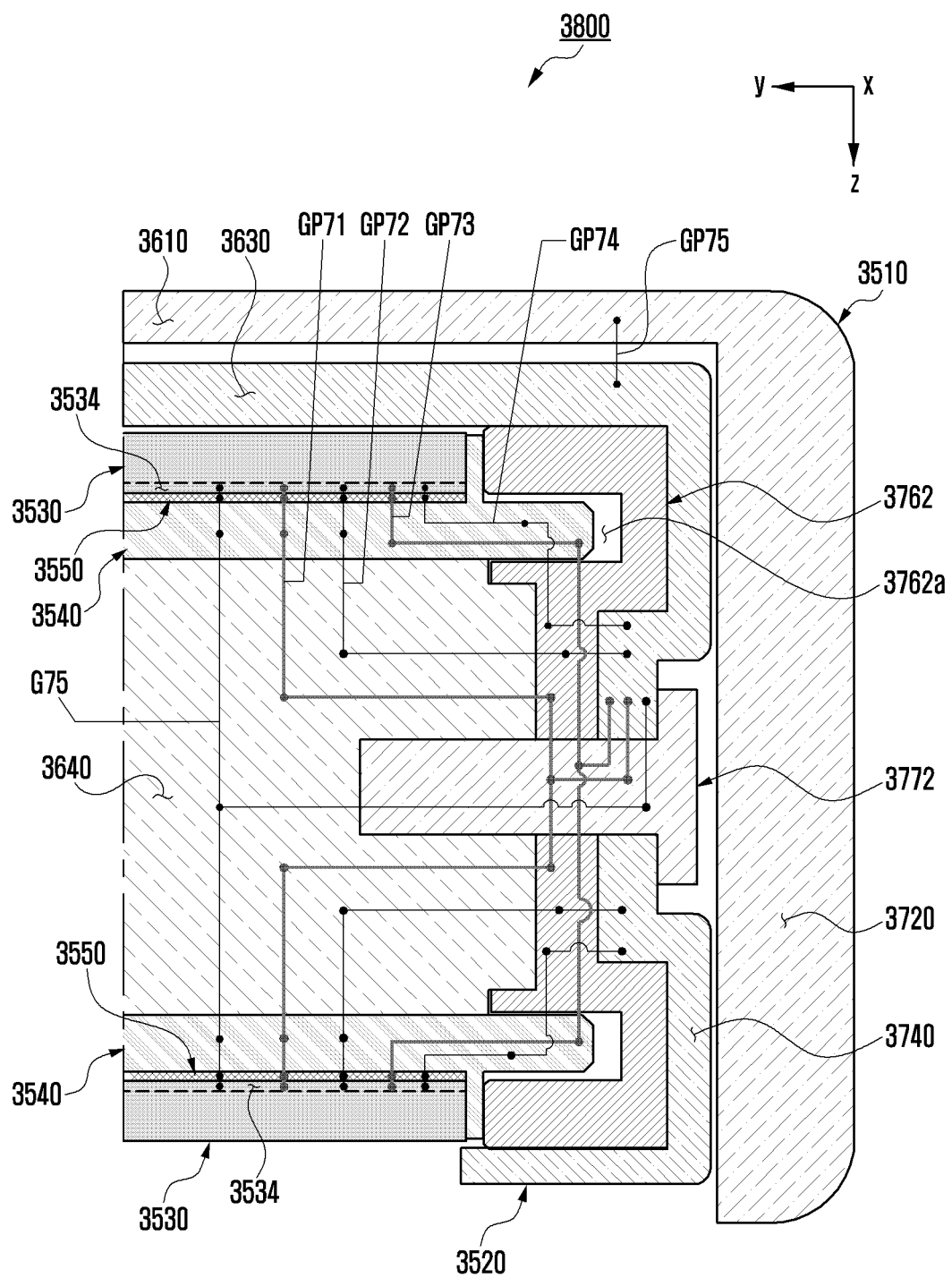
FIG. 38 is a diagram illustrating at least one ground path in connection with the example of FIG. 37 according to various embodiments.

FIG. 37 is a cross sectional view 3700 of a portion of the electronic device 3500 taken along line H-H' of FIG. 35 according to various embodiments. FIG. 38 is a cross sectional view 3800 for showing at least one ground path in connection with the example of FIG. 37 according to various embodiments.

Referring to FIG. 37, an electronic device 3500 may include a first housing part 3510, a second housing part 3520, a flexible display 3530, a display support structure 3540, a conductive adhesive member 3550, a first guide rail structure 3761, a second guide rail structure 3762, a first bolt 3771, and/or a second bolt 3772.

According to an embodiment, the first housing part 3510 may include a first plate 3610, a first side part 3710, and a second side part 3720. The first side part 3710 and/or the second side part 3720 may be connected to and/or integrally formed with the first plate 3610 and/or the second plate 3620 (refer to FIG. 36), respectively. The first side part 3710 and the second side part 3720 may be positioned to be spaced in a direction (e.g., the y direction) orthogonal to a slide direction (e.g., the x direction) of the second housing part 3520. The second housing part 3520 may include a third plate 3630, a third side part 3730, and a fourth side part 3740. The third side part 3730 and/or the fourth side part 3740 may be connected to and/or integrally formed with the third plate 3630 and/or a curved-surface member 3640, respectively. The third side part 3730 and the fourth side part 3740 may be positioned to be spaced in a direction (e.g., the y direction) orthogonal to a slide direction (e.g., the x direction) of the second housing part 3520. The third side part 3730 may be positioned to correspond to the first side part 3710, and when seen from the y axis direction, an area in which the first side part 3710 and the third side part 3730 overlap, may decrease at a slide-out of the second housing part 3520 and may increase at a slide-in of the second housing part 3520. The fourth side part 3740 may be positioned to correspond to the second side part 3720, and when seen from the y axis direction, an area in which the second side part 3720 and the fourth side part 3740 overlap, may decrease at a slide-out of the second housing part 3520 and may increase at a slide-in of the second housing part 3520. The curved-surface member 3640 may be positioned between the third side part 3730 and the fourth side part 3740.

According to an embodiment, the first guide rail structure 3761 (e.g., the first guide rail structure 61 of FIG. 4) may be positioned to face the third side part 3730, and the second guide rail structure 3762 (e.g., the second guide rail structure 62 of FIG. 4) may be positioned to face the fourth side part 3740. The curved-surface member 3640 may be positioned between the first guide rail structure 3761 and the second guide rail structure 3762. The first bolt 3771 may include a head 3771a and a shaft 3771b, and the shaft 3771b may be positioned to correspond to a first bolt fastening hole 3701 formed through the third side part 3730, a second bolt fastening hole 3702 formed through the first guide rail structure 3761, and a bolt fastening groove 3703 formed through the curved-surface member 3640. In an embodiment, the first bolt fastening hole 3701 may include female threads, and the shaft 3771b of the first bolt 3771 may include male threads corresponding thereto. In various embodiments, the bolt fastening groove 3703 included in the curved-surface member 3640 may include female threads, and a portion of the shaft 3771b included in the first bolt 3771 may include male threads corresponding thereto. In various embodiments, corresponding to the shaft 3771b of the first bolt 3771, the first bolt fastening hole 3701 of the third side part 3730 may be implemented in non-threads, and the second bolt fastening hole 3702 of the first guide rail structure 3761 may be implemented in female threads. In various embodiments, the curved-surface member 3640 may be implemented in a rotating member such as a roller. In the case, the bolt fastening groove 3703 included in the curved-surface member 3640 and a portion of the shaft 3771b included in the first bolt 3771 corresponding thereto may be implemented in non-threads to be one side rotating shaft of the curved-surface member 3640. In an embodiment, for example, the coupling structure relating to the second bolt 3772, the fourth side part 3740, the second guide rail structure 3762, and the curved-surface member 3640 may be substantially the same as or similar to a coupling structure relating to the first bolt 3771, the third side part 3730, the first guide rail structure 3761, and the curved-surface member 3640, respectively.

According to an embodiment, one side part 3541 (e.g., one side part of each of the multiple support bars 500 of FIG. 8) of the display support structure 3540 (e.g., the display support structure 50 of FIG. 4) may be positioned in or inserted into a first guide rail 3761a (e.g., the first guide rail 611 of FIG. 4) of the first guide rail structure 3761. The other side part 3542 (e.g., the other side part of each of the multiple support bars 500 of FIG. 8) of the display support structure 3540 may be positioned in or inserted into a second guide rail 3762a (e.g., the second guide rail 621 of FIG. 4) of the second guide rail structure 3762. The display support structure 3540 may be guided by the first guide rail 3761a and the second guide rail 3762a, and thus may move while rubbing with the curved-surface member 3640.

According to an embodiment, the conductive adhesive member 3550 (e.g., the conductive adhesive member 1710 of FIG. 17) may be positioned between the flexible display 3530 and the display support structure 3540. A conductive sheet 3534 (e.g., the conductive sheet 33e of FIG. 4) included in the flexible display 3530 may be electrically connected to the display support structure 3540 through the conductive adhesive member 2650. The conductive adhesive member 3550 may become a ground path (e.g., the at least one ground path 1101 or 1102 of FIG. 11) for electrically connecting the conductive sheet 3534 and the display support structure 3540. When the conductive sheet 3534 and the display support structure 3540 are electrically connected through the conductive adhesive member 3550, the conductive sheet 3534 and the display support structure 3540 may prevent and/or reduce the waveguide structure 1100 of FIG. 11, which allows a guided wave related to a parasitic resonance to pass therethrough, from being substantially formed, so that an antenna radiation performance of an antenna using at least one antenna radiator can be secured. According to various embodiments, a metal support sheet (refer to the metal support sheet 70 of FIG. 4 or 7) may be positioned on the rear surface of the flexible display 3530. In the case, the conductive adhesive member 3550 may be positioned between the metal support sheet and the display support structure 3540. The metal support sheet may be electrically connected to the display support structure 3540 through the conductive adhesive member 3550. The conductive adhesive member 3550 may become a ground path (e.g., the at least one ground path 1101 or 1102 of FIG. 11) for electrically connecting the metal support sheet and display support structure 50. When the metal support sheet and the display support structure 3540 are electrically connected through the conductive adhesive member 3550, the metal support sheet and the display support structure 3540 may prevent and/or reduce the waveguide structure 1100 of FIG. 11, which allows a guided wave related to a parasitic resonance to pass therethrough, from being substantially formed, so that an antenna radiation performance of an antenna using at least one antenna radiator can be secured.

According to various embodiments, a conductive adhesive material may be positioned between the conductive sheet 3534 and a metal support sheet (refer to the metal support sheet 70 of FIG. 4 or 7). The conductive adhesive material may become a ground path (e.g., the at least one ground path 1101 or 1102 of FIG. 11) for electrically connecting the conductive sheet 3534 and the metal support sheet. When the conductive sheet 3534 and the metal support sheet are electrically connected through the conductive adhesive material, the conductive sheet 3534 and the metal support sheet may prevent and/or reduce the waveguide structure 1100 of FIG. 11, which allows a guided wave related to a parasitic resonance to pass therethrough, from being substantially formed, so that an antenna radiation performance of an antenna using at least one antenna radiator can be secured.

According to an embodiment, the first conductive plate 1110 of FIG. 11 may be a first conductive part at least partially included in the first plate 3610 of the first housing part 3510. The second conductive plate 1120 of FIG. 11 may be a second conductive part at least partially included in the third plate 3630 of the second housing part 3520. At least one ground path GP75 (refer to FIGS. 37 and 38) (e.g., a current flow structure included in the flexible conductive member 3650 of FIG. 36 or reference numeral '3660' of FIG. 36) for electrically connecting the first conductive part and the second conductive part, may shift the parasitic resonance frequency caused by the waveguide structure 1100 of FIG. 11 to out of the resonance frequency band of an antenna, so as to reduce the degradation of an antenna radiation performance of an antenna using at least one antenna radiator.

According to an embodiment, the first conductive plate 1110 of FIG. 11 may be a second conductive part at least partially included in the third plate 3630 of the second housing part 3520. The second conductive plate 1120 of FIG. 11 may be the conductive sheet 3534 included in the flexible display 3530. At least one ground path GP71, GP72, GP73, or GP74 (refer to FIG. 38) for electrically connecting the second conductive part and the conductive sheet 3534, may shift the parasitic resonance frequency caused by the waveguide structure 1100 of FIG. 11 to out of the resonance frequency band of an antenna, so as to reduce the degradation of an antenna radiation performance of an antenna using at least one antenna radiator.

Referring to FIG. 38, for example, the ground path GP71 may include a current flow between the conductive sheet 3534 included in the flexible display 3530 and the conductive adhesive member 3550, a current flow between the conductive adhesive member 3550 and the display support structure 3540, a current flow between the display support structure 3540 and the curved-surface member 3640, a current flow between the curved-surface member 3640 and the second guide rail structure 3762, a current flow between the second guide rail structure 3762 and the second bolt 3772, and/or a current flow between the second bolt 3772 and the fourth side part 3740.

As another example, the ground path GP72 may include a current flow between the conductive sheet 3534 and the conductive adhesive member 3550, a current flow between the conductive adhesive member 3550 and the display support structure 3540, a current flow between the display support structure 3540 and the curved-surface member 3640, a current flow between the curved-surface member 3640 and the second guide rail structure 3762, and/or a current flow between the second guide rail structure 3762 and the fourth side part 3740.

As another example, the ground path GP73 may include a current flow between the conductive sheet 3634 and the conductive adhesive member 3550, a current flow between the conductive adhesive member 3550 and the display support structure 3540, a current flow between the display support structure 3540 and the second guide rail structure 3762, a current flow between the second guide rail structure 3762 and the second bolt 3772, and/or a current flow between the second bolt 3772 and the fourth side part 3740.

As another example, the ground path GP74 may include a current flow between the conductive sheet 3534 and the conductive adhesive member 3550, a current flow between the conductive adhesive member 3550 and the display support structure 3540, a current flow between the display support structure 3540 and the second guide rail structure 3762, and/or a current flow between the second guide rail structure 3762 and the fourth side part 3740.

According to an embodiment, the conductive sheet 3534 may be electrically connected to the third side part 3730 through at least one ground path. For example, at least one ground path between the conductive sheet 3534 and the third side part 3730 may be implemented in substantially the same or similar manner as at least one ground path (e.g., GP71, GP72, GP73, or GP74) between the conductive sheet 3534 and the fourth side part 3740.

Figure 39:
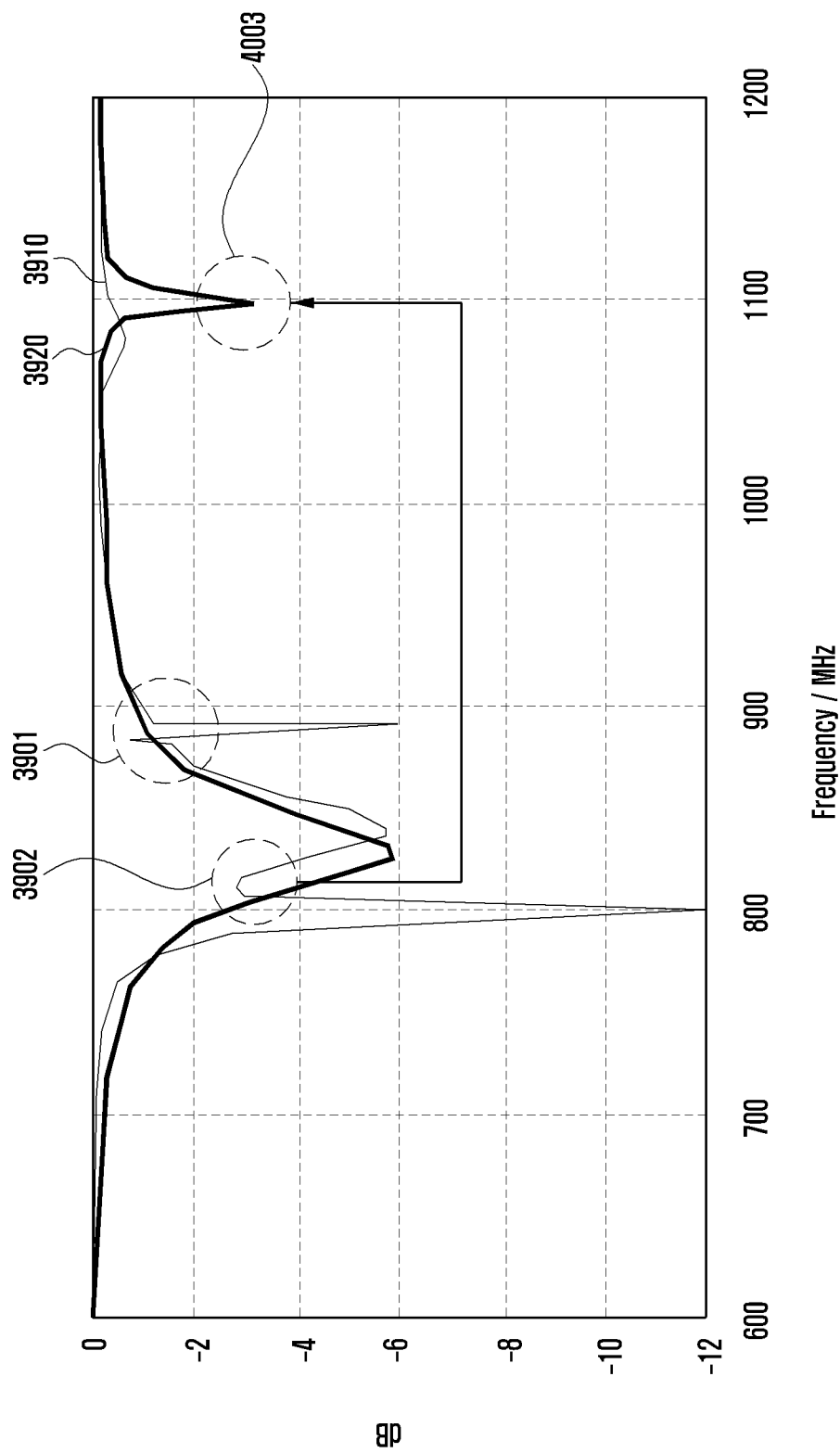
FIG. 39 is a graph illustrating an S parameter for an antenna, where a ground path related to a conductive sheet of a flexible display is included and a ground path related to a conductive sheet of a flexible display is not included according to various embodiments.
Figure 40:
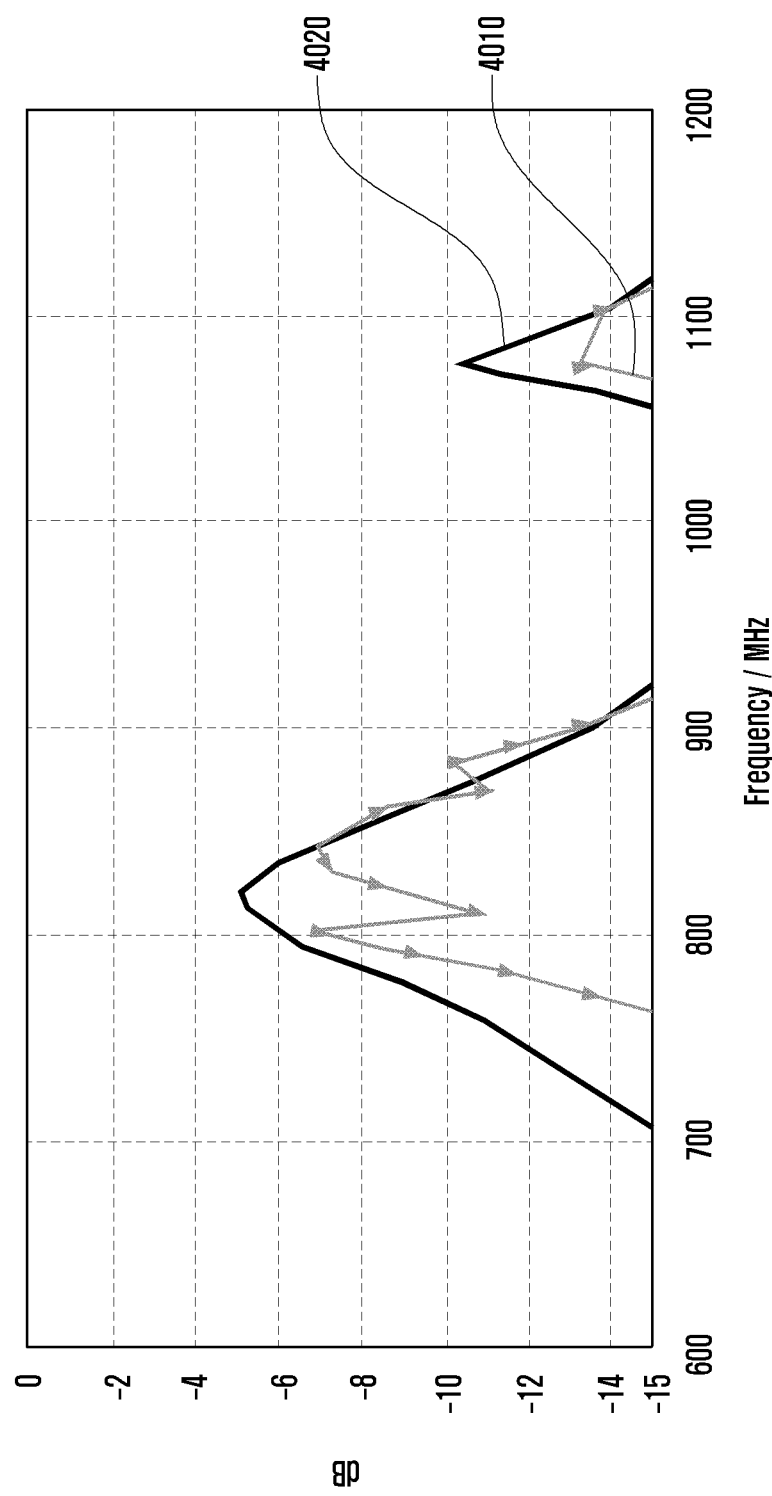
FIG. 40 is a graph illustrating antenna radiation performance for an antenna, where a ground path related to a conductive sheet of a flexible display is included and a ground path related to a conductive sheet of a flexible display is not included according to various embodiments.

FIG. 39 is a graph showing an S parameter (e.g., a ratio of an input voltage to an output voltage on a frequency distribution) for an antenna, where a ground path related to a conductive sheet of a flexible display is included and a ground path related to a conductive sheet of a flexible display is not included according to various embodiments. FIG. 40 is a graph showing an antenna radiation performance of an antenna, where a ground path related to a conductive sheet of a flexible display is included and a ground path related to a conductive sheet of a flexible display is not included according to various embodiments.

For example, a ground path related to a conductive sheet of a flexible display may include at least one ground path GP11, GP12, GP13, or GP14 according to the embodiment of FIG. 19, at least one ground path GP21 or GP22 according to the embodiment of FIG. 22, at least one ground path GP31 or GP32 according to the embodiment of FIG. 26, at least one ground path GP41 or GP42 according to the embodiment of FIG. 30, at least one ground path GP51, GP52 or GP53 according to the embodiment of FIG. 33, at least one ground path GP61 or GP62 according to the embodiment of FIG. 34, or at least one ground path GP71, GP72, GP73, GP74, or GP75 according to the embodiment of FIG. 38.

Referring to FIG. 39, reference numeral '3910' is a graph showing an S parameter for an antenna, in a case where a ground path related to a conductive sheet of a flexible display is not included. Reference numeral '3920' is a graph showing an S parameter for an antenna, in a case where a ground path related to a conductive sheet of a flexible display is included. Referring to FIG. 40, reference numeral '4010' is a graph showing an antenna radiation performance of an antenna, in a case where a ground path related to a conductive sheet of a flexible display is not included. Reference numeral '4020' is a graph showing an antenna radiation performance of an antenna, in a case where a ground path related to a conductive sheet of a flexible display is included.

Referring to the graph indicated by reference numeral '3910', in a case where a ground path related to the conductive sheet of the flexible display is not included, the energy emitted from at least one antenna radiator may affect the waveguide structure 1100 of FIG. 11, which includes the conductive sheet of the flexible display and the display support structure. Therefore, the waveguide structure 1100 of FIG. 11, which includes the conductive sheet of the flexible display and the display support structure, may form a parasitic resonance frequency (refer to a portion indicated by reference numeral '3901') included in the resonance frequency band of an antenna using at least one antenna radiator.

Referring to the graph indicated by reference numeral '3910', in a case where a ground path related to the conductive sheet of the flexible display is not included, the energy emitted from at least one antenna radiator may affect the waveguide structure 1100 of FIG. 11, which includes the conductive sheet included in the flexible display and the conductive part (or a metal part) included in the housing. Therefore, the waveguide structure 1100 of FIG. 11, which includes the conductive sheet included in the flexible display and the conductive part included in the housing, may form a parasitic resonance frequency (refer to a portion indicated by reference numeral '3902') included in the resonance frequency band of an antenna using at least one antenna radiator.

Referring to the graph indicated by reference numeral '3920', in a case where a ground path related to the conductive sheet of the flexible display is included, the conductive sheet of the flexible display and the display support structure may prevent and/or reduce the waveguide structure 1100 of FIG. 11, which allows a guided wave related to a parasitic resonance to pass therethrough, from being substantially formed. Referring to the graph indicated by reference numeral '3920', in a case where a ground path related to the conductive sheet of the flexible display is included, the parasitic resonance frequency formed in the waveguide structure 1100 of FIG. 11, which includes the conductive sheet included in the flexible display and the conductive part included in the housing, as a portion indicated by reference numeral '4003', may be shifted to out of the resonance frequency band of an antenna using at least one antenna radiator (e.g., an upward shift). Comparing with the graph indicated by '4010' and the graph indicated by '4020' of FIG. 40, the case where a ground path related to the conductive sheet of the flexible display is included, can reduce the degradation of an antenna radiation performance in a selected or designated frequency band (e.g., about 600 MHz-about 1 GHz) in comparison to the case not included therein.

According to an example embodiment of the disclosure, an electronic device (e.g., the electronic device 2 of FIG. 2A) may include: a housing (e.g., the housing 20 of FIG. 2A). The housing may include a first housing (e.g., the first housing part 21 of FIG. 2A) and a second housing (e.g., the second housing part 22 of FIG. 2A) configured to be slidable with respect to the first housing. The electronic device may include: a flexible display (e.g., the flexible display 30 of FIG. 4, 5, or 6). The flexible display may include: a first area (e.g., the first area ① of FIG. 4, 5, or 6) visible to the outside of the electronic device and a second area (e.g., the second area ② of FIG. 4, 5, or 6) configured to extend from the first area such that, based on sliding of the second housing, the second area is moved out of the housing or is moved into an inner space of the housing. The housing may include: a conductive part (e.g., the third metal structure 1802 of FIG. 18) facing a front surface (e.g., the front surface 30*a* of FIG. 17) of the flexible display. The conductive part may be electrically connected to a conductive layer (e.g., the conductive sheet 33*e* of FIG. 18) forming a rear surface (e.g., the rear surface 30*b* of FIG. 17) of the flexible display or positioned on the rear surface.

According to an example embodiment of the disclosure, an electrical path connecting the conductive part (e.g., the third metal structure 1802 of FIG. 18) and the conductive layer (e.g., the conductive sheet 33e of FIG. 18) may include a display support (e.g., the display support structure 50 of FIG. 18) configured to support the rear surface of the flexible display.

According to an example embodiment of the disclosure, the display support (e.g., the display support structure 50 of FIG. 18) may include a multi-bar support.

According to an example embodiment of the disclosure, the electrical path may further include: a conductive adhesive (e.g., the conductive adhesive member 1710 of FIG. 18) between the conductive layer (e.g., the conductive sheet 33e of FIG. 18) and the display support (e.g., the display support structure 50 of FIG. 18).

According to an example embodiment of the disclosure, the electrical path may include a curved-surface support (e.g., the fourth support member 422 of FIG. 18). The curved-surface support may be positioned in the inner space of the housing to correspond to the second area (e.g., the second area ② of FIG. 4, 5, or 6), and may be in contact with the display support (e.g., the display support structure 50 of FIG. 18).

According to an example embodiment of the disclosure, the electrical path may further include a screw (e.g., the first bolt 1731 or the second bolt 1732 of FIG. 17) connecting the housing and the curved-surface support (e.g., the fourth support member 422 of FIG. 18).

According to an example embodiment of the disclosure, the curved-surface support (e.g., the fourth support member 422 of FIG. 18) may include a roller (e.g., the rotating member 2020 of FIG. 20) configured to be rotatable while rubbing with the display support (e.g., the display support structure 50 of FIG. 18).

According to an example embodiment of the disclosure, the roller (e.g., the rotating member 2020 of FIG. 20) may include a circular gear (e.g., the circular gear 2022 of FIG. 20) configured to engage with the display support (e.g., the display support structure 50 of FIG. 20).

According to an example embodiment of the disclosure, the electrical path may further include one or more rolling elements (e.g., one or more rolling elements 2032a of FIG. 22) positioned between the housing and the roller (e.g., the circular gear 2022 of FIG. 20).

According to an example embodiment of the disclosure, the electrical path may include a guide rail (e.g., the first guide rail structure 61 or the second guide rail structure 62 of FIG. 17). The guide rail may be formed along a path along which the display support (e.g., the display support structure 50 of FIG. 17) is configured to move based on the second area (e.g., the second area ② of FIG. 4, 5, or 6) being moved out of the housing or moved into the inner space of the housing, and may be configured to allow one side part or another side part of the display support to be inserted therein.

According to an example embodiment of the disclosure, the electrical path may further include a part (e.g., the second rotating member 2520 of FIG. 26) rotatably positioned on the one side part or the other side part of the display support (e.g., the display support structure 50 of FIG. 26) inserted in the guide rail.

According to an example embodiment of the disclosure, the electrical path may further include a screw (e.g., the first bolt 1731 or the second bolt 1732 of FIG. 17) connecting the housing and the guide rail (e.g., the first guide rail structure 61 and the second guide rail structure 62 of FIG. 17).

According to an example embodiment of the disclosure, the conductive layer may include a conductive sheet (e.g., the conductive sheet 33e of FIG. 17) forming the rear surface of the flexible display. The conductive layer may be configured to shield an electromagnetic interference (EMI).

According to an example embodiment of the disclosure, the conductive layer may include a metal support sheet (e.g., the metal support sheet 70 of FIG. 4 or 7) positioned on the rear surface of the flexible display.

According to an example embodiment of the disclosure, the first conductive part (e.g., the second plate 3620 of FIG. 36) included in the first housing (e.g., the first housing part 3510 of FIG. 36) and a second conductive part (e.g., the third plate 3630 of FIG. 36) included in the second housing (e.g., the second housing part 3520 of FIG. 36) may be spaced apart and face each other and be electrically connected to each other.

According to an example embodiment of the disclosure, an electronic device (e.g., the electronic device 2 of FIG. 2A) may include: a housing (e.g., the housing 20 of FIG. 2A). The housing may include: a first housing (e.g., the first housing part 21 of FIG. 2A) and a second housing (e.g., the second housing part 22 of FIG. 2A) configured to be slidable with respect to the first housing. The electronic device may include a flexible display (e.g., the flexible display 30 of FIG. 4, 5, or 6). The flexible display may include: a first area (e.g., the first area ① of FIG. 4, 5, or 6) visible to the outside of the electronic device and a second area (e.g., the second area ② of FIG. 4, 5, or 6) extending from the first area such that, based on sliding of the second housing, the second area is moved out of the housing or is moved into an inner space of the housing. The electronic device may include a curved-surface support (e.g., the fourth support member 422 of FIG. 18) positioned in the inner space of the housing to correspond to the second area. The electronic device may include a display support (e.g., the display support structure 50 of FIG. 17) supporting a rear surface (e.g., the rear surface 30b of FIG. 17) of the flexible display. The housing may include a conductive part (e.g., the third metal structure 1802 of FIG. 18) facing a front surface of the flexible display. The conductive part may be electrically connected to a conductive layer (e.g., the conductive sheet 33e of FIG. 18) forming the rear surface of the flexible display or positioned on the rear surface. The conductive layer may be electrically connected to the display support using a conductive adhesive (e.g., the conductive adhesive member 1710 of FIG. 18).

According to an example embodiment of the disclosure, an electrical path connecting the conductive part (e.g., the third metal structure 1802 of FIG. 18) and the conductive layer (e.g., the conductive sheet 33e of FIG. 18) may include the display support (e.g., the display support structure 50 of FIG. 18).

According to an example embodiment of the disclosure, the electrical path may further include the curved-surface support (e.g., the fourth support member 422 of FIG. 18) in contact with the display support (e.g., the display support structure 50 of FIG. 18).

According to an example embodiment of the disclosure, the electrical path may include a screw (e.g., the first bolt 1731 or the second bolt 1732 of FIG. 17) connecting the housing and the curved-surface support (e.g., the fourth support member 422 of FIG. 18).

According to an example embodiment of the disclosure, an electrical path connecting to the conductive part (e.g., the third metal structure 1802 of FIG. 18) and the conductive layer (e.g., the conductive sheet 33e of FIG. 17) may include a guide rail (e.g., the first guide rail structure 61 or the second guide rail structure 62 of FIG. 17). The guide rail may be formed along a path along which the display support (e.g., the display support structure 50 of FIG. 17) is configured to move based on the second area (e.g., the second area ②of FIG. 4, 5, or 6) being moved out of the housing or moved into the inner space of the housing, and may be configured to allow one side part or another side part of the display support to be inserted therein.

While the disclosure has been illustrated and described with reference to various example embodiments, it will be understood that the various example embodiments are intended to be illustrative, not limiting. It will be further understood by those skilled in the art that various changes in form and detail may be made without departing from the true spirit and full scope of the disclosure, including the appended claims and their equivalents. It will also be understood that any of the embodiment(s) described herein may be used in conjunction with any other embodiment(s) described herein.

What is claimed is:

1. An electronic device comprising:
    a housing comprising a first housing and a second housing configured to be slidable with respect to the first housing;
    an antenna;
    a wireless communication circuit coupled to the antenna;
    a flexible display having a light-emitting first surface and configured to extend and retract according to a sliding of the second housing; and
    a flexible multi-bar display support configured to support a second surface of the flexible display opposite the light emitting surface and to be movable with the flexible display as the second housing slides,
    wherein the housing comprises a conductive part facing the first surface of the flexible display,
    wherein the conductive part is electrically connected to the flexible multi-bar display support through at least one ground path which is configured to reduce waveguide resonance between the conductive part and the flexible multi-bar display support when the wireless communication circuit communicates using the antenna, and
    wherein a size of an area where the conductive part and the flexible multi-bar display support overlap each other changes according to the sliding of the second housing.

2. The electronic device of claim 1, wherein the at least one ground path further comprises a conductive adhesive disposed between a conductive layer forming a rear surface of the flexible display and the flexible multi-bar display support.

3. The electronic device of claim 1, wherein the at least one ground path further comprises a rotatable support in contact with the flexible multi-bar display support.

4. The electronic device of claim 3, wherein the at least one ground path further comprises a fastener connecting the housing and the rotatable support.

5. The electronic device of claim 3, wherein the rotatable support comprises a roller.

6. The electronic device of claim 5, wherein the roller comprises a circular gear configured to engage with the flexible multi-bar display support.

7. The electronic device of claim 5, wherein the at least one ground path further comprises one or more rolling elements disposed between the housing and the roller.

8. The electronic device of claim 1, wherein the at least one ground path further comprises:
    a first guide rail formed along a path in which the flexible multi-bar display support moves according to the sliding of the second housing, a first end of the flexible multi-bar display support disposed in the first guide rail, and
    a second guide rail formed along the path in which the flexible multi-bar display support moves according to the sliding of the second housing, a second end of the flexible multi-bar display support disposed in the second guide rail.

9. The electronic device of claim 8, wherein the at least one ground path further comprises:
    a first rotation part rotatably positioned on the first end of the flexible multi-bar display support inserted into the first guide rail, and
    a second rotation part rotatably positioned on the second end of the flexible multi-bar display support inserted into the second guide rail.

10. The electronic device of claim 8, wherein the at least one ground path further comprises:
    a first fastener connecting the housing and the first guide rail, and
    a second fastener connecting the housing and the second guide rail.

11. The electronic device of claim 1, further comprising a conductive sheet disposed on the second surface of the flexible display and configured as an electromagnetic interference (EMI) shield.

12. The electronic device of claim 1, wherein the at least one ground path further comprises a metal support sheet disposed between the second surface of the flexible display and the flexible multi-bar display support, and
    wherein the metal support sheet includes a plurality of openings in correspondence with a bendable section of the flexible display.

13. The electronic device of claim 1, further comprising a first conductive part included in the first housing and a second conductive part included in the second housing facing each other, the first and second conductive parts being spaced apart and electrically connected to each other.

14. The electronic device of claim 1, wherein the antenna comprises a conductive portion of the housing.

15. An electronic device comprising:
    a housing comprising a first housing and a second housing configured to be slidable with respect to the first housing;
    an antenna;
    a wireless communication circuit coupled to the antenna;
    a flexible display having a light-emitting first surface and configured to extend and retract according to a sliding of the second housing;
    a metal support sheet disposed on a second surface of the flexible display opposite the light-emitting first surface;
    a metal multi-bar structure coupled to the metal support sheet and configured to support a bendable section of the flexible display;
    a first conductive adhesive disposed between the second surface of the flexible display and the metal support sheet to electrically connect a conductive layer forming the second surface of the flexible display and the metal support sheet; and
    a second conductive adhesive disposed between the metal support sheet and the metal multi-bar structure to electrically connect the metal support sheet and the metal multi-bar structure,
    wherein the housing includes a conductive part facing a front surface of the flexible display,
    wherein the metal multi-bar structure is electrically connected to the conductive layer of the flexible display through at least one ground path which is configured to reduce a waveguide resonance between the multi-bar structure and the conductive layer when the wireless communication circuit communicates using the antenna, and wherein a size of an area where the conductive part and the conductive layer overlap each other changes according to the sliding of the second housing.

16. The electronic device of claim 15, wherein the at least one ground path comprises a rotatable support, in contact with the metal multi-bar structure.

17. The electronic device of claim 16, wherein the at least one ground path comprises a fastener connecting the housing and the rotatable support.

18. The electronic device of claim 15, wherein the at least one ground path comprises:

a first guide rail formed along a path in which the metal multi-bar structure moves according to the sliding of the second housing, a first end of the metal multi-bar structure disposed in the first guide rail, and a second guide rail formed along the path in which the metal multi-bar structure is moves according to the sliding of the second housing, a second end of the metal multi-bar structure disposed in the second guide rail.

* * * * *